United States Patent
Kim et al.

(10) Patent No.: US 9,679,982 B2
(45) Date of Patent: Jun. 13, 2017

(54) SEMICONDUCTOR DEVICE AND METHOD OF MANUFACTURING THE SAME

(71) Applicants: Daeik Kim, Hwaseong-si (KR); Jiyoung Kim, Yongin-si (KR); Jemin Park, Suwon-si (KR); Nakjin Son, Suwon-si (KR); Yoosang Hwang, Suwon-si (KR)

(72) Inventors: Daeik Kim, Hwaseong-si (KR); Jiyoung Kim, Yongin-si (KR); Jemin Park, Suwon-si (KR); Nakjin Son, Suwon-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/162,859

(22) Filed: Jan. 24, 2014

(65) Prior Publication Data

US 2014/0203357 A1  Jul. 24, 2014

(30) Foreign Application Priority Data

Jan. 24, 2013  (KR) .................. 10-2013-0008125

(51) Int. Cl.
*H01L 29/78* (2006.01)
*H01L 29/423* (2006.01)
*H01L 21/8234* (2006.01)
*H01L 21/265* (2006.01)

(52) U.S. Cl.
CPC .. *H01L 29/4236* (2013.01); *H01L 21/823437* (2013.01); *H01L 29/7827* (2013.01); *H01L 29/7831* (2013.01); *H01L 21/26586* (2013.01)

(58) Field of Classification Search
CPC ............ H01L 29/4236; H01L 29/7813; H01L 29/0696; H01L 29/4238; H01L 29/407; H01L 29/66734; H01L 29/1095; H01L 23/49827; H01L 27/10888; H01L 29/7827; H01L 21/823437; H01L 29/7831; H01L 21/26586
See application file for complete search history.

(56) References Cited

U.S. PATENT DOCUMENTS

| 7,759,714 B2 | 7/2010 | Itoh et al. |
| 7,875,540 B2 | 1/2011 | Jang et al. |
| 8,415,733 B2 * | 4/2013 | Yang ................. H01L 27/10876 257/311 |

(Continued)

FOREIGN PATENT DOCUMENTS

| CN | 102339829 A | 2/2012 |
| KR | 10-2006-0011081 A | 2/2006 |

(Continued)

*Primary Examiner* — Latanya N Crawford
(74) *Attorney, Agent, or Firm* — Myers Bigel, P.A.

(57) ABSTRACT

According to a method of manufacturing a semiconductor device, hard mask lines are formed in parallel in a substrate and the substrate between the hard mask lines is etched to form grooves. A portion of the hard mask line and a portion of the substrate between the grooves are etched. A top surface of the etched portion of the substrate between the grooves is higher than a bottom surface of the groove. A conductive layer is formed to fill the grooves. The conductive layer is etched to form conductive patterns in the grooves, respectively.

20 Claims, 73 Drawing Sheets

(56) References Cited

U.S. PATENT DOCUMENTS

| | | | |
|---|---|---|---|
| 8,557,660 B2* | 10/2013 | Kim | H01L 27/10876 257/330 |
| 8,581,337 B2* | 11/2013 | Kye | H01L 27/10823 257/331 |
| 8,623,727 B2* | 1/2014 | Shin | H01L 23/485 257/E21.585 |
| 8,735,977 B2* | 5/2014 | Lee | 257/331 |
| 8,742,494 B2* | 6/2014 | Wu | 257/330 |
| 8,878,273 B2* | 11/2014 | Kim | H01L 27/10855 257/306 |
| 2007/0293039 A1 | 12/2007 | Bu et al. | |
| 2010/0200948 A1* | 8/2010 | Kim | 257/520 |
| 2010/0330793 A1 | 12/2010 | Kim | |
| 2011/0024811 A1* | 2/2011 | Kim | 257/296 |
| 2011/0133261 A1* | 6/2011 | Kim | 257/296 |
| 2012/0012911 A1* | 1/2012 | Jeong | 257/301 |
| 2012/0139028 A1 | 6/2012 | Park et al. | |
| 2012/0156869 A1* | 6/2012 | Shin | H01L 23/485 438/589 |
| 2012/0211830 A1* | 8/2012 | Yoo | 257/334 |
| 2012/0217559 A1* | 8/2012 | Kim | H01L 27/10876 257/296 |
| 2012/0267712 A1* | 10/2012 | Yu | 257/331 |
| 2012/0292690 A1* | 11/2012 | Seo | H01L 27/10855 257/330 |
| 2013/0009226 A1* | 1/2013 | Park | H01L 27/10855 257/296 |
| 2013/0087853 A1* | 4/2013 | Kim | 257/330 |
| 2013/0119462 A1* | 5/2013 | Kye et al. | 257/331 |
| 2013/0256769 A1* | 10/2013 | Jeong | H01L 27/1052 257/296 |
| 2013/0292847 A1* | 11/2013 | Choi et al. | 257/774 |
| 2014/0061939 A1* | 3/2014 | Yu et al. | 257/774 |
| 2014/0117492 A1* | 5/2014 | Kim et al. | 257/508 |
| 2014/0159148 A1* | 6/2014 | Chung et al. | 257/330 |

FOREIGN PATENT DOCUMENTS

| | | |
|---|---|---|
| KR | 1020060125403 A | 12/2006 |
| KR | 1020070062863 A | 6/2007 |
| KR | 1020080000833 A | 1/2008 |
| KR | 10-2008-0037230 A | 4/2008 |
| KR | 1020110026757 A | 3/2011 |

* cited by examiner

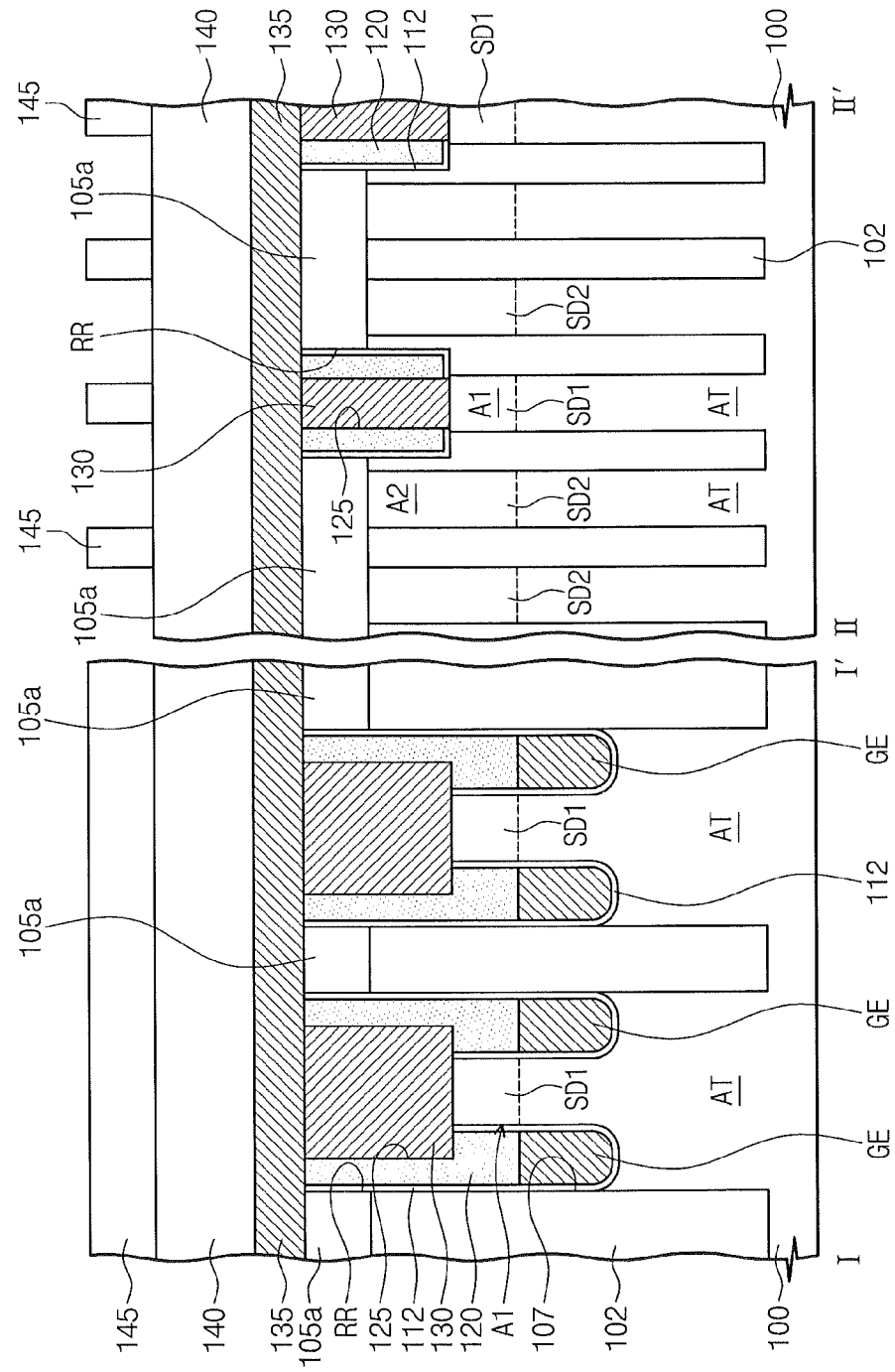

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2013-0008125, filed on Jan. 24, 2013, the entirety of which is incorporated by reference herein.

BACKGROUND

The inventive concept relates to semiconductor devices and methods of manufacturing the same.

Semiconductor devices are widely used in an electronic industry because of their small sizes, multiple functions and/or low manufacture costs. However, the semiconductor devices have been highly integrated with the development of the electronic industry such that various problems have been caused. For example, widths and/or spaces of patterns in the semiconductor devices are being reduced due to the high integration of the semiconductor devices. On the contrary, heights and/or aspect ratios of the patterns are increasing. Thus, dispersion of deposition processes and/or etching processes of thin layers may become worse, deteriorating the reliability of the semiconductor devices.

SUMMARY

Embodiments of the inventive concept may provide semiconductor devices having excellent reliability and methods of manufacturing the same.

Embodiments of the inventive concept may also provide highly integrated semiconductor devices and methods of manufacturing the same.

In some embodiments, a method of manufacturing a semiconductor device may include: forming hard mask lines parallel to each other on a substrate; etching the substrate between the hard mask lines to form grooves; successively etching a portion of the hard mask line and a portion of the substrate between the grooves, wherein a top surface of the etched portion of the substrate between the grooves is higher than bottom surfaces of the grooves; forming a conductive layer filling the grooves; and etching the conductive layer to form conductive patterns in the grooves, respectively.

In some embodiments, top surfaces of the conductive patterns may be lower than the top surface of the etched portion of the substrate between the grooves.

In some embodiments, the method may further include: forming a capping insulating layer filling the grooves on the conductive patterns.

In some embodiments, a method of manufacturing a semiconductor device may include: forming hard mask lines extending in parallel in one direction on a substrate; etching the substrate using the hard mask lines as etch masks to form gate grooves; successively etching a portion of the hard mask line and a portion of the substrate between the gate grooves, wherein a top surface of the etched portion of the substrate between the gate grooves is higher than bottom surfaces of the gate grooves; forming a gate insulating layer on an inner surface of each of the gate grooves; forming a gate conductive layer filling the gate grooves; and etching the gate conductive layer to form gate electrodes in the gate grooves, respectively. Top surfaces of the gate electrodes may be lower than the top surface of the etched portion of the substrate between the gate grooves.

In some embodiments, the method may further include: forming a device isolation pattern in the substrate to define an active portion before the formation of the hard mask lines. In this case, a pair of gate grooves may cross the active portion. Etching the portion of the hard mask line and the portion of the substrate may include: successively etching the portion of the hard mask line and a center portion of the active portion between the pair of gate grooves. The etched center portion of the active portion may be the etched portion of the substrate between the gate grooves.

In some embodiments, etching the portion of the hard mask line and the center portion of the active portion may include: forming a sacrificial buffer layer filling the gate grooves on the substrate; forming mask patterns spaced apart from each other on the sacrificial buffer layer, wherein the mask patterns cover portions of the hard mask lines covering both edge portions of the active portion and portions of the hard mask lines disposed at both sides of the center portion of the active portion in the one direction; successively etching the sacrificial buffer layer, the hard mask lines III-III' and the center portion of the active portion using the mask patterns as etch masks; and removing the mask patterns and the sacrificial buffer layer.

In some embodiments, the method may further include: conformally forming a gate capping insulating layer on the substrate after the formation of the gate electrodes; and anisotropically etching the gate capping insulating layer to form an opening exposing the etched center portion of the active portion.

In some embodiments, a thickness of the gate capping insulating layer may be equal to or greater than a half of a width of the gate groove. Additionally, the thickness of the gate capping insulating layer may be less than a half of a distance between the hard mask lines covering the both edge portions of the active portion; and the thickness of the gate capping insulating layer may be less than a half of a distance between portions of the hard mask line which remain at the both sides of the center portion of the active portion between the pair of gate grooves.

In some embodiments, the method may further include: forming a contact plug filling the opening; sequentially forming a wire conductive layer and a wire capping insulating layer on the substrate; and successively patterning the wire capping insulating layer, the wire conductive layer, and the contact plug to form a wire pattern crossing over the gate electrodes.

In some embodiments, the method may further include: forming a gate capping insulating layer fully filling the gate grooves on the gate electrodes and a recess region on the etched center portion of the active portion; and planarizing the gate capping insulating layer until the remaining portions of the hard mask lines are exposed.

In some embodiments, the method may further include: forming a lower conductive layer on the substrate having the planarized gate capping insulating layer; forming mask patterns spaced apart from each other on the lower conductive layer, the mask patterns covering the remaining portions of the hard mask lines, respectively; etching the lower conductive layer and the planarized gate capping insulating layer using the mask patterns as etch masks to form an opening exposing the etched center portion of the active portion, concave regions in the gate capping insulating layer on the gate electrodes, and lower conductive patterns; and removing the mask patterns.

In some embodiments, the method may further include: forming a contact conductive layer filling the opening and the concave regions; planarizing the contact conductive layer; sequentially forming an upper conductive layer and a wire capping insulating layer on the planarized contact conductive layer and the lower conductive patterns; and patterning the wire capping insulating layer, the upper conductive layer, the planarized contact conductive layer, and the lower conductive patterns to form a wire pattern and to remove the planarized contact conductive layer disposed in the concave regions.

In some embodiments, the method may further include: conformally forming an insulating spacer layer on the substrate; and anisotropically etching the insulating spacer layer to form insulating spacers on both sidewalls of the wire pattern, respectively. Portions of the insulating spacer layer may remain in the concave regions after the formation of the insulating spacers.

In some embodiments, the method may further include: forming a lower conductive layer on the substrate having the planarized gate capping insulating layer; forming a mask layer having a mask-hole on the lower conductive layer, the mask-hole overlapping with the etched center portion of the active portion; etching the lower conductive layer and the planarized gate capping insulating layer using the mask layer as an etch mask to form an opening exposing the etched center portion of the active portion; and removing the mask layer.

In some embodiments, the method may further include: forming a contact plug filling the opening; sequentially forming an upper conductive layer and a wire capping insulating layer on the substrate; and patterning the wire capping insulating layer, the upper conductive layer, the contact plug, and the lower conductive layer to form a wire pattern.

In some embodiments, the method may further include: forming a first source/drain region in the etched center portion of the active portion and a second source/drain in an edge portion of the active portion; and forming a data storage part electrically connected to the second source/drain region.

In some embodiments, a semiconductor device may include: a device isolation pattern disposed in a substrate to define an active portion; a pair of gate electrodes disposed in a pair of gate grooves crossing the active portion, respectively, wherein a top surface of a center portion of the active portion between the pair of gate grooves is lower than top surfaces of both edge portions of the active portion and wherein top surfaces of the gate electrodes are lower than the top surface of the center portion of the active portion; a gate insulating layer disposed between each of the gate electrodes and an inner surface of each of the gate grooves; and gate capping patterns filling the gate grooves on the gate electrodes, respectively. The gate capping patterns may extend outside the gate grooves to be connected to each other without an interface therebetween.

In some embodiments, the connected extending portions of the gate capping patterns may constitute one united body extension; and the one united body extension may define an opening exposing the center portion of the active portion.

In some embodiments, the semiconductor device may further include: a wire pattern including a contact pattern connected to the center portion of the active portion in the opening and a conductive wire extending in one direction on the contact pattern.

In some embodiments, the opening may have a closed loop-shape in a plan view.

In some embodiments, concave regions may be formed in the extending portion of the gate capping pattern on each of the gate electrodes; and the concave regions may be laterally connected to the opening.

In some embodiments, a bottom surface of each of the concave regions may be higher than a bottom surface of the opening.

In some embodiments, the semiconductor device may further include; insulating spacers disposed on both sidewalls of the wire pattern, respectively; and an insulator disposed in each of the concave regions. The insulator may be formed of the same material as the insulating spacers; and an interface may exist between the insulator and an inner surface of the concave region.

In some embodiments, a width of the contact pattern may be less than a width of the opening in a direction perpendicular to the one direction.

In some embodiments, the contact pattern may have both sidewalls aligned with both sidewalls of the conductive wire, respectively.

In some embodiments, the semiconductor device may further include: an insulating pattern disposed between the conductive wire and the device isolation pattern. A top end of the extending portion of the gate capping pattern may be disposed at substantially the same level as a top surface of the insulating pattern.

In some embodiments, a top surface of the device isolation pattern under the connected portion of the extending portions of the gate capping patterns may be lower than the top surface of the edge portion of the active portion.

In some embodiments, a width of the extending portion of the gate capping pattern may be less than a width of the gate capping pattern in the gate groove.

In some embodiments, the semiconductor device may further include: a first source/drain region in the center portion of the active portion; a second source/drain region in each of the both edge portions of the active portion; and a data storage part electrically connected to each of the second source/drain regions.

In some embodiments, a method of manufacturing a semiconductor device may include forming hard mask lines parallel to each other on a substrate and etching the substrate between the hard mask lines to form grooves. The method may also include successively etching a portion of the hard mask line and a center portion of the substrate between the grooves. The top surface of the etched center portion of the substrate between the grooves may be lower than top surfaces of edge portions of the substrate on sides of the grooves opposite from the etched center portion of the substrate. The method may further include forming a conductive layer filling the grooves after the successively etching and etching the conductive layer to form conductive patterns in the grooves, respectively. Top surfaces of the conductive patterns may be lower than the top surface of the etched center portion.

In some embodiments, etching the center portion of the substrate between the grooves may include forming a sacrificial buffer layer filling the grooves on the substrate and forming mask patterns spaced apart from each other on the sacrificial buffer layer. The mask patterns may cover portions of the hard mask lines covering the edge portions of the substrate. The etching may further include successively etching the sacrificial buffer layer, the hard mask lines and the center portion of the substrate using the mask patterns as etch masks. The mask patterns and the sacrificial buffer layer may be removed.

BRIEF DESCRIPTION OF THE DRAWINGS

The inventive concept will become more apparent in view of the attached drawings and accompanying detailed description.

FIGS. 1A to 11A are plan views illustrating a method of manufacturing a semiconductor device according to some embodiments of the inventive concept;

FIGS. 1B to 11B are cross-sectional views taken along lines I-I' and II-II' of FIGS. 1A to 11A, respectively;

FIGS. 1C to 11C are cross-sectional views taken along lines III-III' and IV-IV' of FIGS. 1A to 11A, respectively;

FIGS. 14A to 18A are plan views illustrating a method of manufacturing a semiconductor device according to other embodiments of the inventive concept;

FIGS. 14B to 18B are cross-sectional views taken along lines I-I' and II-II' of FIGS. 14A to 18A, respectively;

FIGS. 14C to 18C are cross-sectional views taken along lines III-III' and IV-IV' of FIGS. 14A to 18A, respectively;

FIGS. 20A to 23A are plan views illustrating a method of manufacturing a semiconductor device according to still other embodiments of the inventive concept;

FIGS. 20B to 23B are cross-sectional views taken along lines I-I' and II-II' of FIGS. 20A to 23A, respectively;

FIGS. 20C to 23C are cross-sectional views taken along lines III-III' and IV-IV' of FIGS. 20A to 23A, respectively;

DETAILED DESCRIPTION OF THE EMBODIMENTS

Figure 1A:
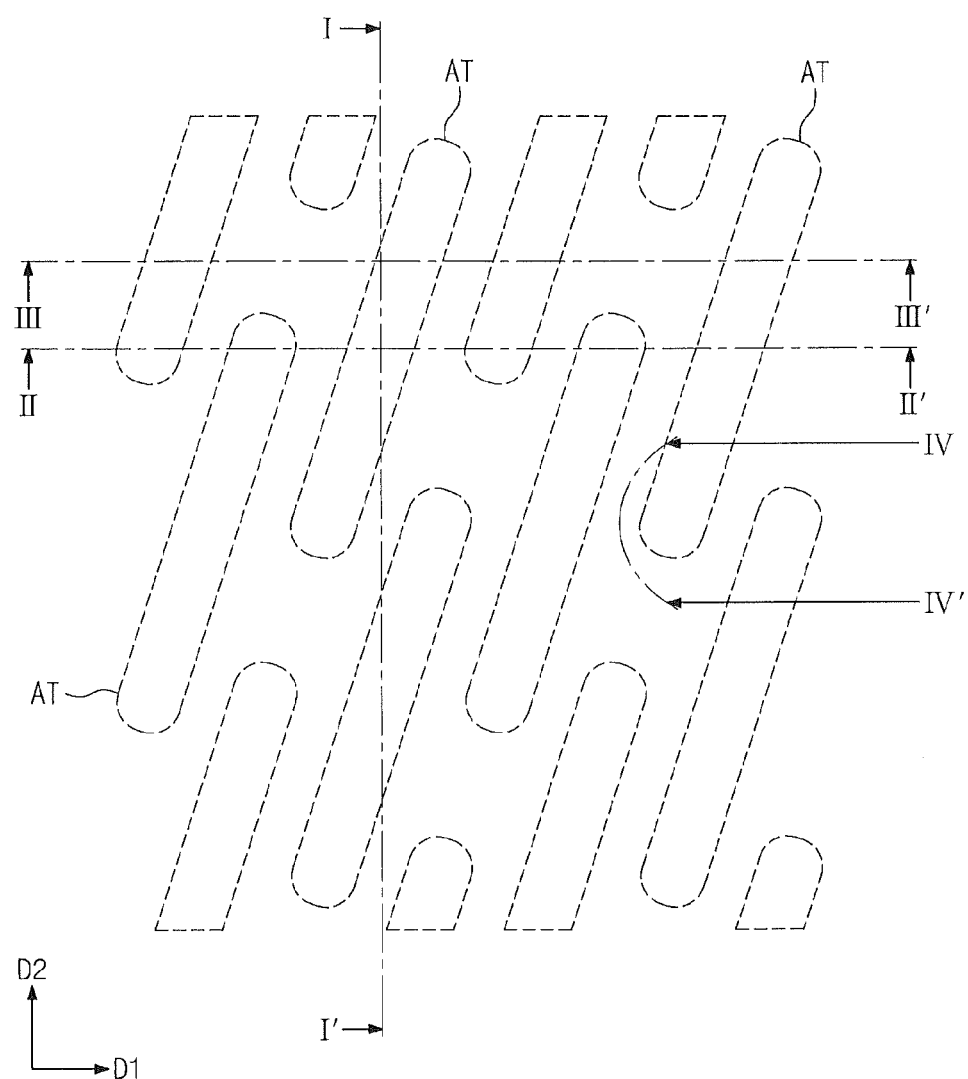

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1A to 11A are plan views illustrating a method of manufacturing a semiconductor device according to some embodiments of the inventive concept. FIGS. 1B to 11B are cross-sectional views taken along lines I-I' and II-II' of FIGS. 1A to 11A, respectively. FIGS. 1C to 11C are cross-sectional views taken along lines III-III' and IV-IV' of FIGS. 1A to 11A, respectively. FIGS. 1B to 11B and 1C to 11C are reduced cross-sectional views.

Figure 1B:
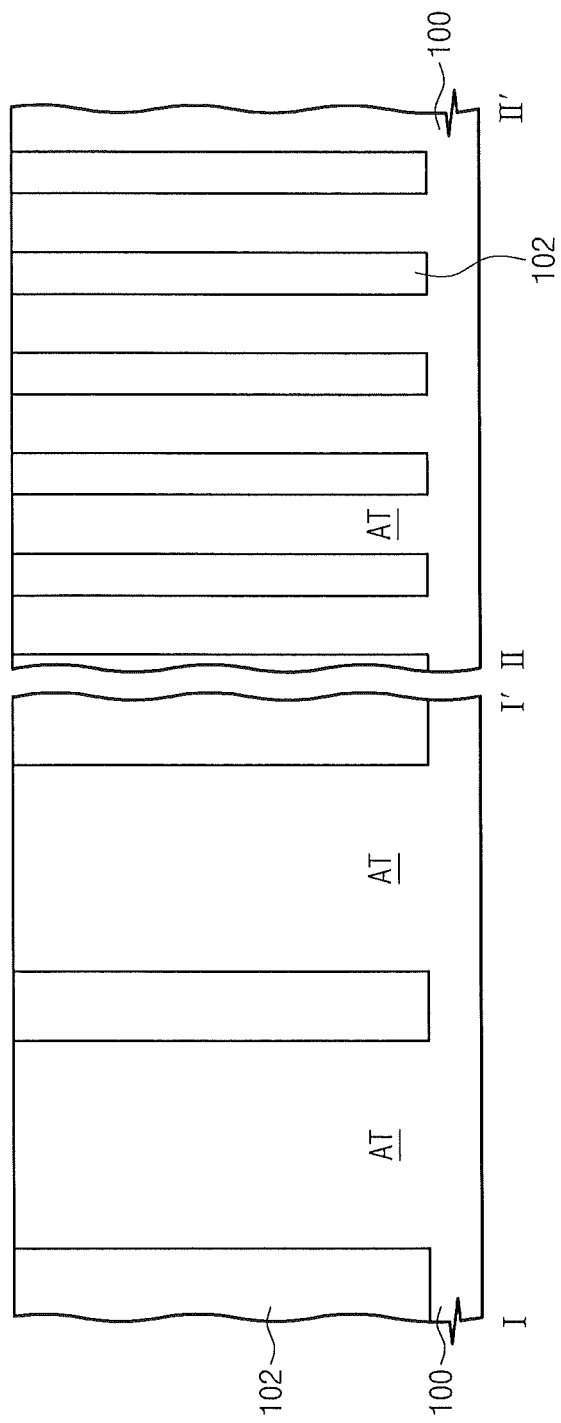
Figure 1C:
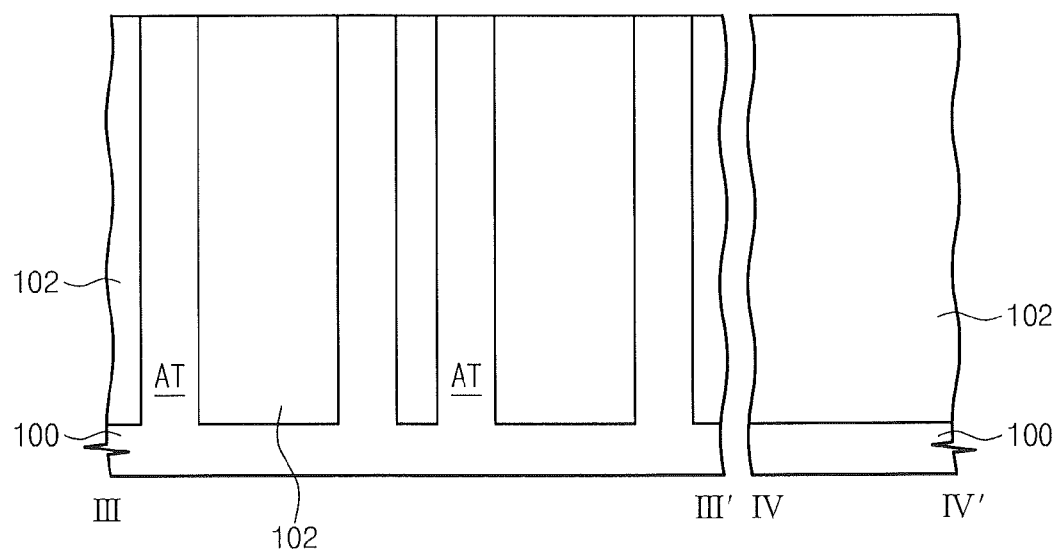

Referring to FIGS. 1A, 1B, and 1C, a substrate 100 is prepared. In some embodiments, the substrate 100 may be a semiconductor substrate such as a silicon substrate, a germanium substrate, or a silicon-germanium substrate. However, the inventive concept is not limited thereto. In other embodiments, the substrate 100 may be a semiconductor substrate covered by an insulating layer, or a semiconductor substrate including a conductor and an insulating layer covering the conductor.

In the following embodiments, the substrate 100 may be the semiconductor substrate. A device isolation pattern 102 may be formed in the substrate 100 to define active portions AT. The active portions AT may respectively correspond to portions of the substrate 100 surrounded by the device isolation pattern 102. In a plan view, each of the active portions AT may have isolated shape. The device isolation pattern 102 may be formed by a shallow trench isolation technique. For example, the substrate 100 may be a silicon substrate, a germanium substrate, or a silicon-germanium substrate. The device isolation pattern 102 may include an oxide (e.g., silicon oxide), a nitride (e.g., silicon nitride), and/or an oxynitride (e.g., silicon oxynitride).

In some embodiments, the active portions AT may be arranged along rows and columns in a plan view. The rows may be parallel to a first direction D1 of FIG. 1A, and the columns may be parallel to a second direction D2 of FIG. 1A. In some embodiments, the rows may include first, second, and third rows adjacent to each other. In a plan view, end portions of the active portions AT of the first row adjacent to the second row may be disposed between the active portions AT of the second row. Additionally, end portions of the active portions AT of the third row adjacent to the second row may also be disposed between the active portions AT of the second row in a plan view. The active portions AT of the first to third rows are spaced apart from each other. The end portion of the active portion AT of the first row and the end portion of the active portion AT of the third row may overlap with each other between adjacent active portions AT of the second row in the first direction D1. In a plan view, each of the active portions AT may have a rectangular shape extending in one direction. A long axis of each of the active portions AT may be non-perpendicular and non-parallel to the first direction D1. The active portions AT may be doped with dopants of a first conductivity type.

Figure 2A:
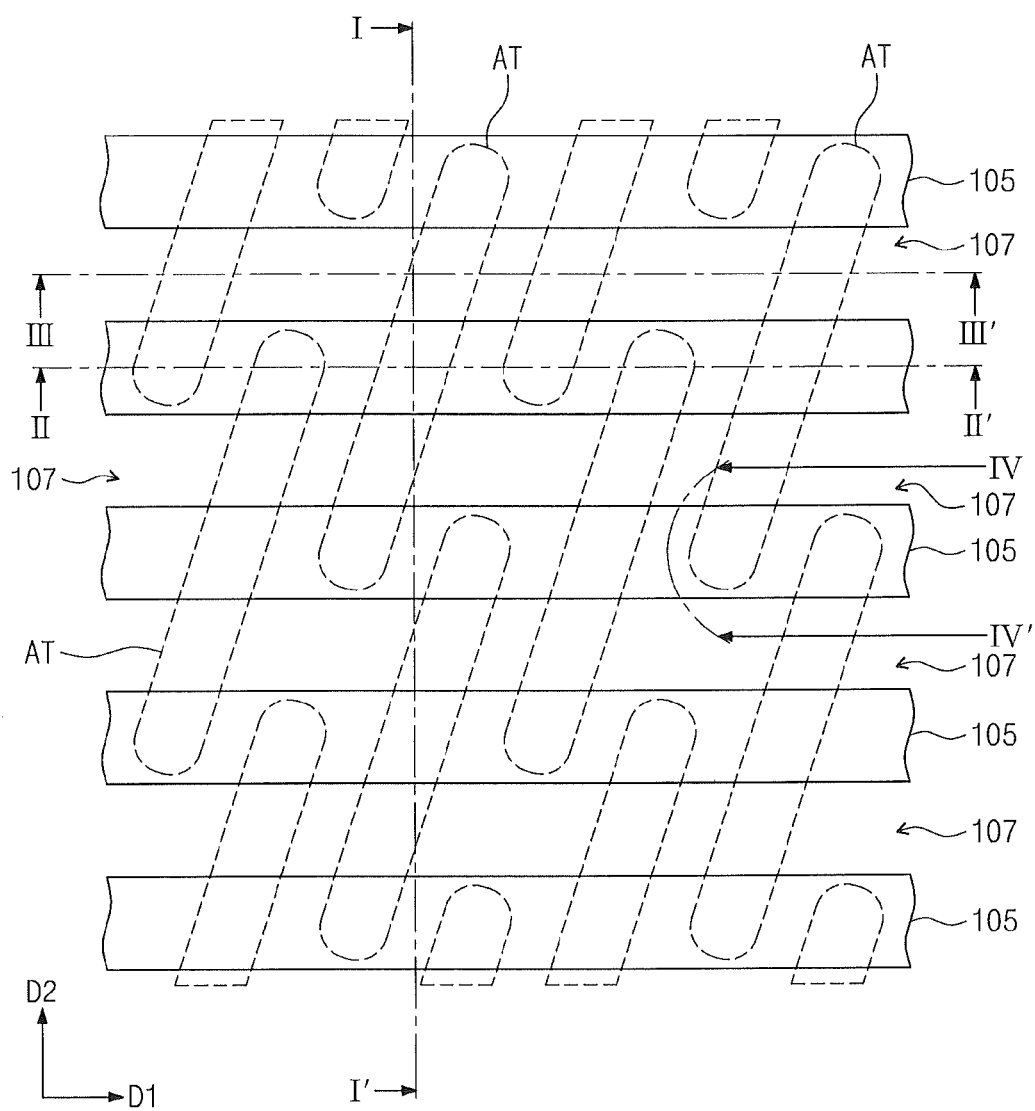
Figure 2B:
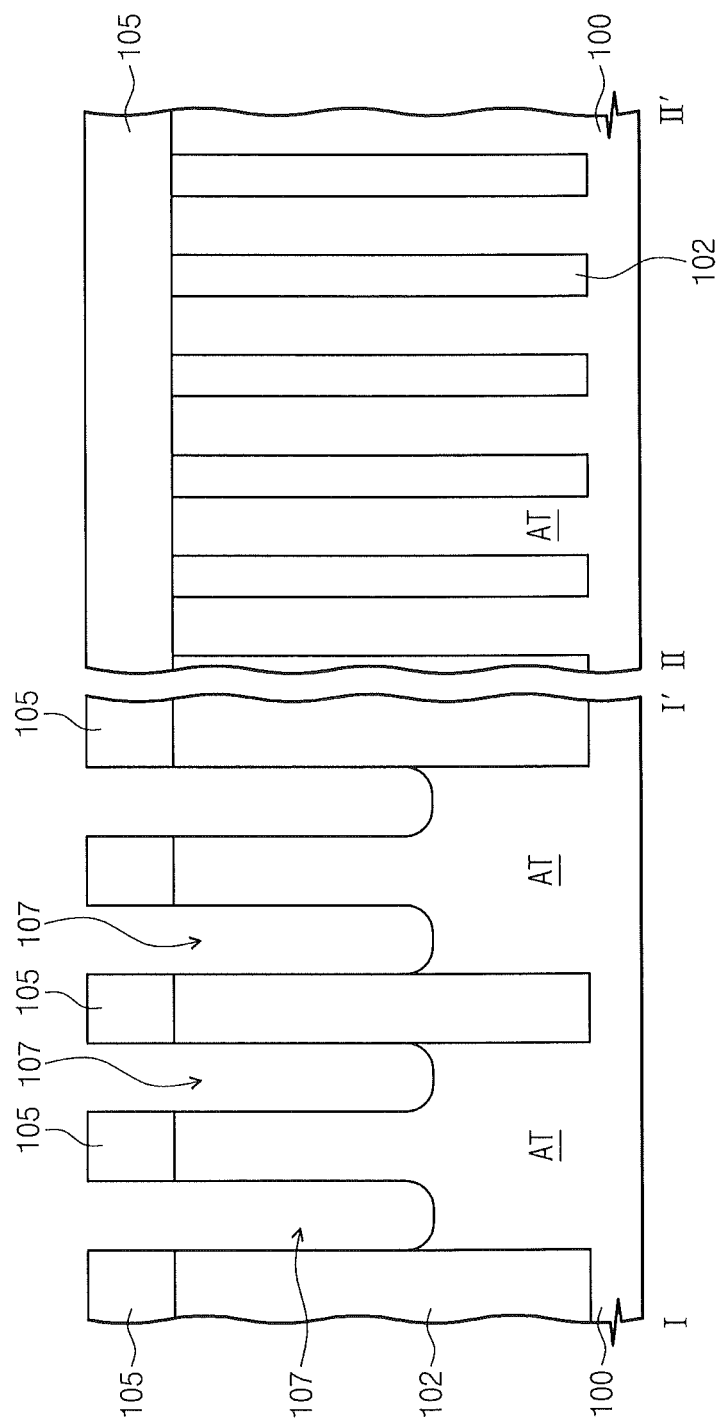
Figure 2C:
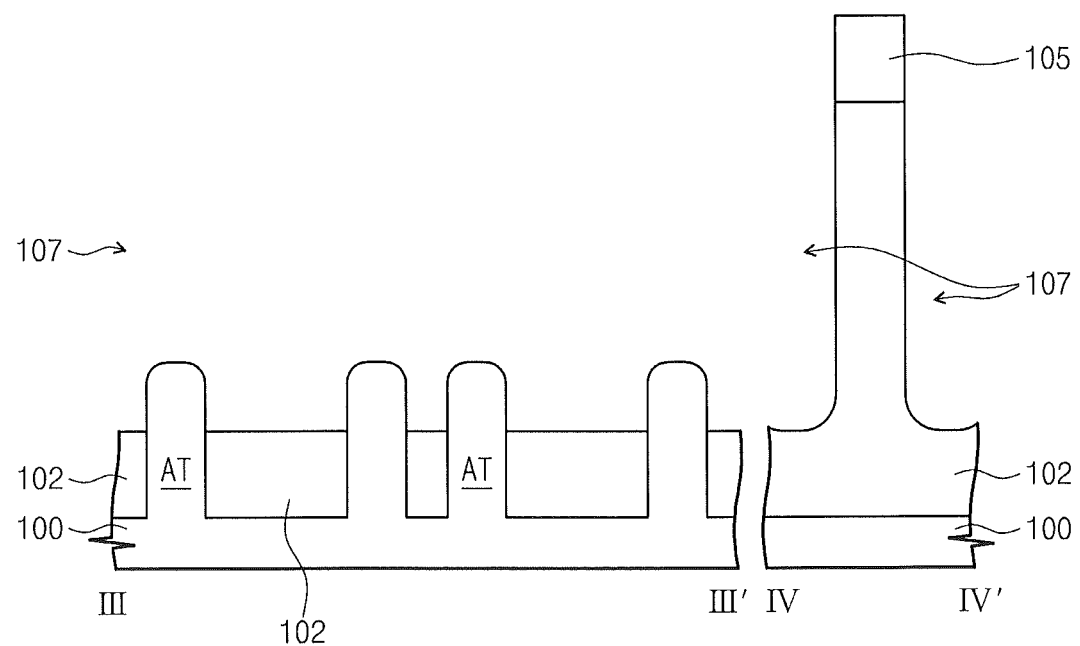

Referring to FIGS. 2A, 2B, and 2C, hard mask lines 105 defining gate grooves 107 may be formed on the substrate 100. The hard mask lines 105 may extend in parallel to each other along the first direction D1 and may be spaced apart from each other. The hard mask lines 105 may be formed of an insulating material. For example, the hard mask lines 105 may include an oxide (e.g., silicon oxide), a nitride (e.g., silicon nitride), and/or an oxynitride (e.g., silicon oxynitride). In some embodiments, the hard mask lines 105 may include silicon oxide formed by a chemical vapor deposition (CVD) process.

The active portions AT and the device isolation pattern 102 may be etched using the hard mask lines 105 as etch masks to form the gate grooves 107. The gate grooves 107 may extend in parallel to each other in the first direction D1. In some embodiments, a pair of gate grooves 107 may cross each of the active portions AT. In other words, a center portion and both edge portions of each active portion AT may be covered by the hard mask lines 105, respectively. Additionally, the pair of gate grooves 105 may be formed between the center portion and one edge portion of each active portion AT and between the center portion and another edge portion of each active portion AT, respectively. In some embodiments, the pair of gate grooves 107 may cross the active portions AT constituting one row. In some embodiments, the active portions AT constituting a pair of rows adjacent to each other may share one gate groove 107. In other words, as illustrated in FIG. 2A, the active portions AT constituting the first row may share one of the pair of gate grooves 107 crossing the active portions AT of the second row, and the active portions AT constituting the third row may share another of the pair of gate grooves 107 crossing the active portions AT of the second row.

As illustrated in FIGS. 2B and 2C, a top end of the etched device isolation pattern 102 under the gate groove 107 may be lower than a top end of the etched active portion AT under the gate groove 107.

Figure 3A:
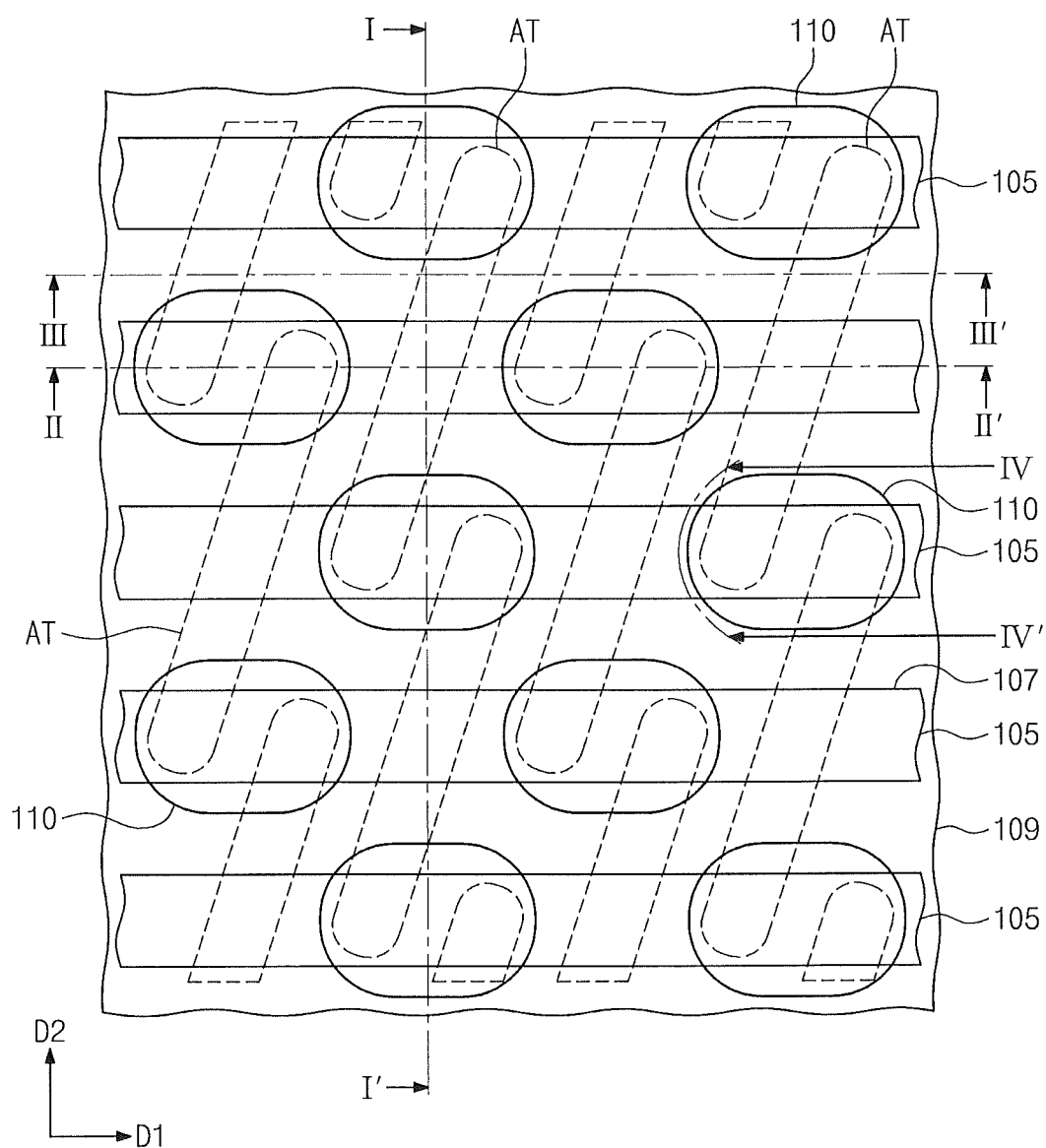
Figure 3B:
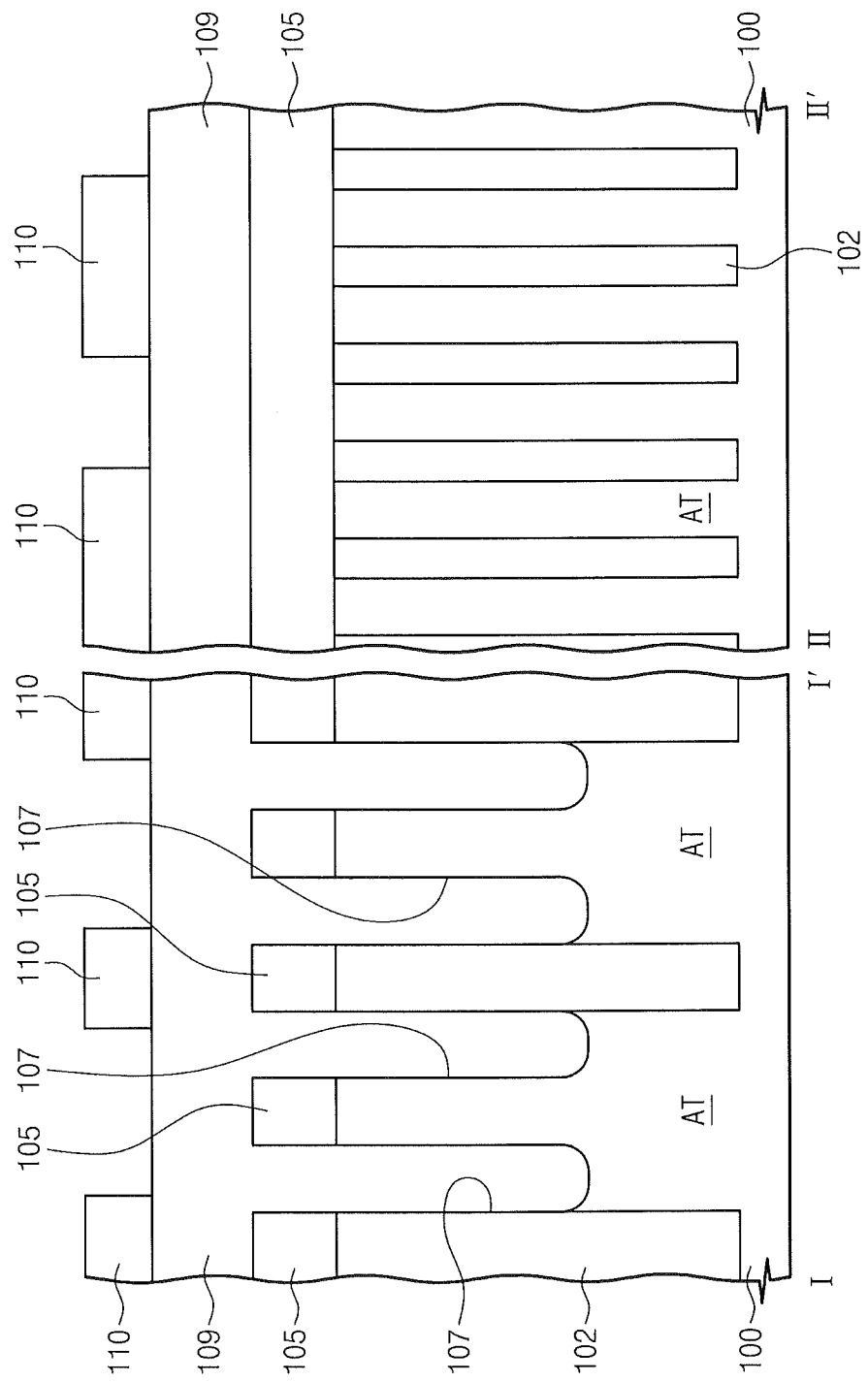
Figure 3C:
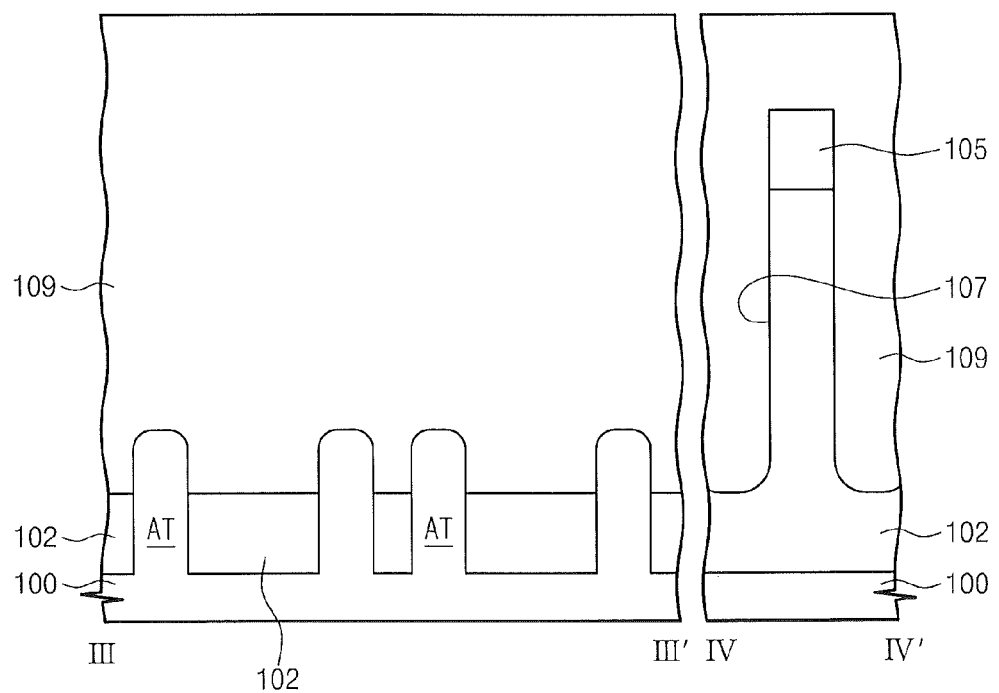

Referring to FIGS. 3A, 3B, and 3C, a sacrificial buffer layer 109 may be formed on the substrate 100. The sacrificial buffer layer 109 may fill the gate grooves 107 and may cover the hard mask lines 105. The sacrificial buffer layer 109 may be formed of a material having an etch selectivity with respect to the hard mask lines 105, the substrate 100, and the device isolation pattern 102. For example, the sacrificial buffer layer 109 may be formed of a spin-on-hard mask (SOH) material (e.g., a SOH silicon oxide). If the device isolation pattern 102 includes silicon oxide, the silicon oxide of the device isolation pattern 102 may include a high-density-plasma (HDP) silicon oxide.

Mask patterns 110 may be formed on the sacrificial buffer layer 109. The mask patterns 110 are spaced apart from each other. Each of the mask patterns 110 may have an island-shape. The mask patterns 110 may cover the edge portions of the active portions AT. In other words, the center portions of the active portions AT are not covered by the mask patterns 110. In more detail, the hard mask lines 105 may include first portions disposed on the edge portions of the active portions AT and second portions disposed on the center portions of the active portions AT. The mask patterns 110 cover the first portions of the hard mask lines 105, but the second portions of the hard mask lines 105 are not covered by the mask patterns 110.

As illustrated in FIG. 3A, each of the mask patterns 110 may cover the edge portions of the active portions AT adjacent to each other in each of the columns. In some embodiments, a width of the mask pattern 110 in the second direction D2 may be greater than a width of the hard mask line 105 in the second direction D2. The mask patterns 110 may be formed of a material having an etch selectivity with respect to the sacrificial buffer layer 109. For example, the mask patterns 110 may be formed of a photoresist.

Figure 4A:
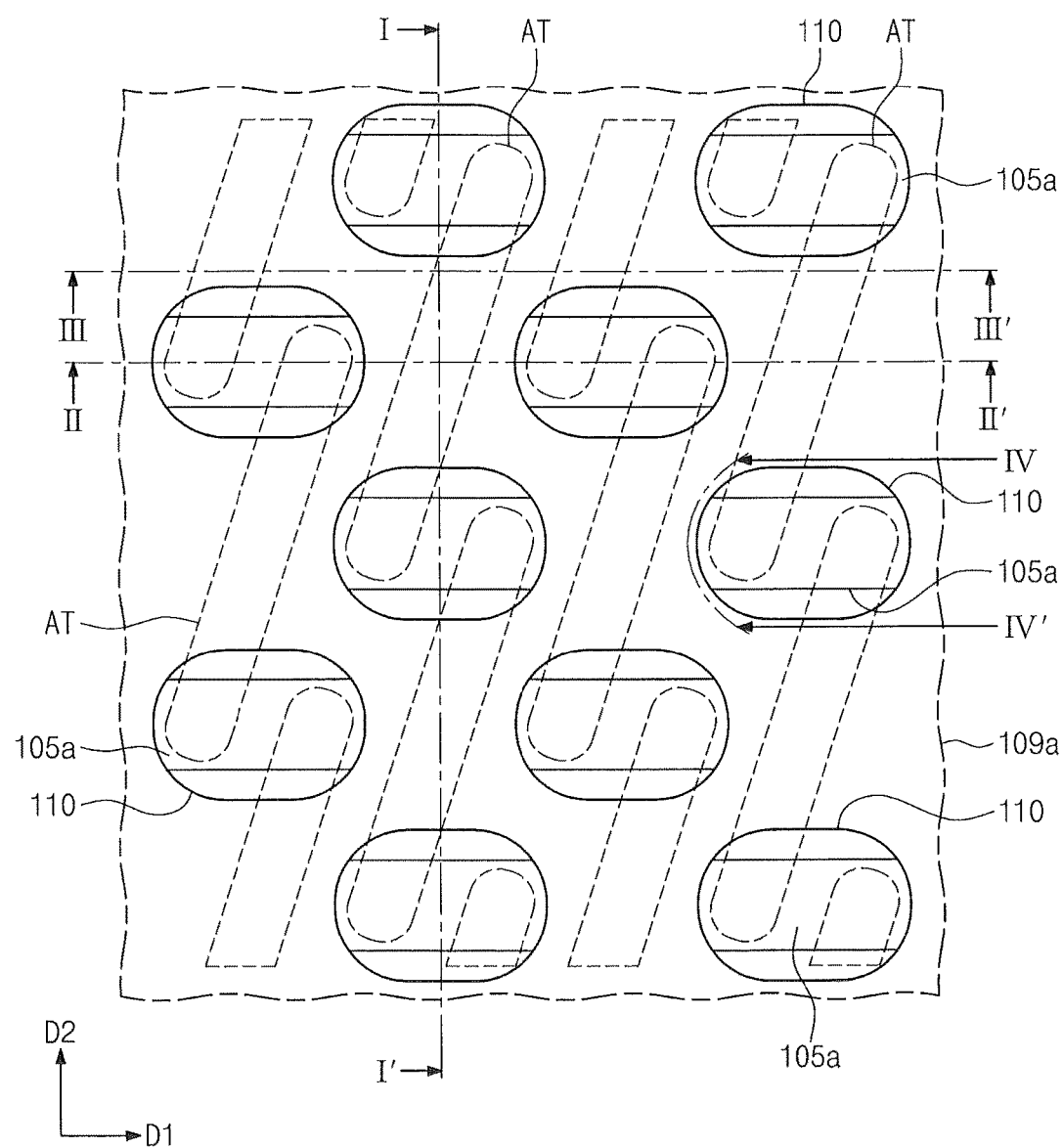
Figure 4B:
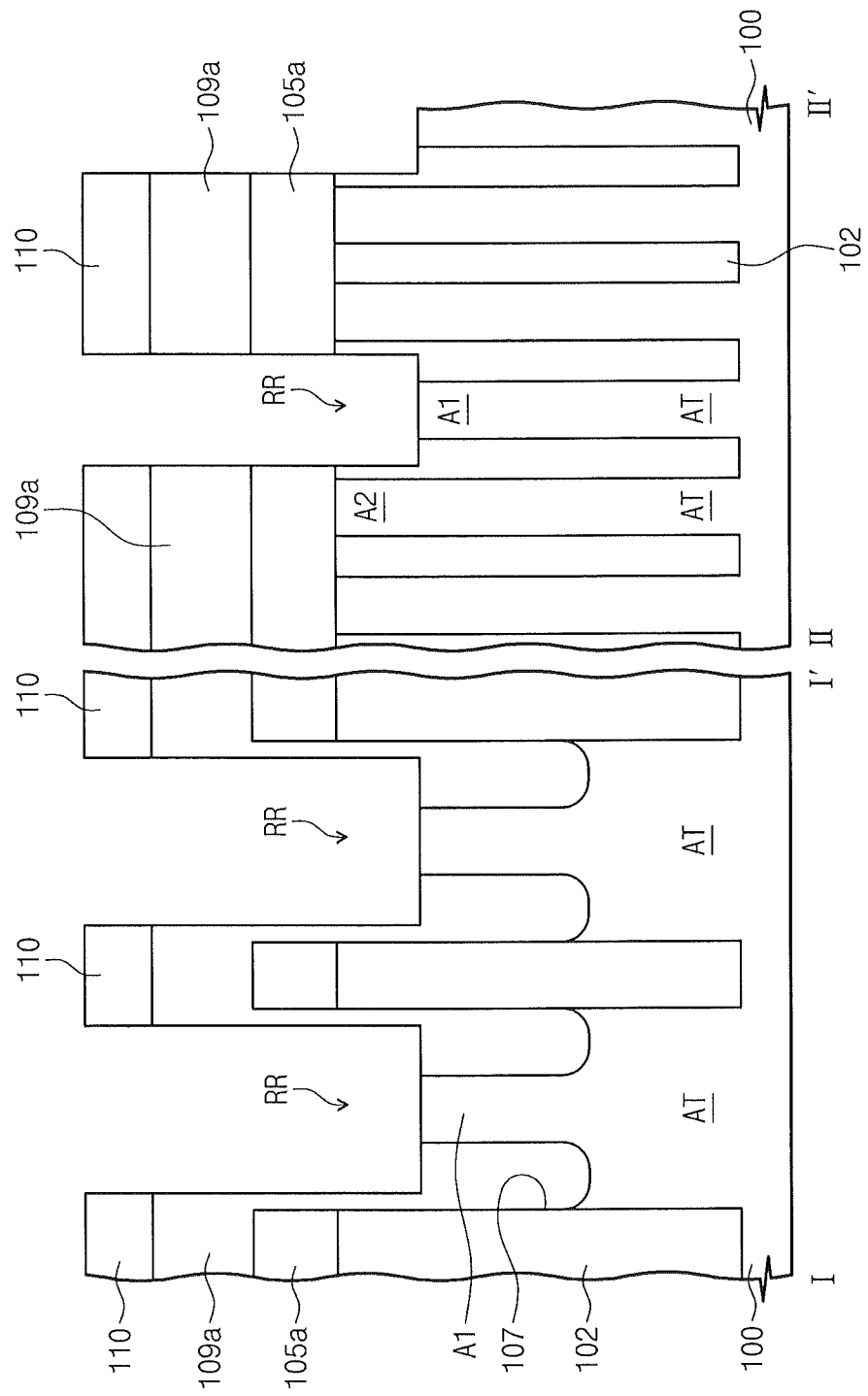
Figure 4C:
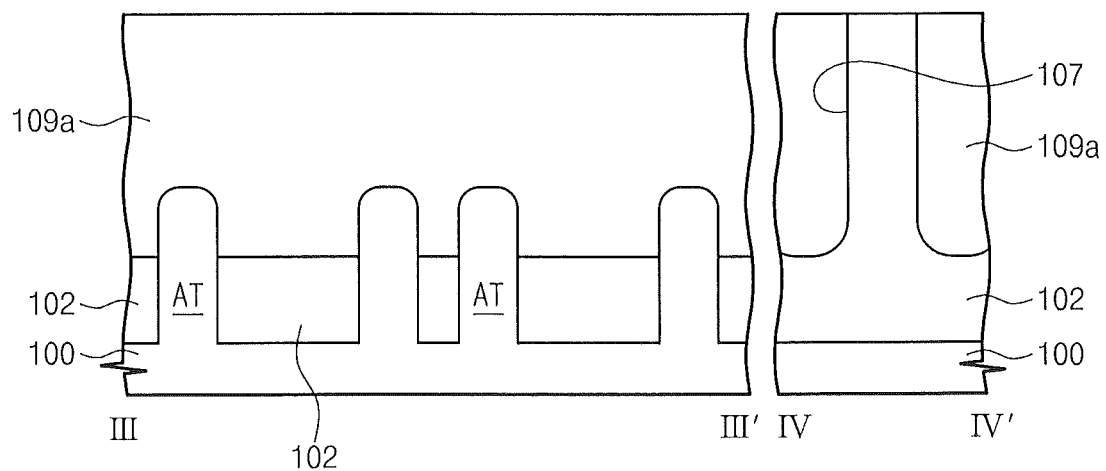

Referring to FIGS. 4A, 4B, and 4C, the sacrificial buffer layer 109, the hard mask lines 105, the center portions of the active portions AT, and the device isolation pattern 102 may be etched using the mask patterns 110 as etch masks. Thus, the center portion of each active portion AT is recessed but the both edge portions of each active portion AT are protected by the mask patterns 110. As a result, a top surface of the recessed center portion A1 of the active portion AT is lower than a top surface of the edge portion A2 of the active portion AT. At this time, the top surface of the recessed center portion A1 of the active portion AT is higher than a bottom surface of the gate groove 107 (e.g., a bottom surface of the gate groove 107 formed in the active portion AT).

Additionally, a recess region RR may be formed by the etching process using the mask patterns 110. The recess region RR may include first regions respectively exposing the recessed center portions A1 of the active portions AT and second regions connecting the first regions to each other. In other words, the first regions of the recess region RR may be connected to each other through the second regions. Furthermore, due to the etching process, hard mask segments 105a may be formed under the mask patterns 110, respectively. In other words, portions of the hard mask lines 105 on the center portions of the active portions AT may be removed but the hard mask segments 105a may remain under the mask patterns 110. Each of the hard mask lines 105 may be divided into a plurality of the hard mask segments 105a by the etching process.

As illustrated in FIG. 4B (e.g., a cross-sectional view taken along a line II-II'), a top surface of the etched device isolation pattern 102 at both sides of the recessed center portion A1 of the active portion AT may be disposed at substantially the same level as the top surface of the recessed center portion A1 of the active portion AT. Alternatively, the top surface of the etched device isolation pattern 102 may be lower than the top surface of the recessed center portion A1 of the active portion AT.

The etched sacrificial buffer layer 109a may remain in the gate grooves 107 to protect inner surfaces of the gate grooves 107.

Figure 5A:
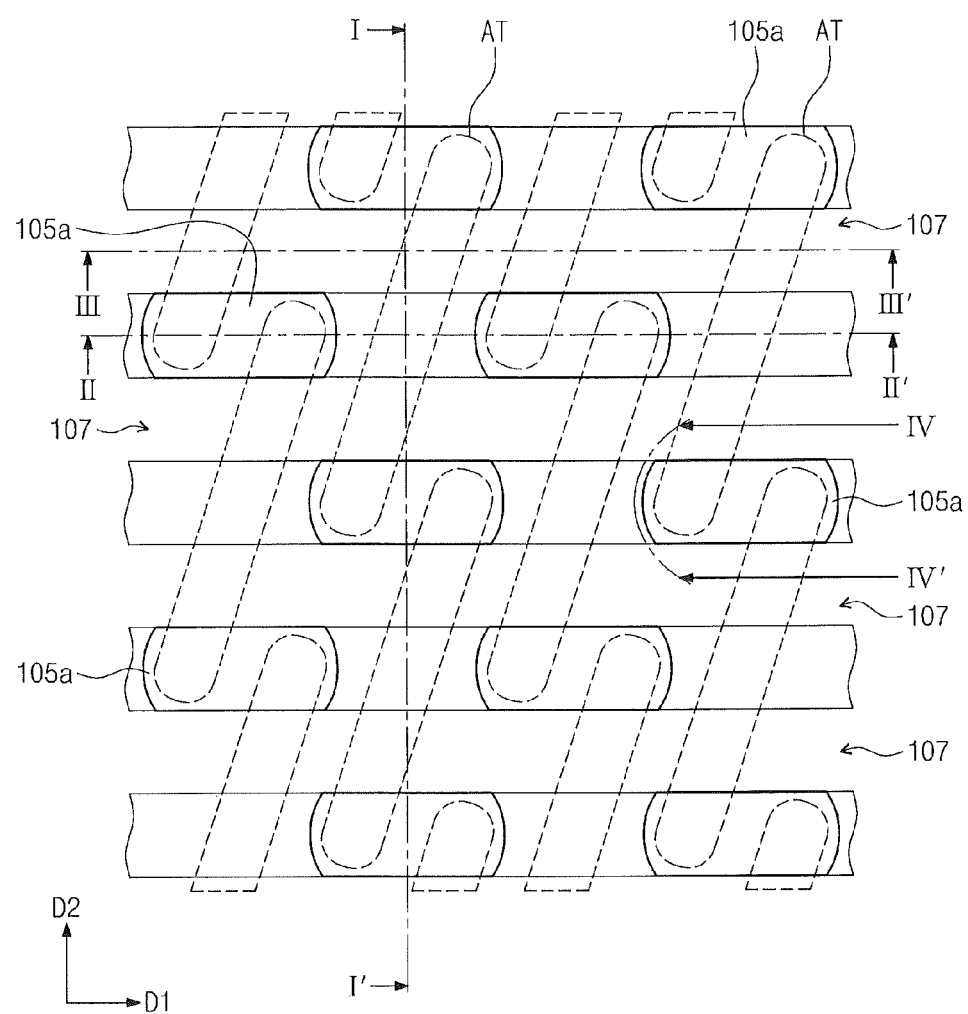
Figure 5B:
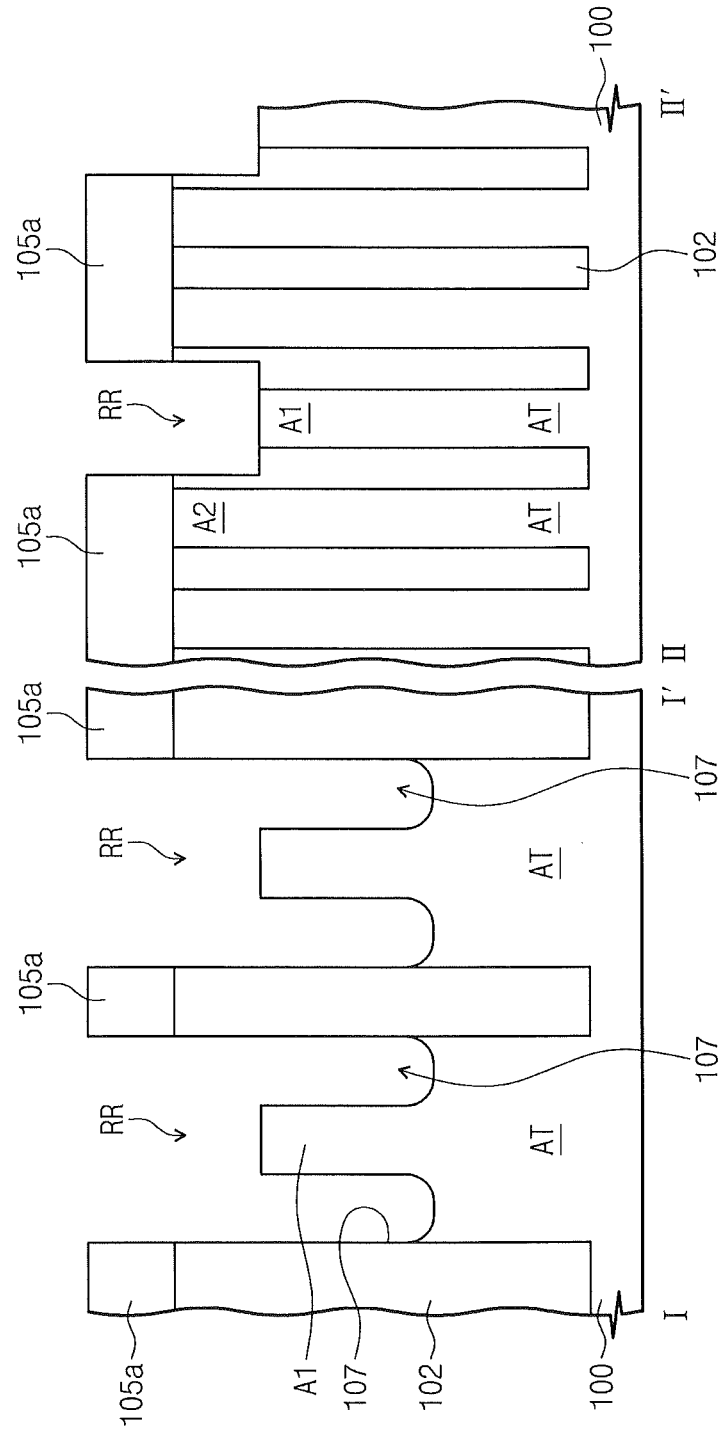
Figure 5C:
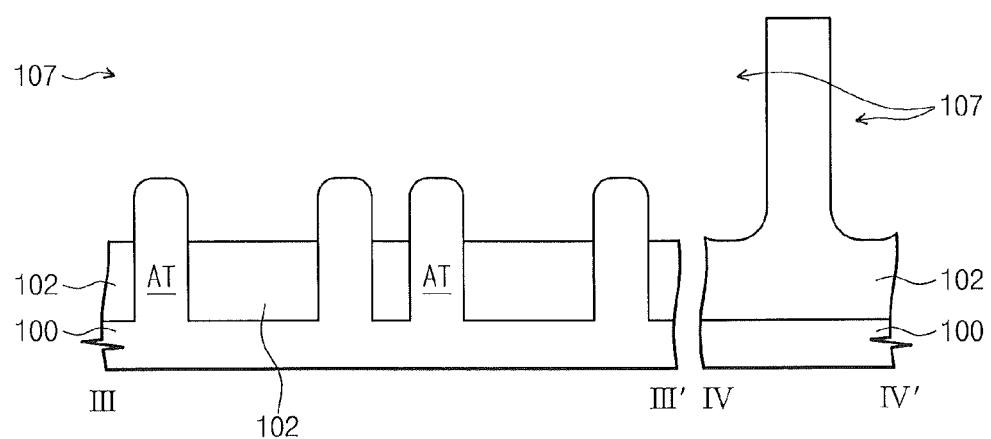

Referring to FIGS. 5A, 5B, and 5C, the mask patterns 110 and the sacrificial buffer layer 109a may be removed to expose the inner surfaces of the gate grooves 107. Additionally, since the sacrificial buffer layer 109a under the mask patterns 110 is removed, a width of the recess region RR may be increased.

The mask patterns 110 may be removed by an ashing process. As described above, since the sacrificial buffer layer 109a has the etch selectivity with respect to the substrate 100, the device isolation pattern 102 and the hard mask segments 105a, the sacrificial buffer layer 109a may be selectively removed. The sacrificial buffer layer 109a may be removed by an isotropic etching process (e.g., a wet etching process).

As described above, since the hard mask lines 105 and the center portions of the active portions AT between the gate grooves 107 are partially etched, upper regions of the gate grooves 107 may be locally connected to each other. Thus, an aspect ratio of the gate grooves 107 may be reduced. In more detail, the center portions of the active portions AT are recessed to reduce the aspect ratio of the gate groove 107.

Figure 6A:
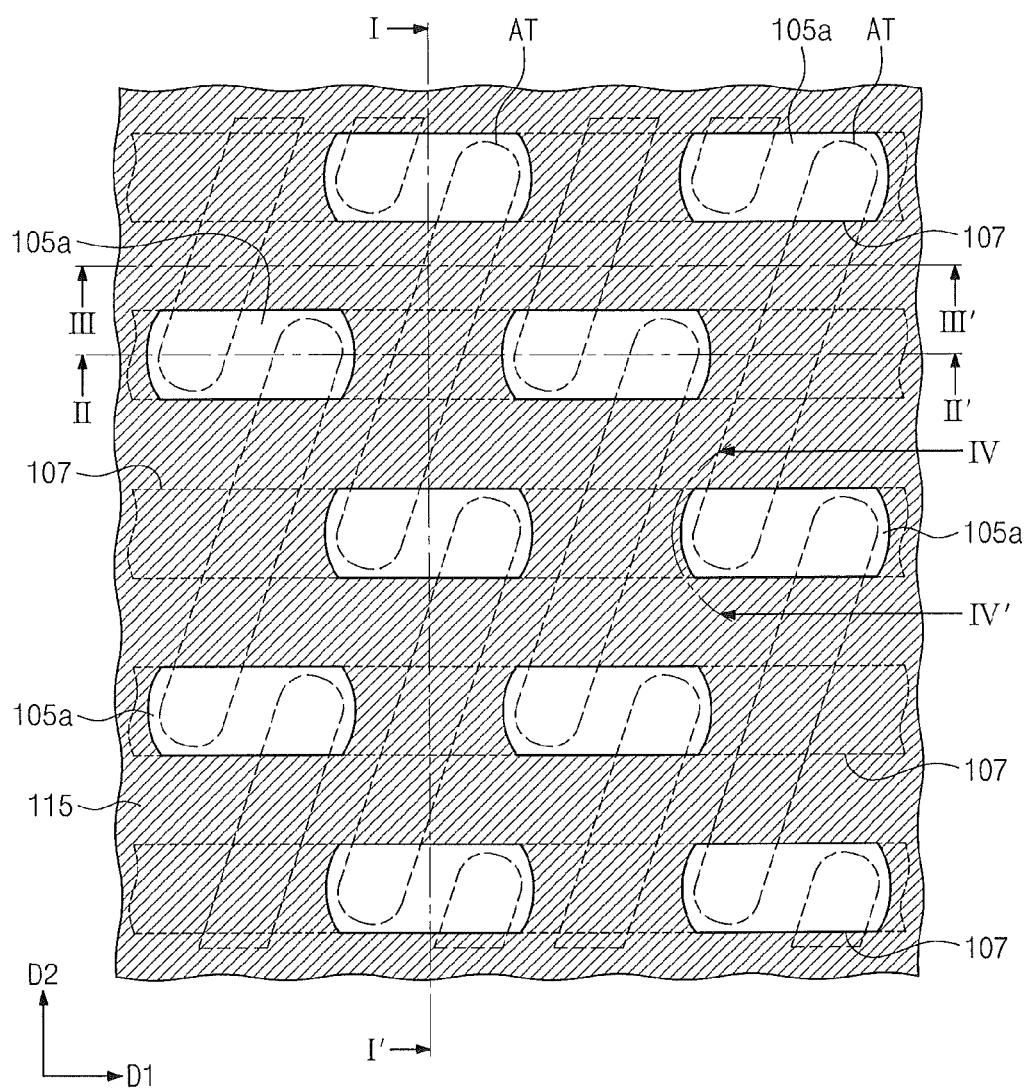
Figure 6B:
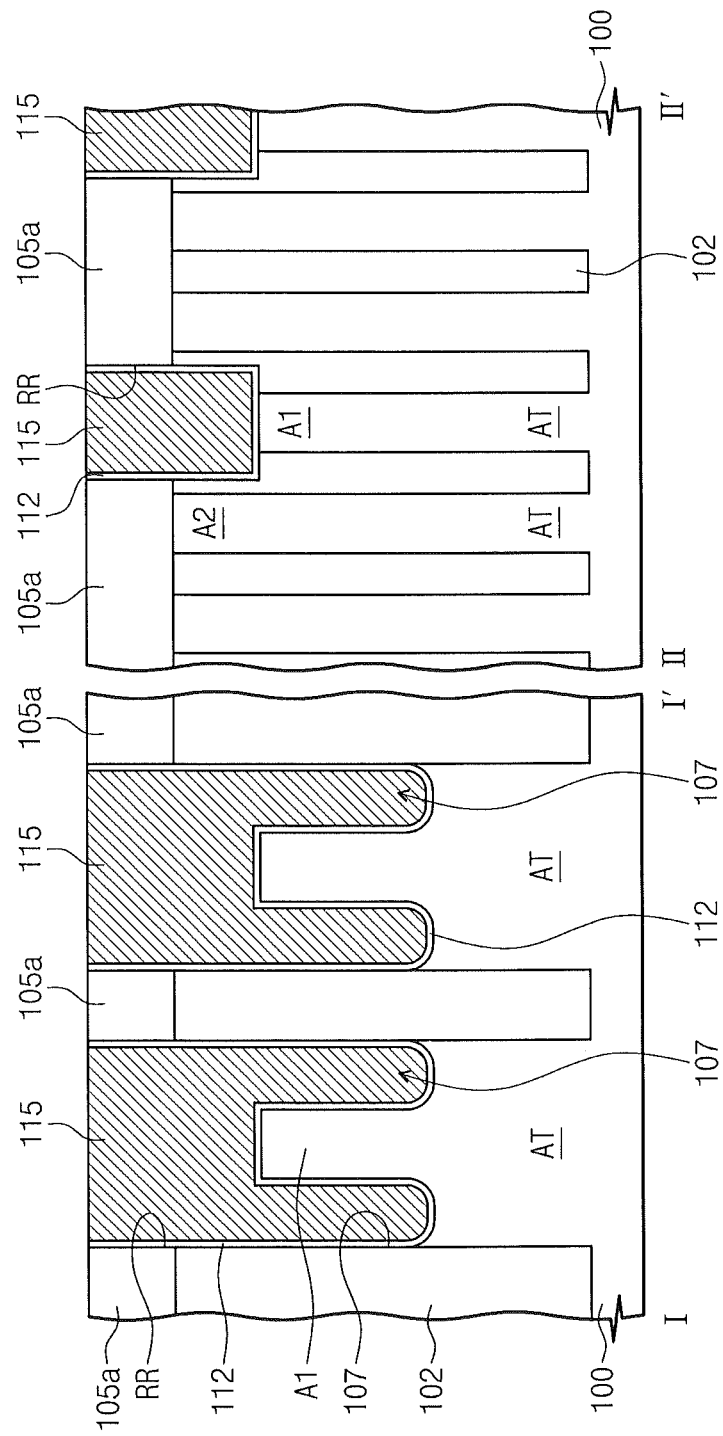
Figure 6C:
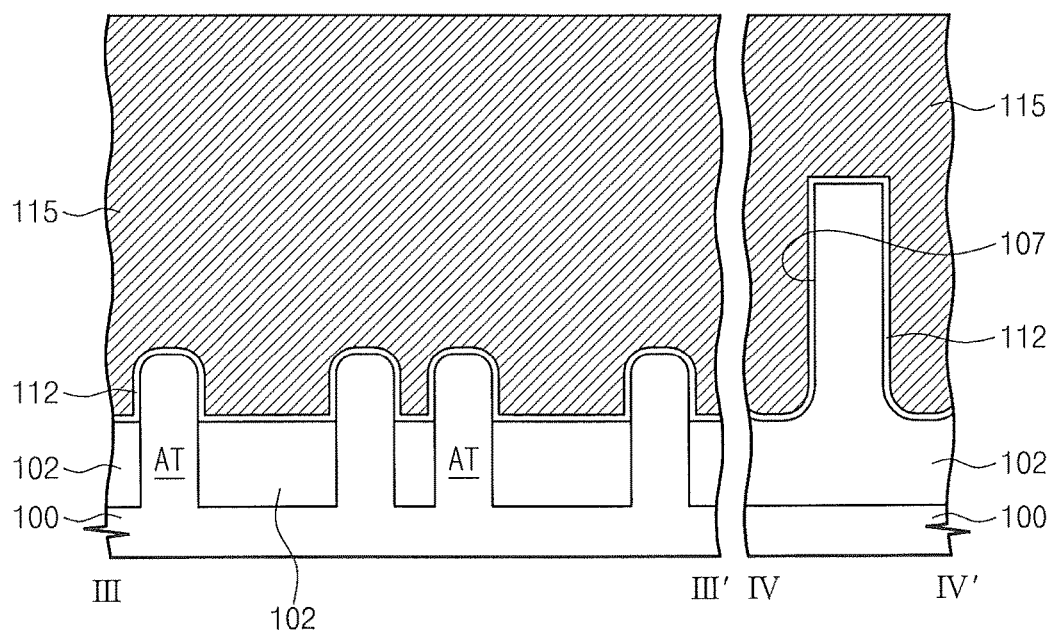

Referring to FIGS. 6A, 6B, and 6C, a gate insulating layer 112 may be formed on the inner surfaces of the gate grooves 107. The gate insulating layer 112 may be formed by a thermal oxidation process, a CVD process, and/or an atomic layer deposition (ALD) process. For example, the gate insulating layer 112 may include an oxide (e.g., silicon oxide), a nitride (e.g., silicon nitride), an oxynitride (e.g., silicon oxynitride), and/or a high-k dielectric material (e.g. an insulating metal oxide such as hafnium oxide and/or aluminum oxide).

A gate conductive layer may be formed on the substrate 100 having the gate insulating layer 112. The gate conductive layer may fill the gate grooves 107 and the recess region RR. The gate conductive layer may be planarized until the hard mask segments 105a are exposed. The planarization process of the gate conductive layer may be performed by a chemical mechanical polishing (CMP) process and/or an etch-back process. The planarized gate conductive layer 115 may fill the gate grooves 107 and the recess region RR. The planarized gate conductive layer 115 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

Figure 7A:
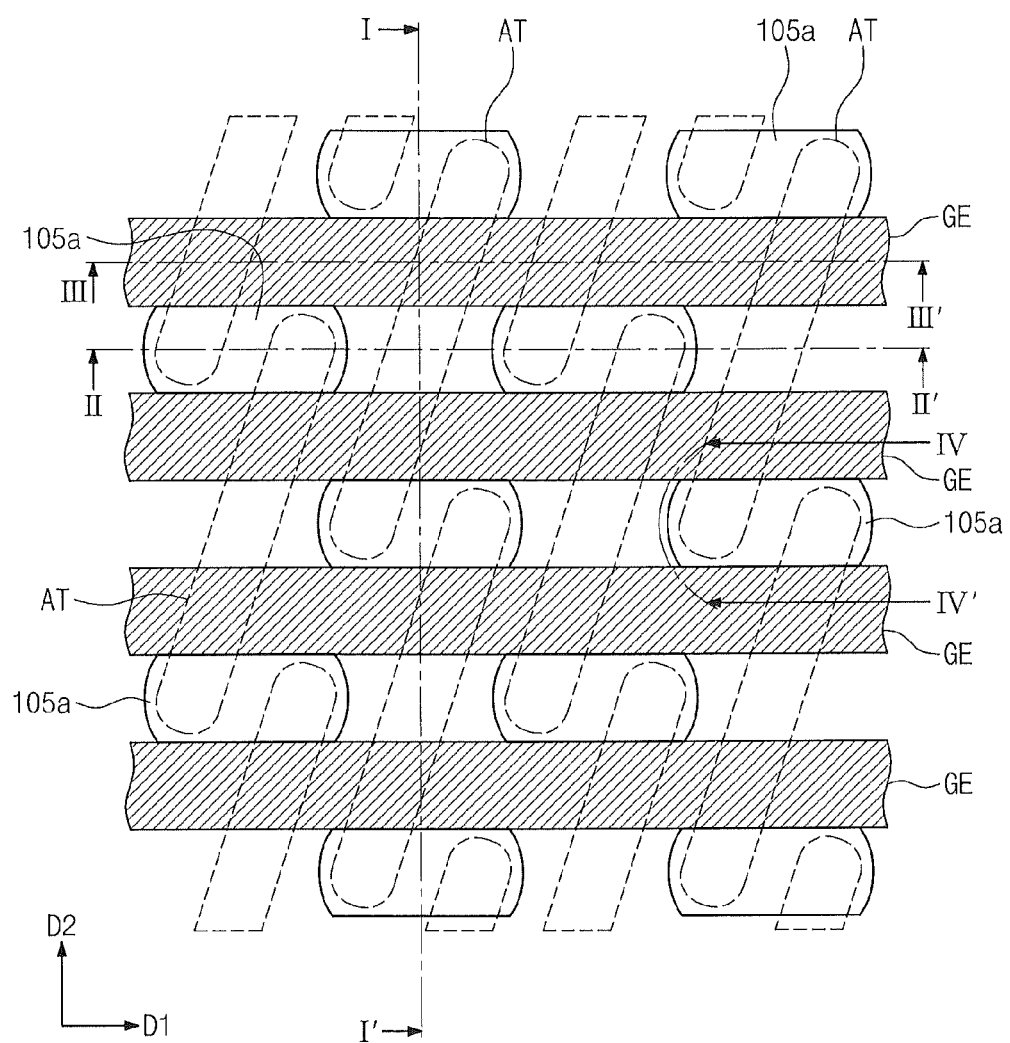
Figure 7B:
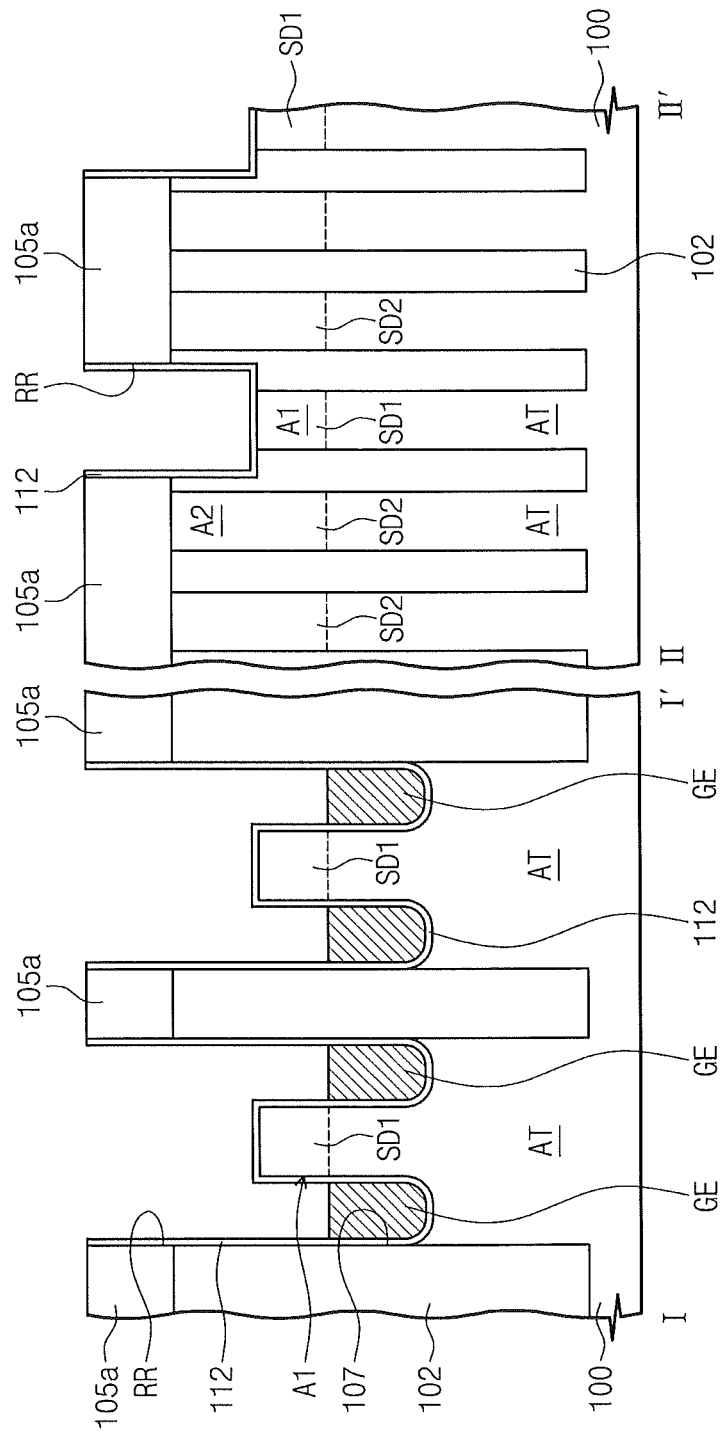
Figure 7C:
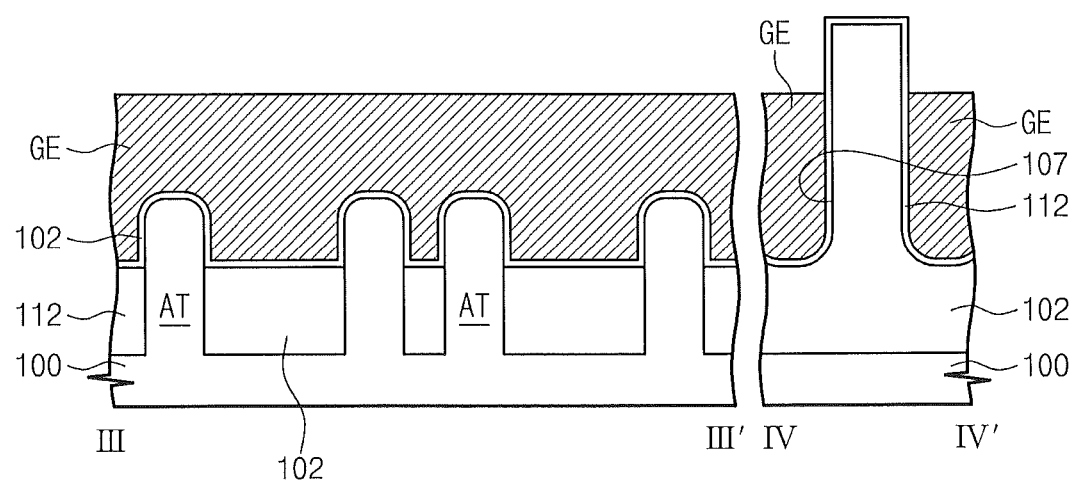

Referring to FIGS. 7A, 7B, and 7C, the planarized gate conductive layer 115 may be recessed to form gate electrodes GE separated from each other. The planarized gate conductive layer 115 may be recessed by an etch-back process. As illustrated in FIG. 7B, a top surface of the gate electrode GE may be lower than the top surface of the recessed center portion A1 of the active portion AT. Additionally, the top surface of the gate electrode GE may be lower than the top surface of the etched device isolation pattern 102 which constitutes a portion of the bottom surface of the recess region RR.

As described above, the hard mask lines 105 and the center portions of the active portions AT may be partially etched. Thus, the aspect ratio of the gate groove 107 is reduced, and the recess region RR having the width greater than the width of the gate groove 107 is formed. As a result, a process margin of the recess process of the planarized gate conductive layer 115 increases such that the gate electrodes GE may be easily separated from each other to realize a semiconductor device having excellent reliability.

Dopants of a second conductivity type may be provided into the active portion AT at both sides of the gate electrode GE, thereby forming a first source/drain region SD1 and a second source/drain region SD2. The first source/drain region SD1 may be formed in the recessed center portion A1 of the active portion AT, and the second source/drain region SD2 may be formed in the edge portion A2 of the active portion AT. The dopants of the second conductivity type may be provided using tilt implantation method. The first source/drain region SD1 may be formed in the recessed center portion A1 of each active portion AT, and a pair of the second source/drain regions SD2 may be formed in the both edge portions A2 of each active portion AT, respectively.

Since the top surface of the recessed center portion A1 is lower than the top surface of the edge portion A2, a top surface of the first source/drain region SD1 may be lower than a top surface of the second source/drain region SD2. However, bottom surfaces of the first and second source/drain regions SD1 and SD2 may be disposed at substantially the same level as each other. The bottom surfaces of the first and second source/drain regions SD1 and SD2 may be disposed at a level approximate to the top surface of the gate electrode GE.

In other embodiments, the first and second source/drain regions SD1 and SD2 may be formed before the formation of the gate electrodes GE. For example, after the active portion AT is defined, dopants of the second conductive type may be supplied into an upper portion of the active portion AT to form a doped region. Thereafter, the gate grooves 107 may be formed in the active portion AT to divide the doped region into the first and second source/drain regions SD1 and SD2. At this time, the bottom ends of the gate grooves 107 are lower than a bottom surface of the doped region.

Figure 8A:
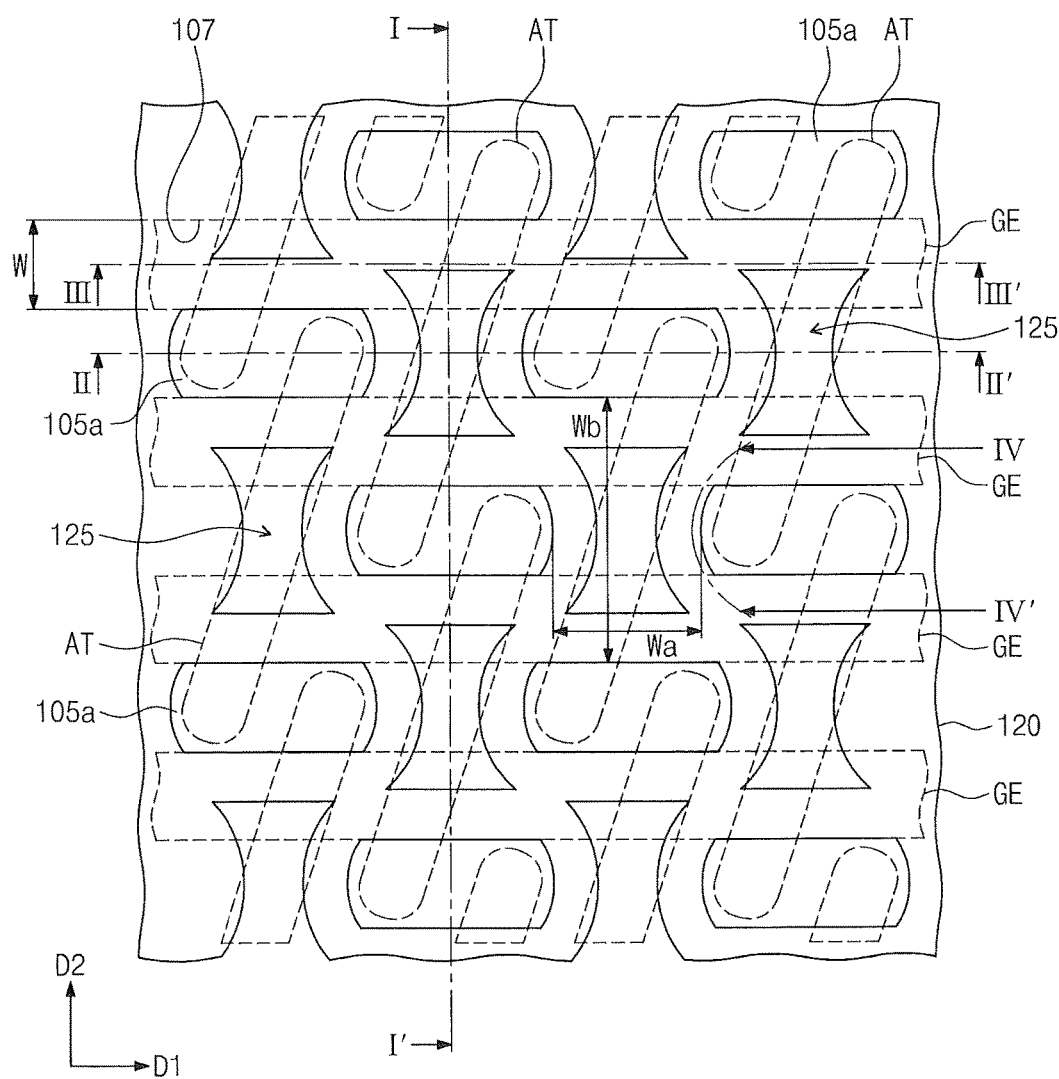
Figure 8B:
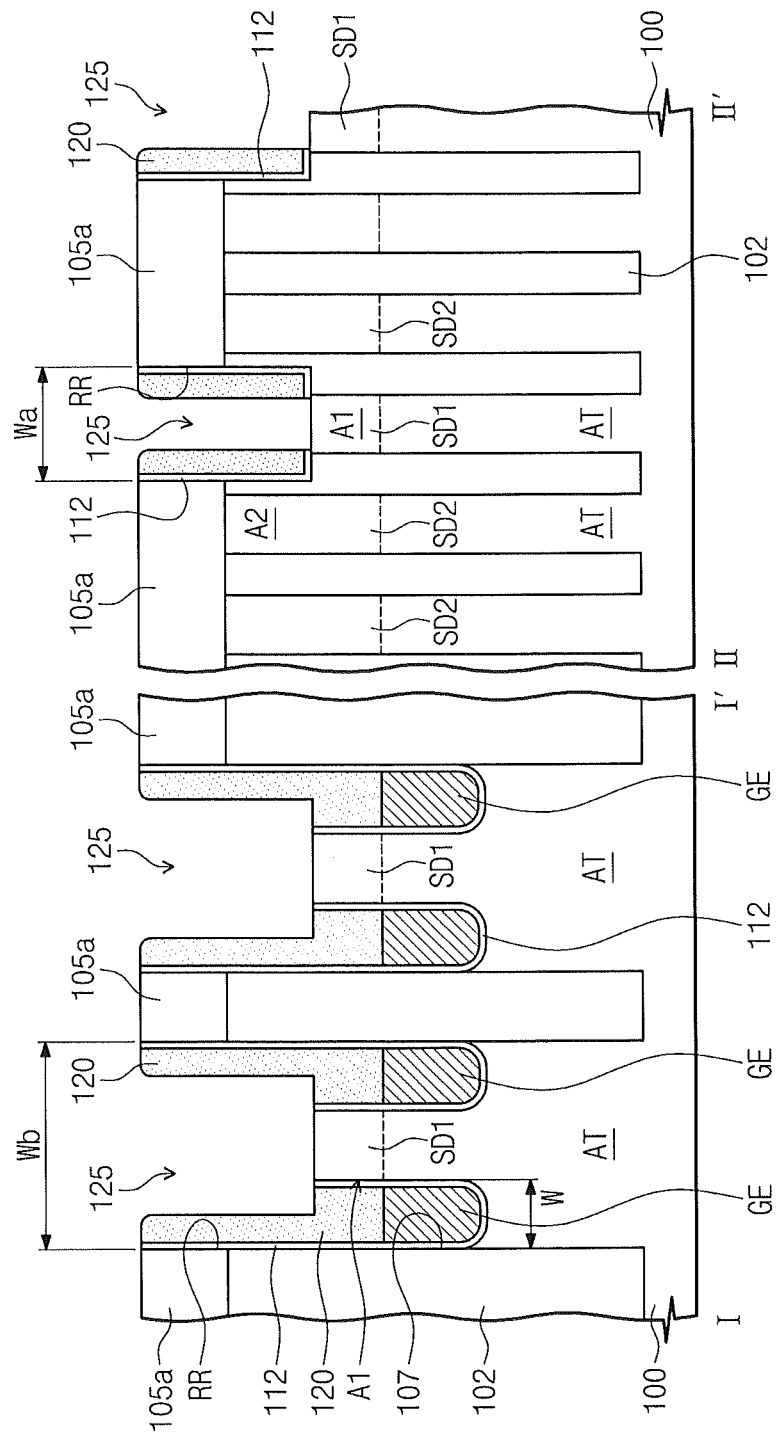
Figure 8C:
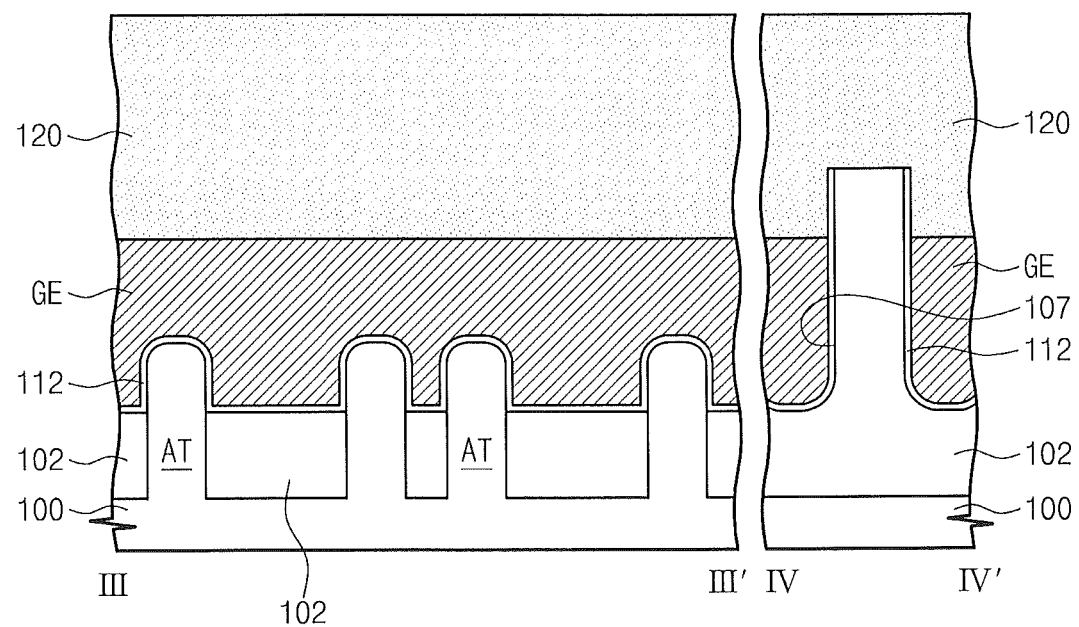

Referring to FIGS. 8A, 8B, and 8C, subsequently, a gate capping insulating layer may be formed on the substrate 100. The gate capping insulating layer may be conformally formed on the substrate 100 by a CVD process and/or an ALD process. The gate capping insulating layer may include a nitride (e.g., silicon nitride) and/or an oxynitride (e.g., silicon oxynitride).

A thickness of the gate capping insulating layer may be equal to or greater than a half of the width W of the gate groove 107. Thus, the gate groove 107 on the gate electrode GE may be completely filled with the gate capping insulating layer. As described above, the recess region RR may include the first regions respectively exposing the recessed center portions A1 and the second regions connecting the first regions to each other. At this time, the gate capping insulating layer may completely fill the second regions of the recess region RR.

On the other hand, the gate capping insulating layer may partially fill each of the first regions of the recess region RR. As illustrated in FIGS. 8A and 8B, the first region of the recess region RR may include a first width Wa in the first direction D1 and a second width Wb in the second direction D2. In some embodiments, the first width Wa of the first region of the recess region RR may correspond to a distance between a pair of hard mask segments 105a adjacent to each other in the first direction D1, and the second width Wb of the first region may correspond to a distance between a pair of hard mask segments 105a adjacent to each other in the second direction D2. At this time, the thickness of the gate capping insulating layer may be less than a half of the minimum value of the first and second widths Wa and Wb of the first region of the recess region RR. For example, if the first width Wa is less than the second width Wb as illustrated in FIG. 8A, the thickness of the gate capping insulating layer may be less than a half of the first width Wa.

The gate capping insulating layer may be anisotropically etched until the top surfaces of the recessed center portions A1 of the active portions AT are exposed. Thus, gate capping patterns 120 may be formed on the gate electrodes GE, respectively. Additionally, openings 125 may be formed to expose the recessed center portions A1 of the active portions AT, respectively.

The gate capping patterns 120 may fill the gate grooves 107 from the top surfaces of the gate electrodes GE to a top surface level of the recessed center portions A1, respectively. Additionally, the gate capping patterns 120 may extend outside the gate grooves 107 so that the extending portions of the gate capping patterns 120 may be connected to each other without an interface therebetween. The extending portions of the gate capping patterns 120 may extend along sidewalls of the hard mask segments 105a so as to be connected to each other without an interface therebetween. Additionally, the connected extending portions of the gate capping patterns 120 may define the openings 125. In other words, sidewalls of the openings 125 may be formed of the extending portions of the gate capping patterns 120.

In more detail, the connected extending portions of the gate capping patterns 120 fill the second regions of the recess region RR. Additionally, the extending portions of the gate capping patterns 120 define the openings 125 in the first regions of the recess region RR, respectively. Since the extending portions of the gate capping patterns 120 fill the second regions of the recess region RR, the openings 125 are isolated from each other. In a plan view, each of the openings 125 may have a closed loop-shape. As illustrated in FIGS. 8A and 8C (e.g., a cross-sectional view taken along a line IV-IV'), the connected portion of the extending portions of the gate capping patterns 120 may be disposed on the device isolation pattern 102 corresponding to a portion of the bottom surface of the recess region RR.

The openings 125 may expose the first source/drain regions SD1 formed in the recessed center portions A1 of the active portions AT, respectively.

Figure 9A:
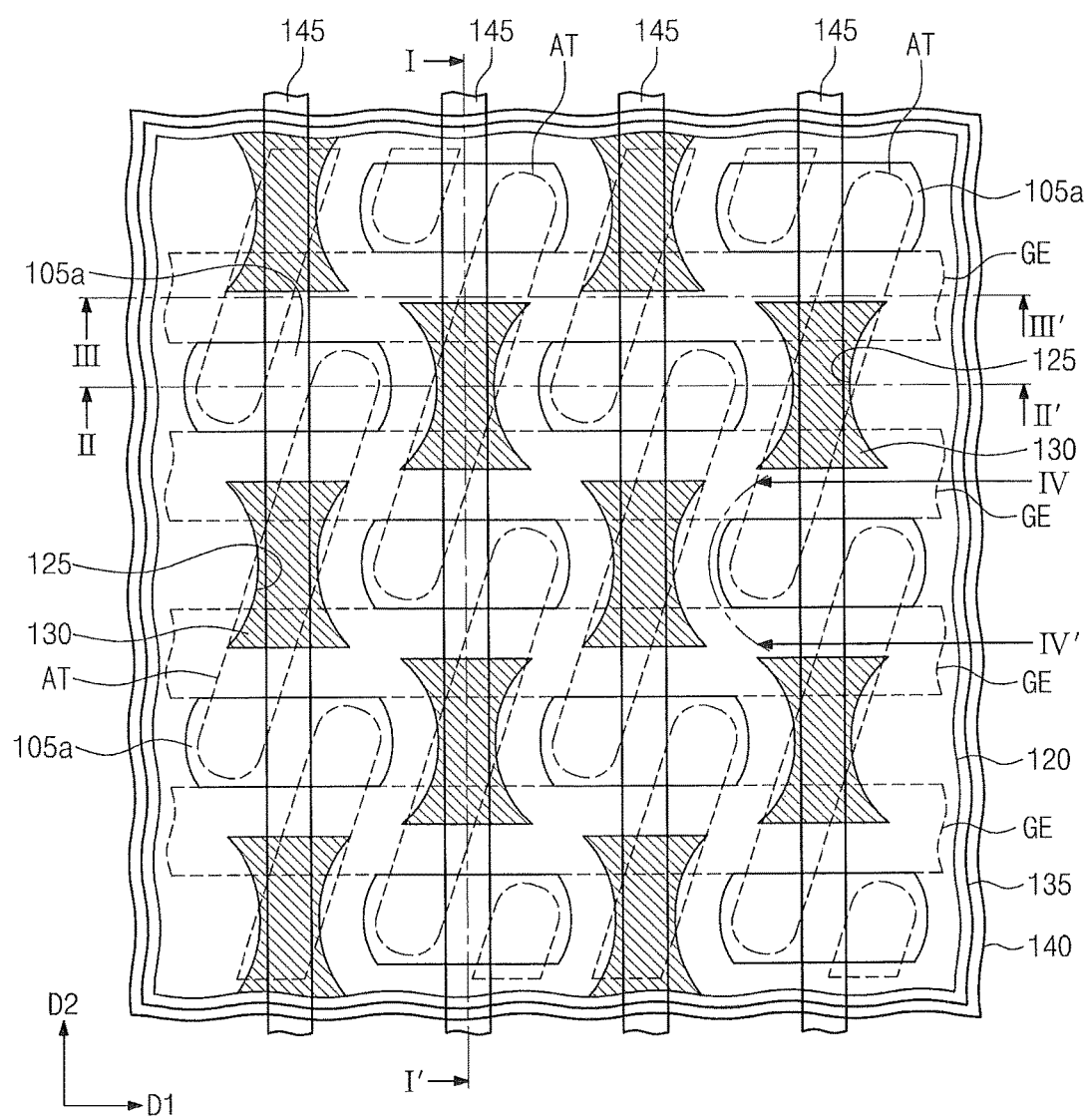
Figure 9C:
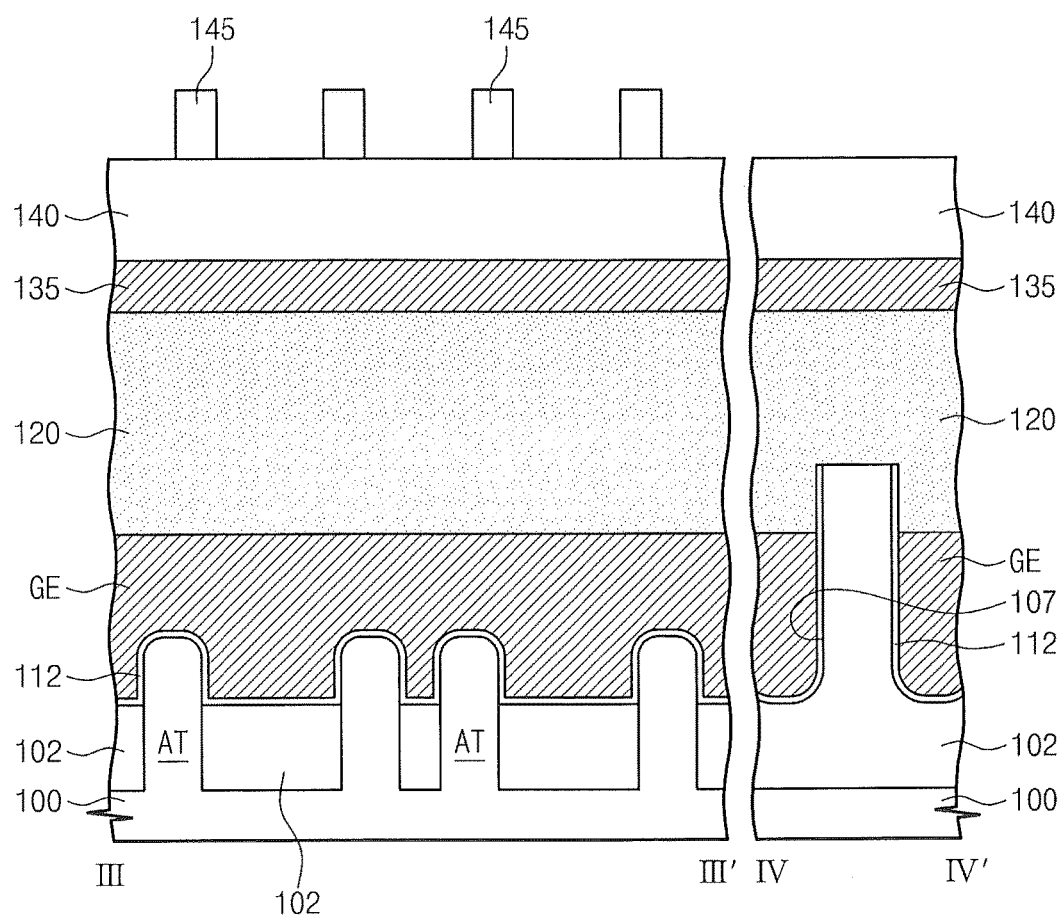

Referring to FIGS. 9A, 9B, and 9C, a contact conductive layer may be formed on the substrate 100 to fill the openings 125. The contact conductive layer may be planarized to form contact plugs 130 in the openings 125. The contact plugs 130 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

Subsequently, a wire conductive layer 135 may be formed on the substrate 100 and then a wire capping insulating layer 140 may be formed on the wire conductive layer 135. The wire conductive layer 135 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide). The wire capping insulating layer 140 may be formed of an insulating material used as a hard mask. For example, the wire capping insulating layer 140 may include a nitride layer (e.g., a silicon nitride layer) and/or an oxynitride layer (e.g., a silicon oxynitride layer).

Wire mask patterns 145 may be formed on the wire capping insulating layer 140. The wire mask patterns 145 may cross over the gate electrodes GE. The wire mask patterns 145 may extend in parallel to each other in the second direction D2. Each of the wire mask patterns 145 may be disposed over the contact plugs 130 arranged in a line along the second direction D2.

In some embodiments, a width of the wire mask pattern 145 may be less than a maximum width of the contact plug 130 in the first direction D1. Additionally, the width of the wire mask pattern 145 may also be less than a minimum width of the contact plug 130 in the first direction D1, as illustrated in FIG. 9A. However, the inventive concept is not limited thereto.

Figure 10A:
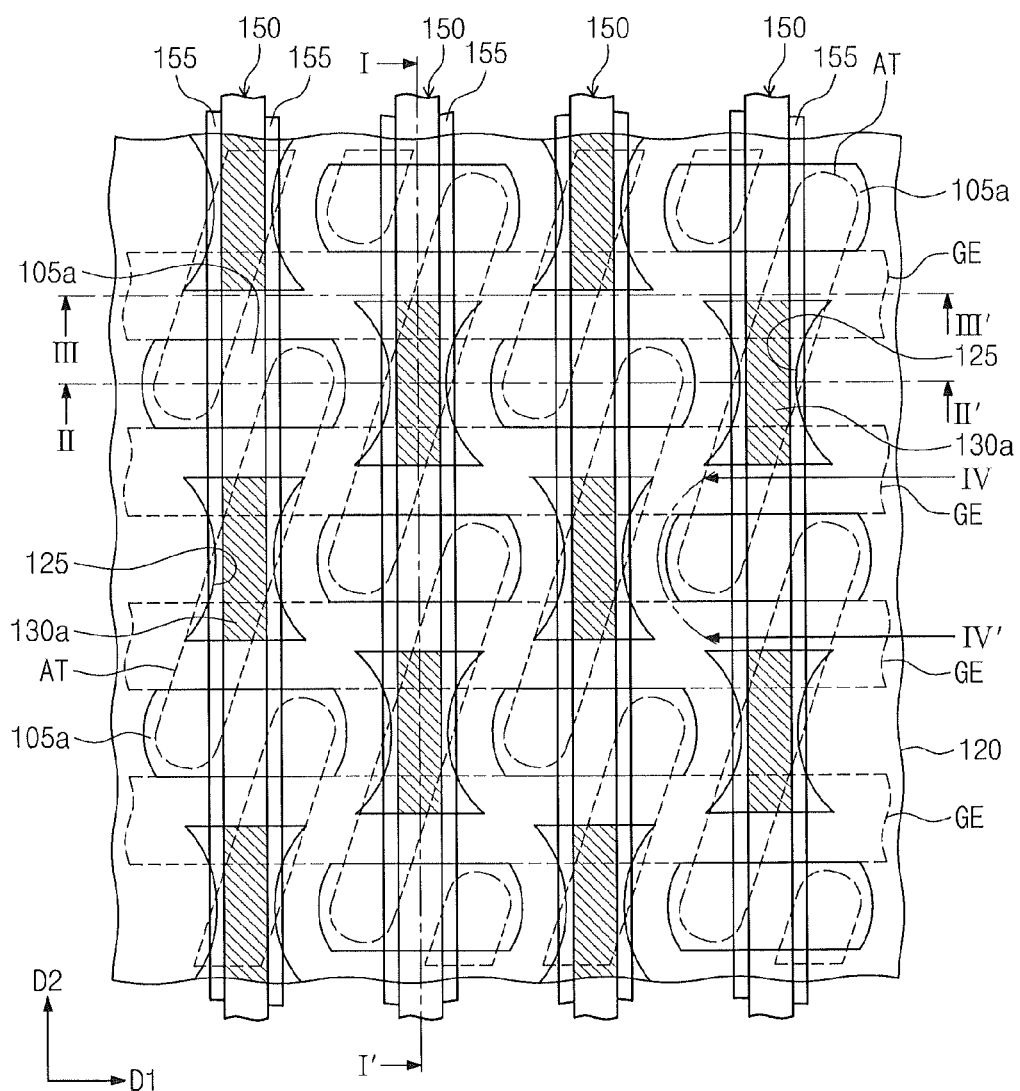
Figure 10B:
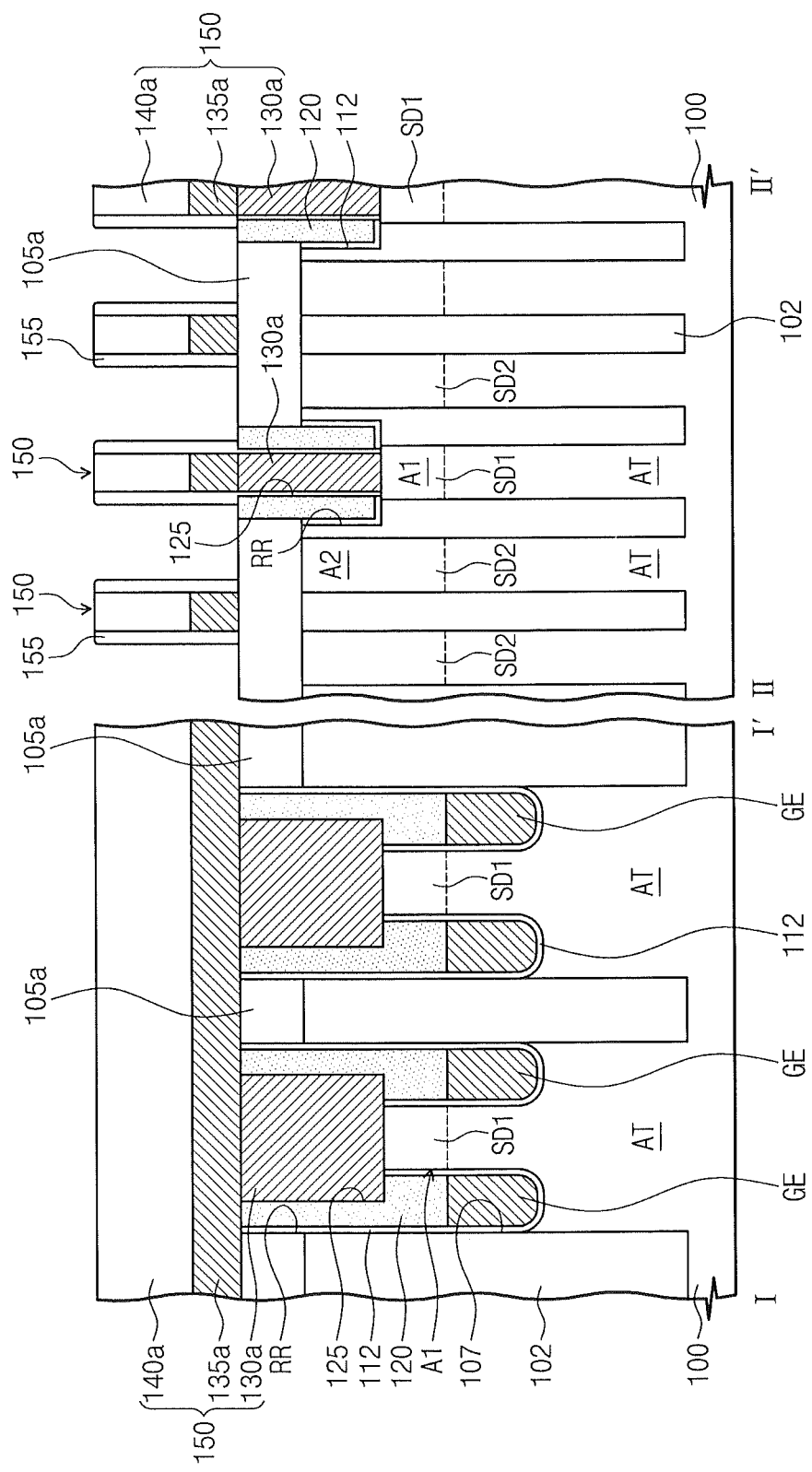
Figure 10C:
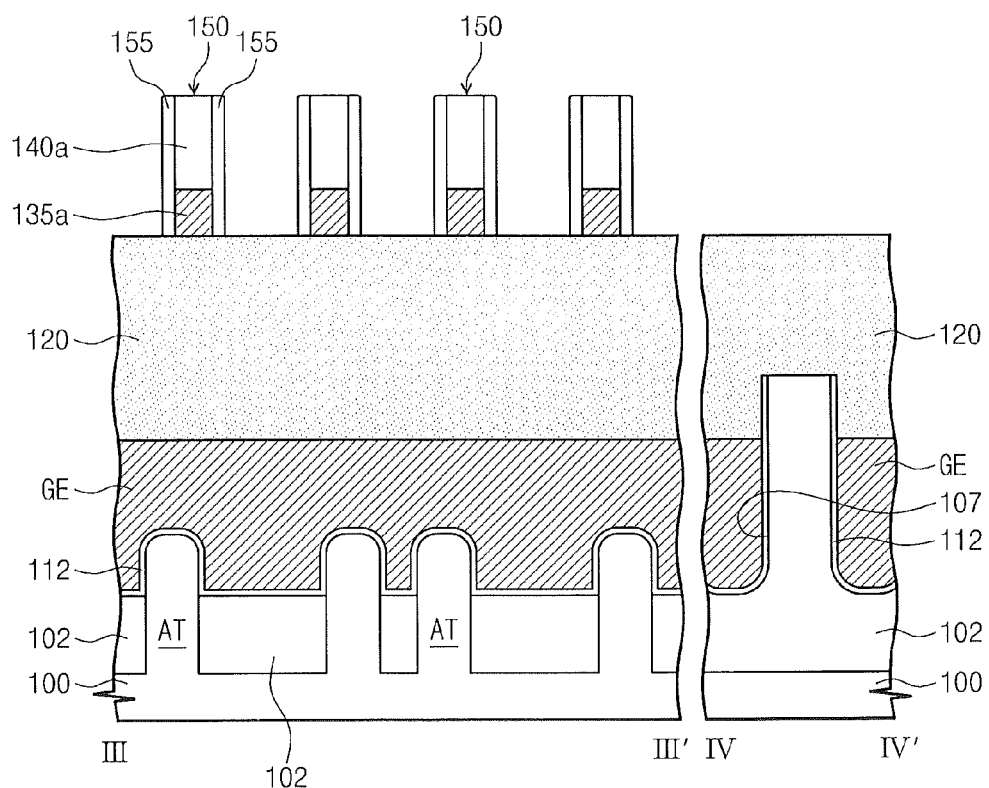

Referring to FIGS. 10A, 10B, and 10C, the wire capping insulating layer 140, the wire conductive layer 135 and the contact plugs 130 may be successively patterned using the wire mask patterns 145 as etch masks, thereby forming wire patterns 150. Each of the wire patterns 150 may include a contact pattern 130a, a conductive wire 135a, and a wire capping pattern 140 which are sequentially stacked.

An example of the patterning process using the wire mask patterns 145 will be described hereinafter. The wire capping insulating layer 140 may be etched using the wire mask patterns 145 as etch masks, thereby forming the wire capping patterns 140a. Subsequently, the wire mask patterns 145 may be removed by, for example, an ashing process. Thereafter, the wire conductive layer 135 and the contact plugs 130 may be successively etched using the wire capping patterns 140a as etch masks, thereby forming the conductive wires 135a and the contact patterns 130a. However, the inventive concept is not limited thereto.

Each of the wire patterns 150 may include the contact patterns 130a arranged in a line in the second direction D2, the conductive wire 135 extending in the second direction D2 on the contact patterns 130a, and the wire capping pattern 140a extending in the second direction D2 on the conductive wire 135a. In each of the wire patterns 150, each of the contact patterns 130a may have both sidewalls aligned with both sidewalls of the conductive wire 135a, respectively.

Insulating spacers 155 may be formed on both sidewalls of each wire pattern 150, respectively. The insulating spacer 155 may have a single-layered structure or a multi-layered structure. The insulating spacers 155 may be formed of an insulating material. For example, the insulating spacers 155 may be formed of a nitride (e.g., silicon nitride) and/or an oxynitride (ex, silicon oxynitride).

Figure 11A:
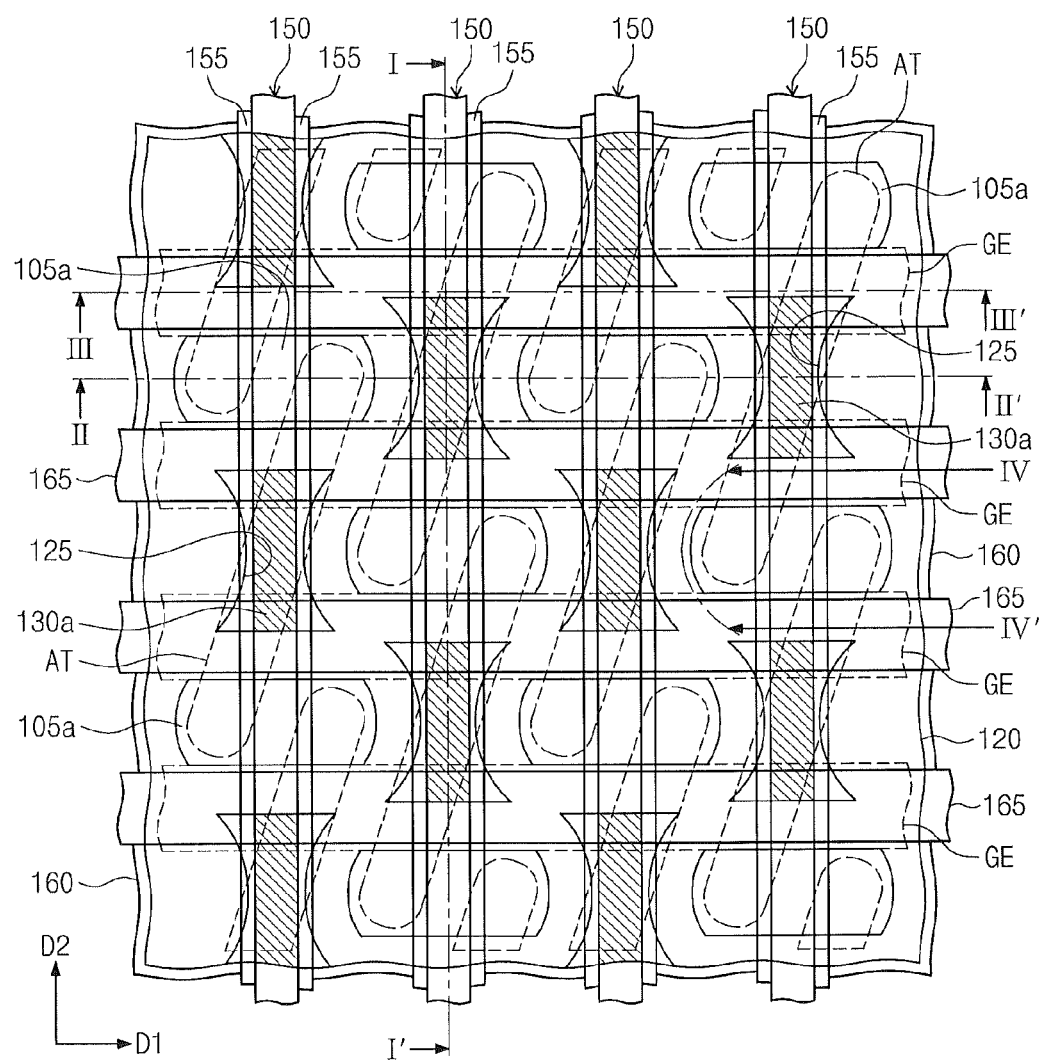
Figure 11B:
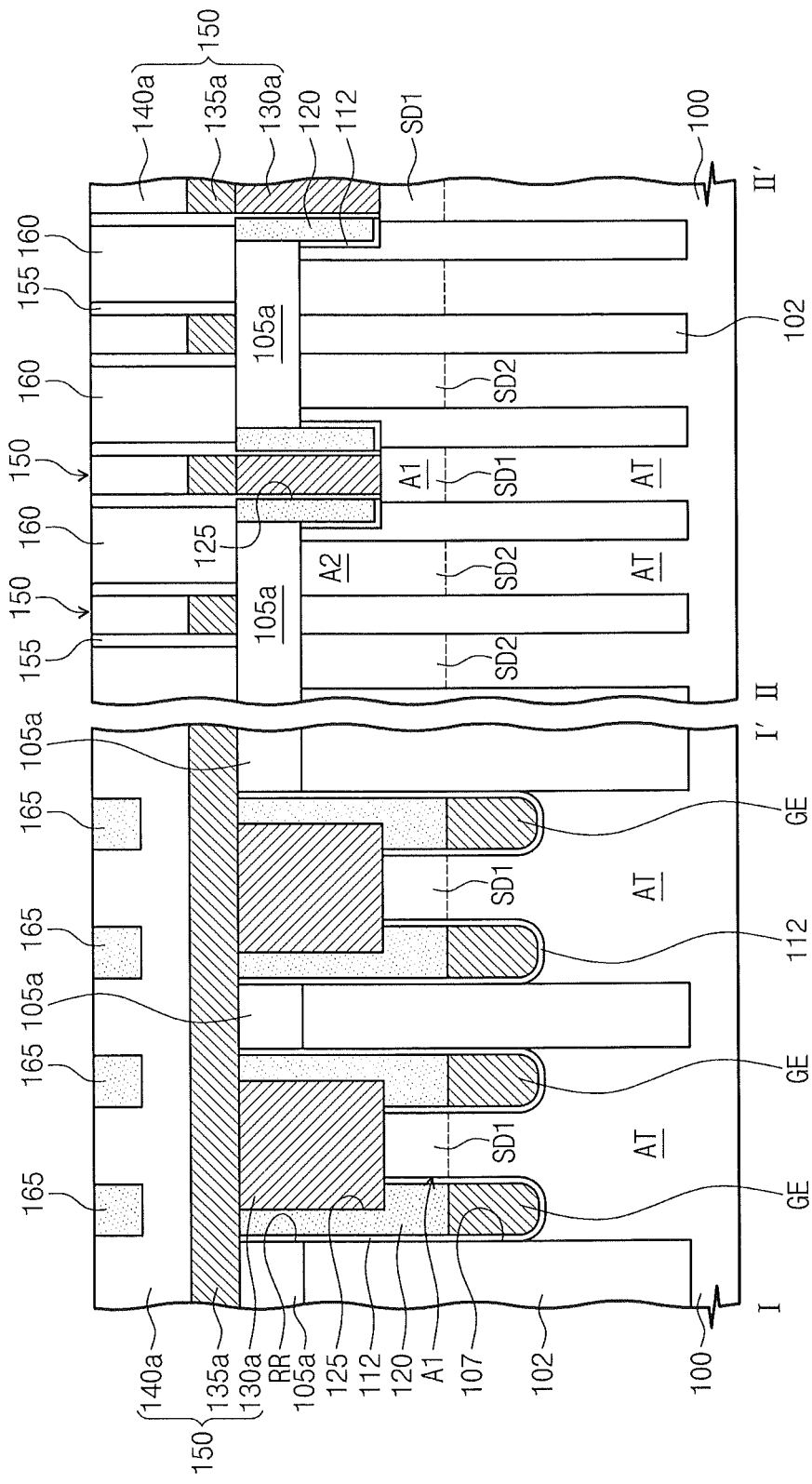
Figure 11C:
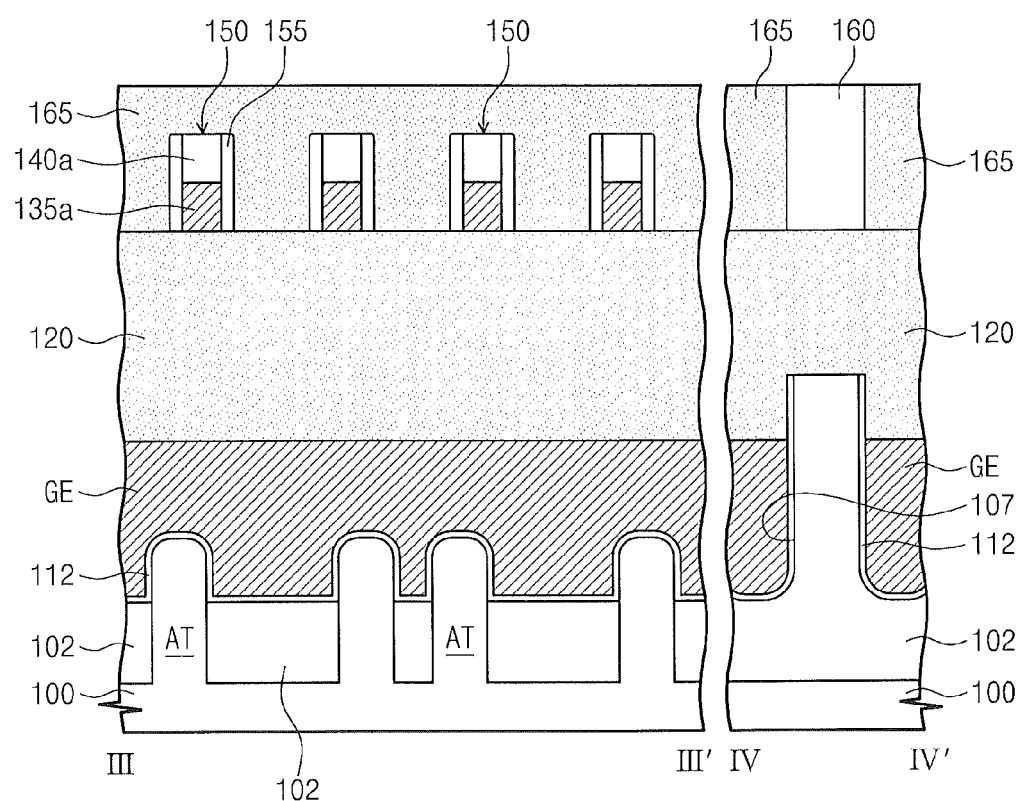

Referring to FIGS. 11A, 11B, and 11C, a filling layer may be formed to fill spaces between the wire patterns 150 on the substrate 100. The filling layer may be planarized until top surfaces of the wire patterns 150 are exposed, thereby forming filling line patterns. Each of the filling line patterns may be formed between the wire patterns 150 adjacent to each other. The filling line patterns and the wire capping patterns 140 may be patterned to form fence grooves crossing the wire patterns 150. The fence grooves may extend in the first direction D1 and may overlap with the gate electrodes GE, respectively. A bottom surface of the fence groove may include a first portion formed of the wire capping pattern 140a and a second portion formed of the gate capping pattern 120. At this time, the first portion of the bottom surface of the fence groove is higher than the second portion of the bottom surface of the fence groove. The first portion of the bottom surface of the fence groove is higher than the top surface of the conductive wire 135a. Due to the fence grooves, each of the filling line patterns may be divided into a plurality of filling pillars 160. The filling pillars 160 are completely separated from each other. Each of the filling pillars 160 may overlap with at least a portion of each of the second source/drain regions SD2. In more detail, each filling pillar 160 may be disposed on at least a portion of the hard mask segment 105a on each second source/drain region SD2. In some embodiments, the filling pillar 160 may also be disposed on at least a portion of the connected portion of the gate capping patterns 120, as illustrated in FIG. 11C (e.g., a cross-sectional view taken along the line IV-IV').

A fence insulating layer may be formed to fill the fence grooves. The fence insulating layer may be planarized until top surfaces of the filling pillars 160 are exposed, thereby forming insulating fences 165. The insulating fences 165 may overlap with the gate electrodes GE, respectively. Top surfaces of the insulating fences 165 may be substantially coplanar with top surfaces of the wire capping patterns 140a.

The filling pillars 160 may be formed of a material having an etch selectivity with respect to the insulating fences 165, the insulating spacers 155, and the wire capping patterns 140a. For example, the filling pillars 160 may be formed of an oxide (e.g., silicon oxide), and the insulating fences 165 may be formed of a nitride (e.g., silicon nitride) and/or an oxynitride (e.g., silicon oxynitride).

Figure 12A:
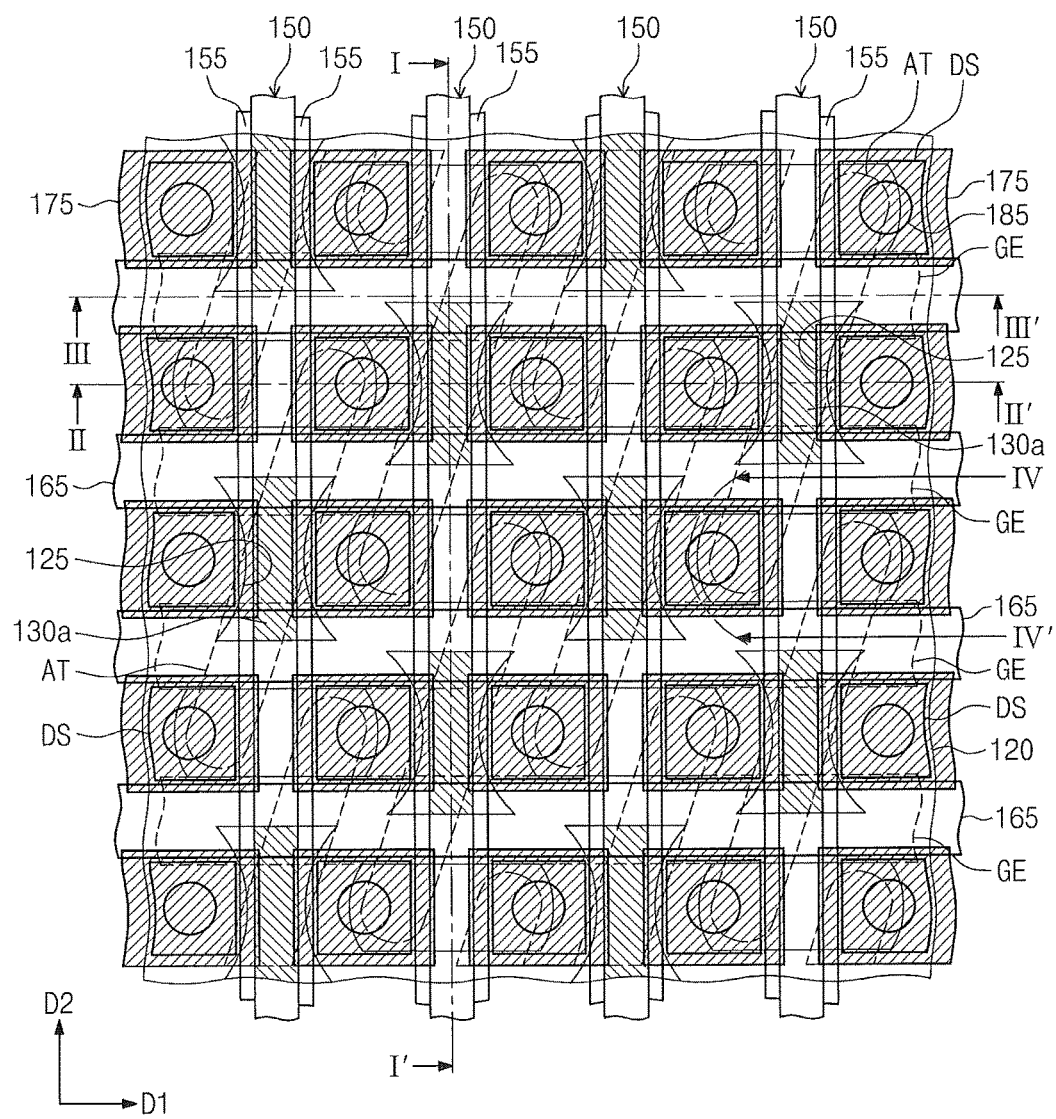
FIG. 12A is a plan view illustrating a semiconductor device according to some embodiments of the inventive concept.
Figure 12B:
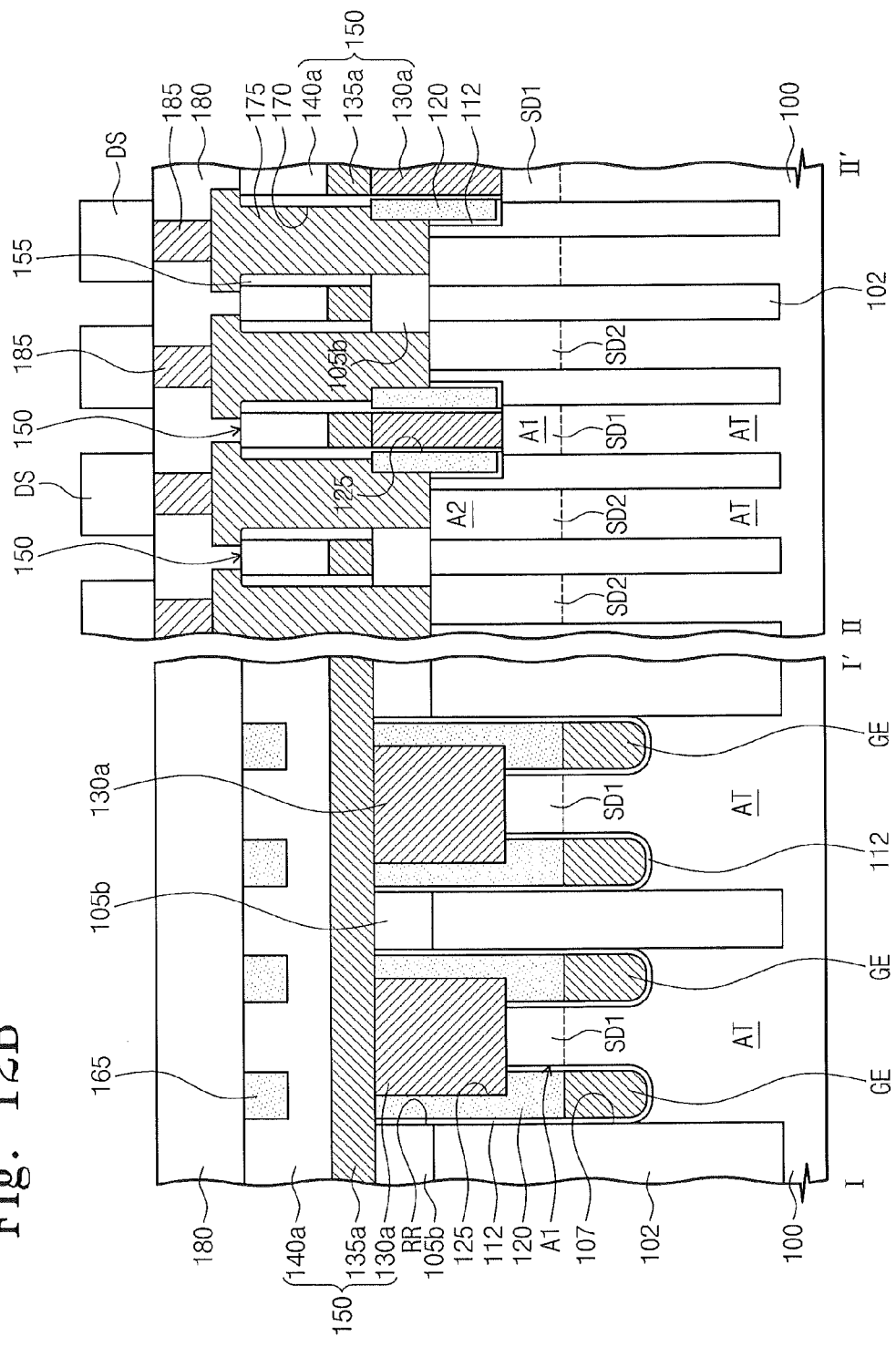
FIG. 12B is a cross-sectional view taken along lines I-I' and II-II' of FIG. 12A.
Figure 12C:
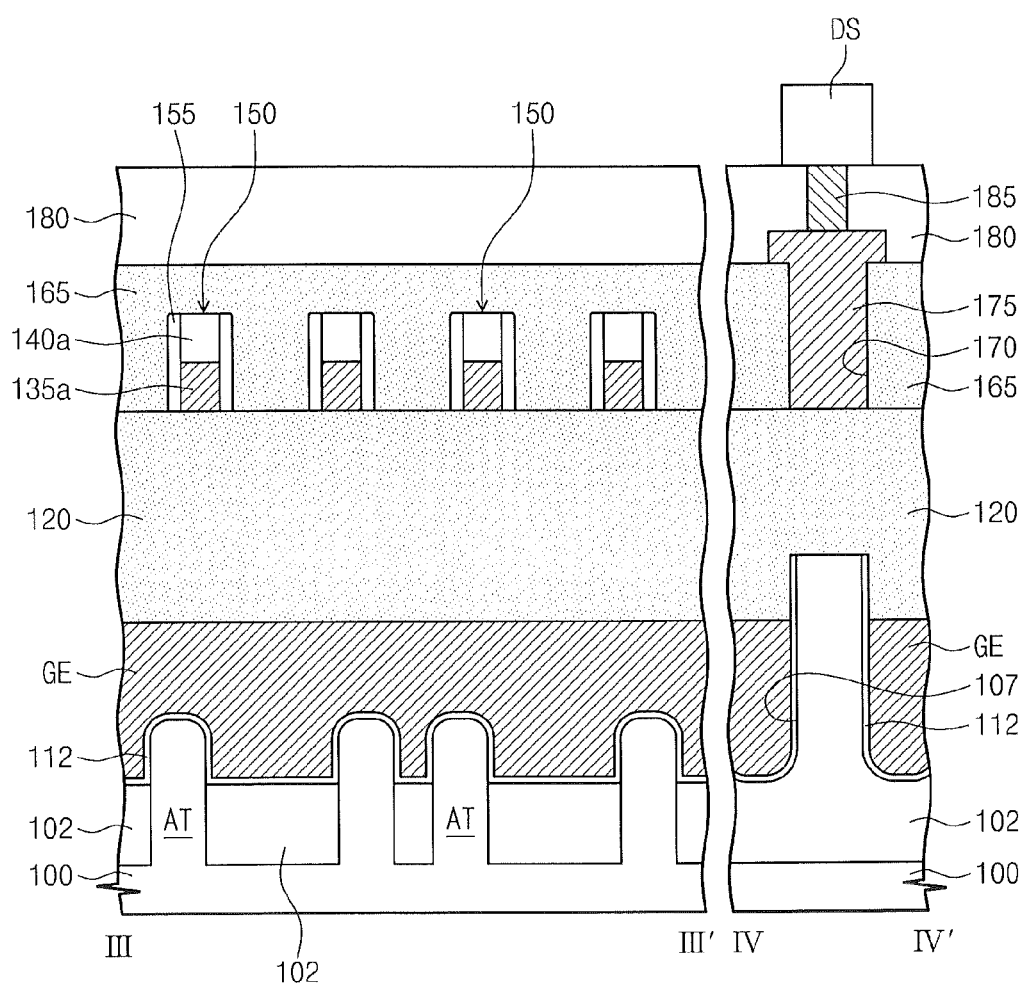
FIG. 12C is a cross-sectional view taken along lines III-III' and IV-IV' of FIG. 12A.

Thereafter, subsequent processes will be described with reference to FIGS. 12A, 12B, and 12C. Referring to FIGS. 12A, 12B, and 12C, the filling pillars 160 may be removed to expose the hard mask segments 105a on the second source/drain regions SD2 and then the exposed hard mask segments 105a may be etched to form buried contact holes 170 exposing the second source/drain regions SD2, respectively. The filling pillars 160 may be removed by an anisotropic etching process and/or an isotropic etching process.

The hard mask segments 105a under the filling pillars 160 may be removed by an anisotropic etching process. An insulating pattern 105b may be formed under the wire pattern 150 by the formation of the buried contact holes 170. The insulating pattern 105b corresponds to a remaining portion of the hard mask segment under the wire pattern 150 after the formation of the buried contact holes 170.

Next, buried contact plugs 175 may be formed to fill the buried contact holes 170, respectively. The buried contact plugs 175 may be connected to the second source/drain regions SD2, respectively. In some embodiments, a buried contact conductive layer may be formed to fill the buried contact holes 170 and then the buried contact conductive layer may be patterned to form the buried contact plugs 175. Thus, each of the buried contact plugs 175 may include a contact part disposed in the buried contact hole 170 and a pad part extending from the contact part outside the buried contact hole 170. The buried contact plugs 175 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

Subsequently, an interlayer insulating layer 180 may be formed on an entire surface of the substrate 100 and then conductive plugs 185 may be formed to penetrate the interlayer insulating layer 180. The conductive plugs 185 may be connected to the buried contact plugs 175, respectively. Data storage parts DS may be formed on the interlayer insulating layer 180. The data storage parts DS may be connected to the conductive plugs 185, respectively. Each of the data storage parts DS may be electrically connected to each of the second source/drain regions SD2 through the conductive plug 185 and the buried contact plug 175. The data storage part DS may have one of various shapes. The data storage part DS will be described in more detail later.

According to the method of manufacturing the semiconductor device described above, after the gate grooves 107 are formed using the hard mask lines 105, portions of the hard mask lines 105 and the center portions of the active portions AT may be etched. Thus, the aspect ratios of the gate grooves 107 may be reduced, and the recess region RR having the wide width may be formed on the gate grooves 107. As a result, it is possible to increase the process margin of the recess process of the gate conductive layer 115 for the formation of the gate electrodes GE. Thus, highly integrated semiconductor devices having excellent reliability may be realized.

Additionally, if the source/drain regions SD1 and SD2 are formed after the formation of the gate electrodes GE, the tilt implantation of the dopants for the source/drain regions SD1 and SD2 may be easily performed.

Next, the semiconductor device according to the present embodiment will be mentioned with reference to FIGS. 12A, 12B, and 12C. For the purpose of ease and convenience in explanation, the aforementioned descriptions will be omitted or mentioned briefly.

FIG. 12A is a plan view illustrating a semiconductor device according to some embodiments of the inventive concept. FIG. 12B is a cross-sectional view taken along lines I-I' and II-II' of FIG. 12A. FIG. 12C is a cross-sectional view taken along lines III-III' and IV-IV' of FIG. 12A.

Referring to FIGS. 12A, 12B, and 12C, a device isolation pattern 102 may be formed on/in a substrate 100 to define active portions AT. The active portions AT may be arranged as described with reference to FIGS. 1A, 1B, and 1C.

Gate grooves 107 may be formed in the active portions AT and the device isolation pattern 102. The gate grooves 107 may extend in parallel in a first direction D1. A pair of gate grooves 107 may be formed in each of the cell active portion AT. A top surface of a center portion A1 of the active portion AT between the pair of gate grooves 107 is lower than top surfaces of both edge portions A2 of the active portion AT. The pair of gate grooves 107 may be disposed between the both edge portions A2 of the active portion AT. In other words, each gate groove 107 may be disposed between the center portion A1 and each edge portion A2 of the active portion AT Gate electrodes GE are disposed in the gate grooves 107, respectively. A top surface of the gate electrode GE is lower than the top surface of the center portion A1 of the active portion AT. A gate insulating layer 112 may be disposed between the gate electrode GE and an inner surface of the gate groove 107. As illustrated in FIGS. 12B and 12C, a bottom surface of the gate groove 107 may include a first portion formed of the active portion AT and a second portion formed of the device isolation pattern 102. At this time, the second portion of the bottom surface of the gate groove 107 may be lower than the first portion of the bottom surface of the gate groove 107. Thus, the active portion AT under the gate groove 107 may have a fin-shape, and the gate electrode GE may cover both sidewalls of the active portion AT of the fin-shape. As a result, a channel region controlled by the gate electrode GE may have an increased channel length in a limited area due to both inner sidewalls of the gate groove 107, and the channel region may have an increased channel width in the limited area due to the active portion AT having the fin-shape under the gate groove 107.

A first source/drain region SD1 may be formed in the center portion A1 of each of the active portions AT, and a pair of source/drain regions SD2 may be formed in the both edge portions A2 of each of the active regions AT, respectively. Thus, the first source/drain region SD1 and the second source/drain region SD2 may be disposed at both sides of each of the gate electrodes GE. A top surface of the first source/drain region SD1 is lower than a top surface of the second source/drain region SD2 due to the shapes of the center portion A1 and the edge portion A2 of the active portion AT. Bottom surfaces of the first and second source/drain regions SD1 and SD2 may be disposed at substantially the same level.

A gate capping pattern 120 may fill each gate groove 107 on each gate electrode GE. The gate capping patterns 120 on the gate electrodes GE may extend outside the gate grooves 107. The extending portions of the gate capping patterns 120 are connected to each other without an interface therebetween. The connected portion of the extending portions of the gate capping patterns 120 may be disposed on the device isolation pattern 102 between the gate grooves 107. At this time, a top surface of the device isolation pattern 102 under the connected portion of the extending portions of the gate capping patterns 120 may be disposed at a level substantially equal to or lower than the top surface of the center portion A1 of the active portion AT.

The extending portions of the gate capping patterns 120 are connected to each other without the interface therebetween, thereby constituting one united body. The extending portions connected to each other of the gate capping patterns 120 are defined as one united body extension. As illustrated in FIGS. 12A and 12B, the one united body extension of the gate capping patterns 120 may define openings 125 that expose the first source/drain regions SD1, respectively. In other words, an inner sidewall of the opening 125 may be formed of the one united body extension of the gate capping patterns 120. The openings 125 may be completely separated from each other. The gate capping patterns 120 having the one united body extension are illustrated in more detail in FIGS. 8A, 8B, and 8C. Each of the openings 125 may have a hole-shape. As illustrated in FIG. 12B, a top end of the one united body extension of the gate capping patterns 120 is higher than the top surface of the edge portion A2 of the active portion AT.

As illustrated in FIG. 12B, a width of the extending portion of the gate capping pattern 120 may be less than a width of a capping portion of the gate capping pattern 120. The capping portion of the gate capping pattern 120 is disposed in the gate groove 107 to cover the gate electrode GE.

Wire patterns 150 may cross over the gate electrodes GE. The wire patterns 150 may extend in parallel in a second direction D2. Each of the wire patterns 150 may be electrically connected to the first source/drain regions SD1 arranged in a line in the second direction D2. In more detail, the wire pattern 150 may include a conductive wire 135*a* extending in the second direction D2 and a wire capping pattern 140*a* on the conductive wire 135*a*. The conductive wire 135*a* may be electrically connected to the first source/drain regions SD1. Each of the wire patterns 150 may further include a plurality of contact patterns 130*a*. The contact patterns 130*a* of each wire pattern 150 may be disposed in the openings 125 arranged in the second direction D2 to be electrically connected to the first source/drain regions SD1, respectively. The conductive wire 135*a* is disposed on the contact patterns 130*a* arranged in the second direction D2. The conductive pattern 135*a* may be electrically connected to the first source/drain regions SD1 through the contact patterns 130*a*. The contact pattern 130*a* has both sidewalls aligned with both sidewalls of the conductive wire 135*a*, respectively. In some embodiments, a width of the contact pattern 130*a* in the first direction D1 may be less than a width of the opening 125 in the first direction D1.

Insulating patterns 105*b* may be disposed between each wire pattern 150 and the substrate 100. The insulating patterns 105*b* may be disposed on the device isolation pattern 102. Each of the insulating patterns 105*b* is disposed between the contact patterns 130*a* adjacent to each other. The insulating patterns 105*b* under each wire pattern 150 and the contact patterns 130*a* of each wire pattern 150 may be alternately arranged in the second direction D2.

As illustrated in FIG. 12B, the extending portion (i.e., the portion defining the opening 125) of the gate capping pattern 120 may be disposed between the insulating pattern 105*b* and the contact pattern 130*a* adjacent to each other. A top surface of the insulating pattern 105*b* may be disposed at substantially the same level as a top end of the extending portion of the gate capping pattern 120.

A top surface of the device isolation pattern 102 under the insulating pattern 105*b* is higher than the top surface of the device isolation pattern 102 under the one united body extension of the gate capping patterns 120. In some embodiments, the top surface of the device isolation pattern 102 under the insulating pattern 105*b* may be disposed at substantially the same level as the top surface of the edge portion A2 of the active portion AT.

Buried contact plugs 175 may be disposed between the wire patterns 150, so as to be connected to the second source/drain regions SD2, respectively. The buried contact plugs 175 are spaced apart from each other. An insulating spacer 155 is disposed between the sidewall of the wire pattern 150 and the buried contact plug 175. The insulating spacer 155 may extend along the wire pattern 150. In some embodiments, insulating fences 165 may cross the wire patterns 150. The insulating fences 165 may overlap with the gate electrodes GE, respectively. Each of the insulating fences 165 may be in contact with the gate capping pattern 120 on the gate electrode GE between the wire patterns 150. Thus, a buried contact hole 170 may be defined between the insulating fences 165 adjacent to each other and between the wire patterns 150 adjacent to each other. The buried contact plug 175 may be disposed in the buried contact hole 170 to be connected to the second source/drain region SD2. In some embodiments, the buried contact plug 175 may include a contact part disposed in the buried contact hole 170 and a pad part extending from the contact part outside the buried contact hole 170. However, the inventive concept is not limited thereto. In other embodiments, the buried contact plug 175 may be confinedly disposed in the buried contact hole 170.

An interlayer insulating layer 180 may cover the wire patterns 150, the insulating fences 165, and the buried contact plugs 175. Conductive plugs 185 may penetrate the interlayer insulating layer 180 to be connected to the buried contact plugs 175, respectively. Data storage parts DS may be disposed on the interlayer insulating layer 180 so as to be connected to the conductive plugs 185, respectively. The data storage part DS may be electrically connected to the second source/drain region SD2 through the conductive plug 185 and the buried contact plug 175.

In some embodiments, the conductive plugs 185 may be omitted. In this case, the interlayer insulating layer 180 may be planarized until the pad parts of the buried contact plugs 175 are exposed, and the data storage parts DS may be in direct contact with the pad parts of the buried contact plugs 175.

The data storage part DS may be one of various shapes. Examples of the data storage part DS will be described with reference to FIGS. 13A and 13B.

Figure 13A:
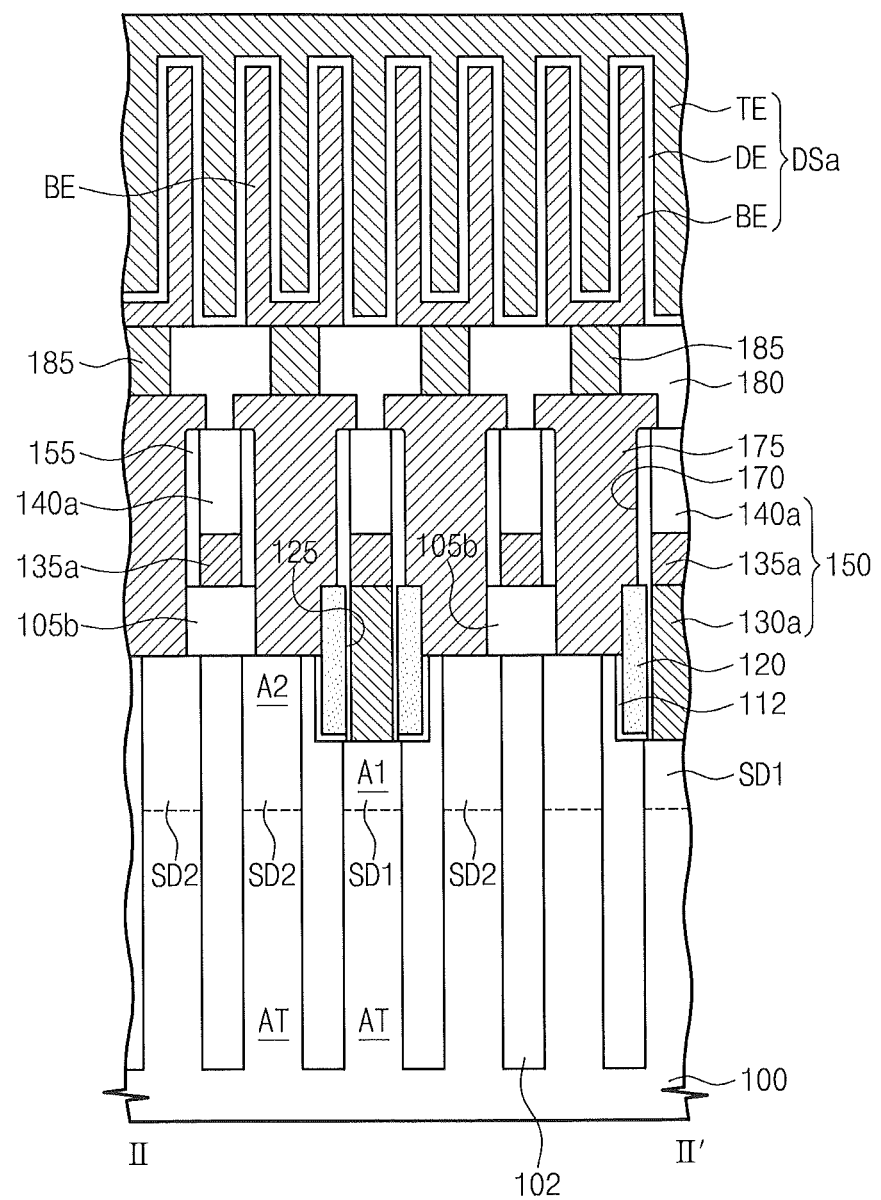
FIG. 13A is a cross-sectional view taken along a line II-II' of FIG. 12A to illustrate an example of data storage parts included in semiconductor devices according to embodiments of the inventive concept.

FIG. 13A is a cross-sectional view taken along a line II-II' of FIG. 12A to illustrate an example of data storage parts included in semiconductor devices according to embodiments of the inventive concept.

Referring to FIG. 13A, a data storage part DSa according to the present example may be realized as a capacitor. For example, the data storage part DSa may include a lower electrode BE, an upper electrode TE, and a capacitor dielectric layer DE disposed between the lower and upper electrodes BE and TE. A plurality of the lower electrodes BE may be connected to the conductive plugs 185, respectively. The upper electrode TE may cover surfaces of the plurality of lower electrodes BE with the capacitor dielectric layer DE therebetween. In some embodiments, the lower electrode BE may have a hollow cylindrical shape.

In the present example, the conductive wire 135a of the wire pattern 150 may correspond to a bit line.

Figure 13B:
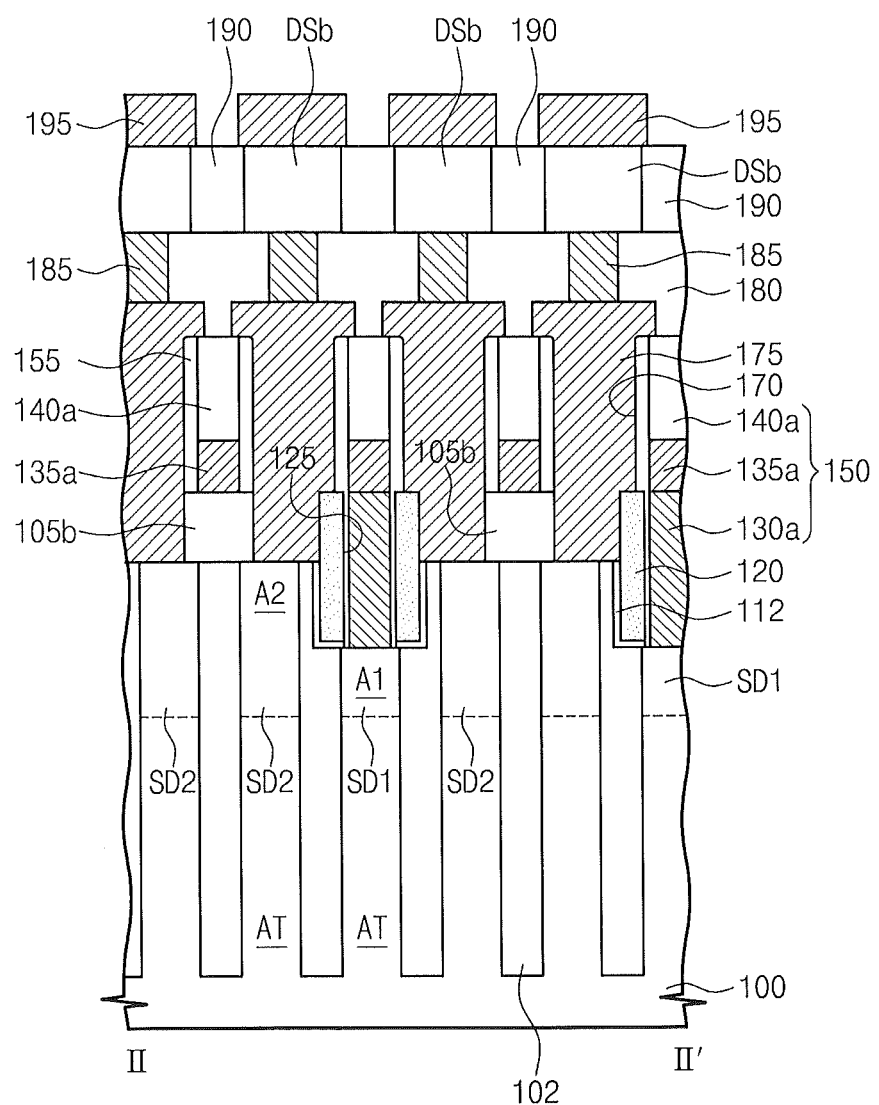
FIG. 13B is a cross-sectional view taken along a line II-II' of FIG. 12A to illustrate another example of data storage parts included in semiconductor devices according to embodiments of the inventive concept.
Figure 14A:
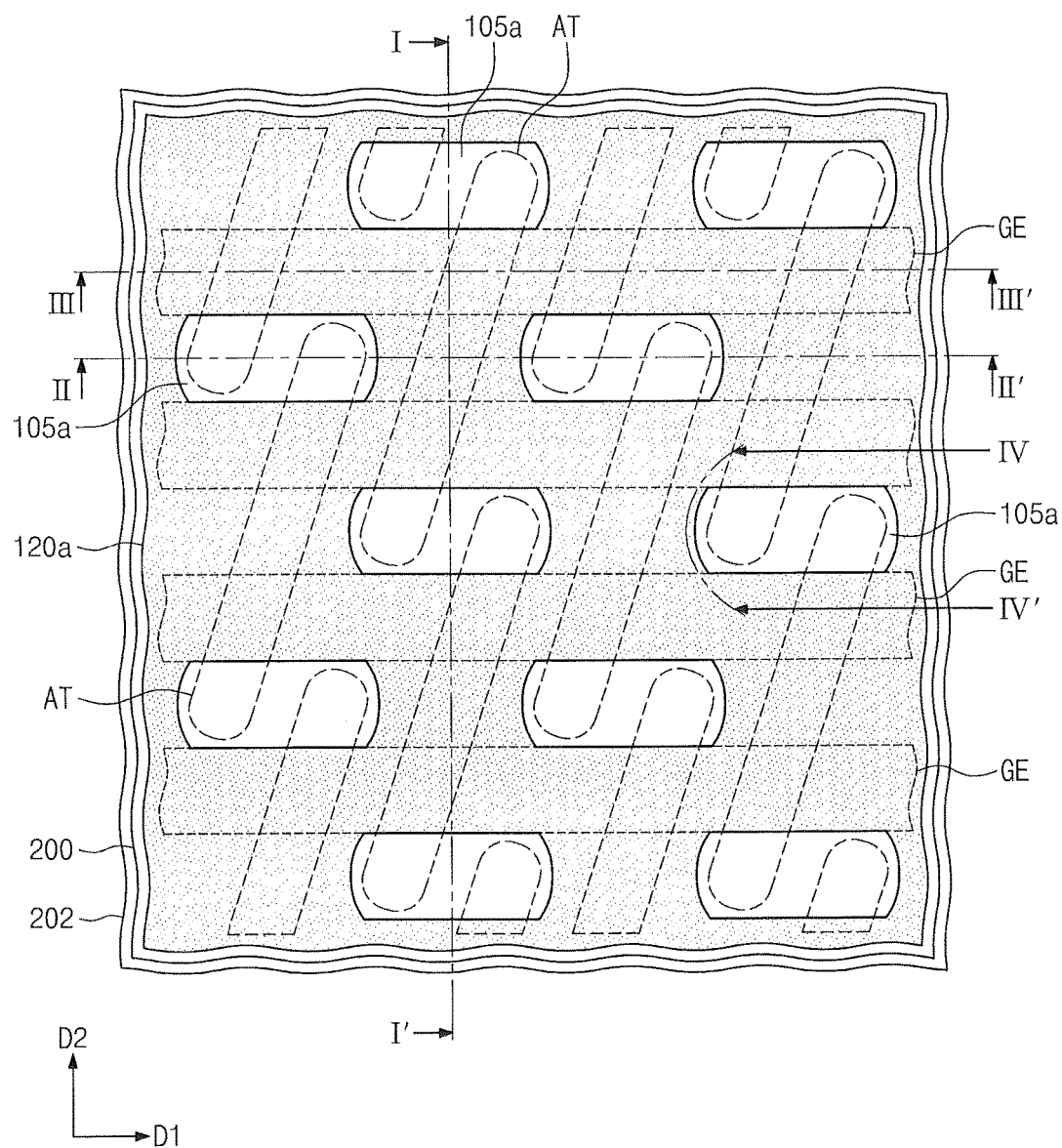
Figure 14B:
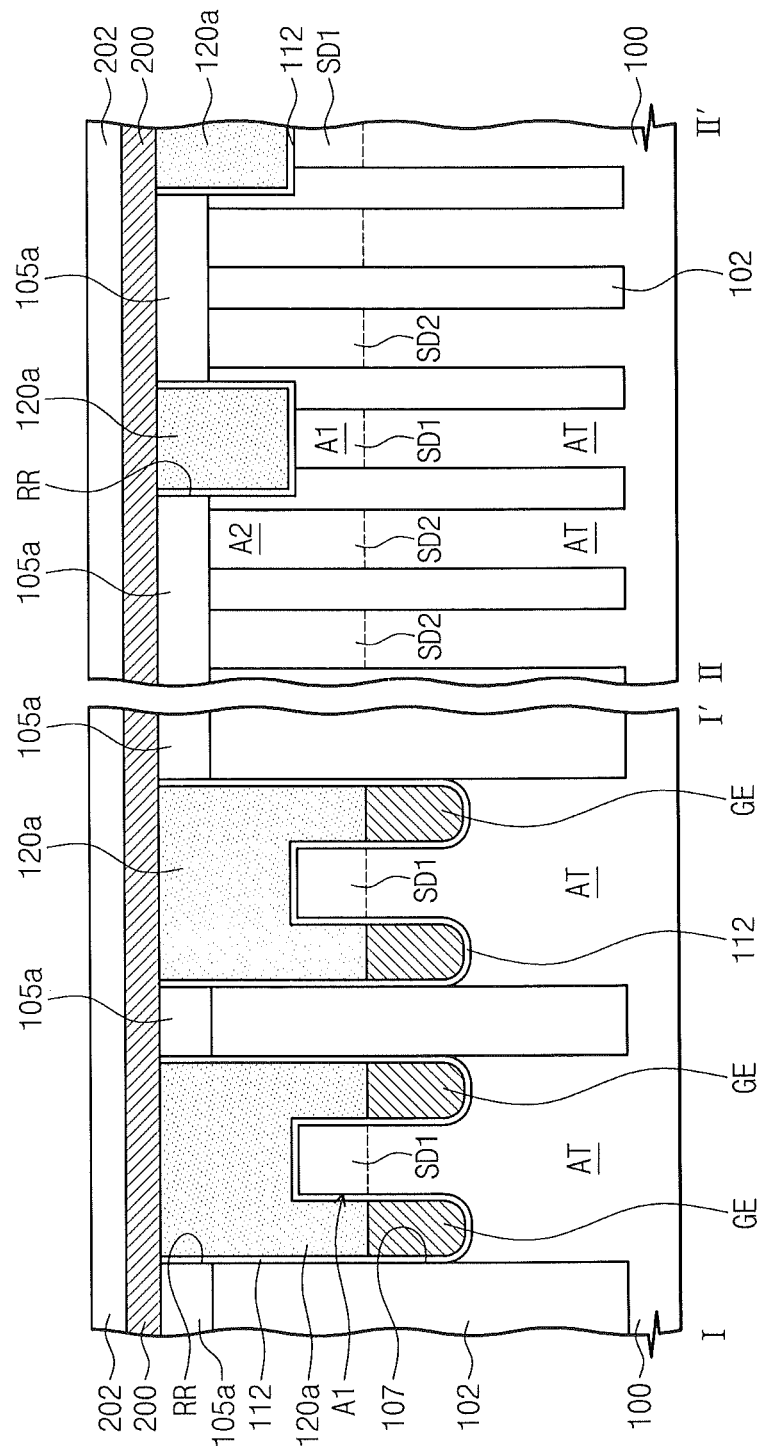
Figure 14C:
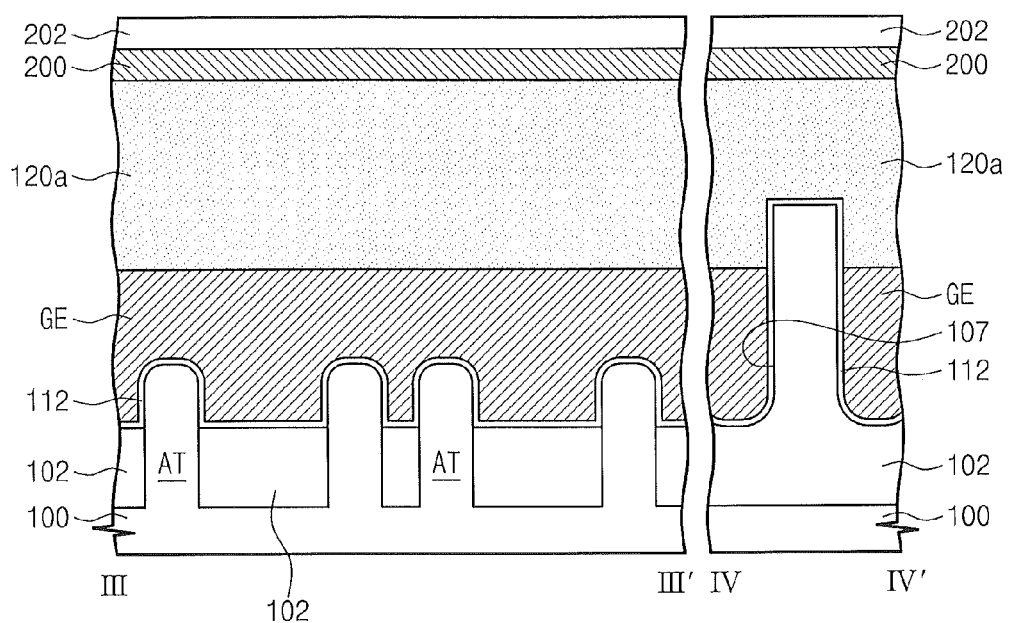

FIG. 13B is a cross-sectional view taken along a line II-II' of FIG. 12A to illustrate another example of data storage parts included in semiconductor devices according to embodiments of the inventive concept.

Referring to FIG. 13B, a data storage part DSb according to the present example may include a variable resistor. The variable resistor may be changed into one of states having different resistance values from each other by a program operation.

In some embodiments, the variable resistor may include a magnetic tunnel junction (MTJ) pattern using magnetization directions. The MTJ pattern may include a reference magnetic pattern, a free magnetic pattern, and a tunnel barrier layer disposed between the reference and free magnetic patterns. The reference magnetic pattern may have a magnetization direction fixed in one direction. The free magnetic pattern may have a reversible magnetization direction. In other words, the magnetization direction of the free magnetic pattern may be changed into a direction parallel or anti-parallel to the fixed magnetization direction of the reference magnetic pattern by a program operation. The magnetization directions of the reference and free magnetic patterns may be perpendicular or parallel to one surface of the free magnetic pattern which is in contact with the tunnel barrier layer.

In other embodiments, the variable resistor may include a phase change material. The phase change material may be converted into an amorphous state or a crystalline state according to a temperature and/or a supply time of heat supplied by a program operation. The amorphous phase change material may have a resistance value greater than that of the crystalline phase change material. For example, the phase change material may be a compound including at least one of chalcogenide elements (e.g., tellurium (Te) and selenium (Se)).

In still other embodiments, the variable resistor may include a transition metal oxide. Due to a program operation, an electrical path may be generated in the transition metal oxide or the electrical path in the transition metal oxide may disappear. If the electrical path is generated, the transition metal oxide has a low resistance value. If the electrical path disappears, the transition metal oxide has a high resistance value.

An upper interlayer insulating layer 190 may fill a space between the data storage parts DSb including the variable resistors. Upper wires 195 may be connected to the data storage parts DSb. The upper wires 195 may cross over the gate electrodes GE of FIGS. 12A to 12C. In the present example, the upper wires 195 may correspond to bit lines, and the conductive wires 135a of the wire patterns 150 may correspond to source lines.

Second Embodiment

In the present embodiment, the same elements as described in the aforementioned embodiment will be indicated by the same reference numerals or the same reference designators. For the purpose of ease and convenience in explanation, the descriptions to the same elements as in the aforementioned embodiment will be omitted or mentioned briefly. That is, differences between the present embodiment and the aforementioned embodiment will be mainly described hereinafter.

FIGS. 14A to 18A are plan views illustrating a method of manufacturing a semiconductor device according to other embodiments of the inventive concept. FIGS. 14B to 18B are cross-sectional views taken along lines I-I' and II-II' of FIGS. 14A to 18A, respectively. FIGS. 14C to 18C are cross-sectional views taken along lines III-III' and IV-IV' of FIGS. 14A to 18A, respectively. A method of manufacturing a semiconductor device according to the present embodiment may include the processes described with reference to FIGS. 1A to 7A, 1B to 7B, and 1C to 7C.

Referring to FIGS. 7A, 7B, 7C, 14A, 14B, and 14C, a gate capping insulating layer may be formed on the substrate 100 having the gate electrodes GE and the source/drain regions SD1 and SD2. At this time, the gate capping insulating layer may fully fill the recess region RR and the gate grooves 107 on the gate electrodes GE. Subsequently, the gate capping insulating layer may be planarized until the hard mask segments 105a are exposed. The planarized gate capping insulating layer 120a may fully fill the recess region RR and the gate grooves 107 on the gate electrodes GE. A top surface of the planarized gate capping insulating layer 120a may be substantially coplanar with the top surfaces of the hard mask segments 105a. The planarized gate capping insulating layer 120a may include a nitride (e.g., silicon nitride) and/or an oxynitride (e.g., silicon nitride).

A lower conductive layer 200 may be formed on an entire surface of the substrate 100. For example, the lower conductive layer 200 may include a semiconductor material doped with dopants (e.g., doped silicon). However, the inventive concept is not limited thereto. The lower conductive layer 200 may be formed of another conductive material.

A buffer hard mask layer 202 may be formed on the lower conductive layer 200. The buffer hard mask layer 202 may be formed of an oxide (e.g., silicon oxide).

Figure 15A:
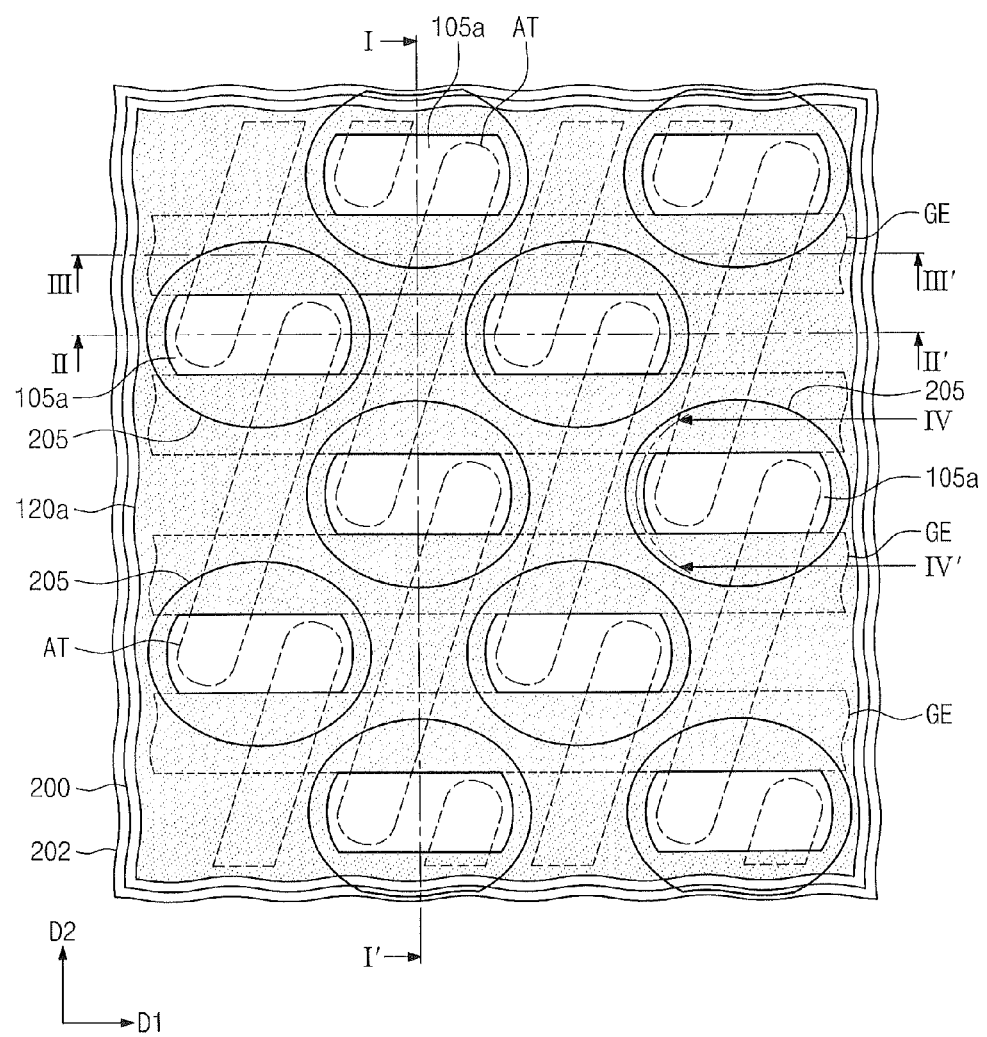
Figure 15B:
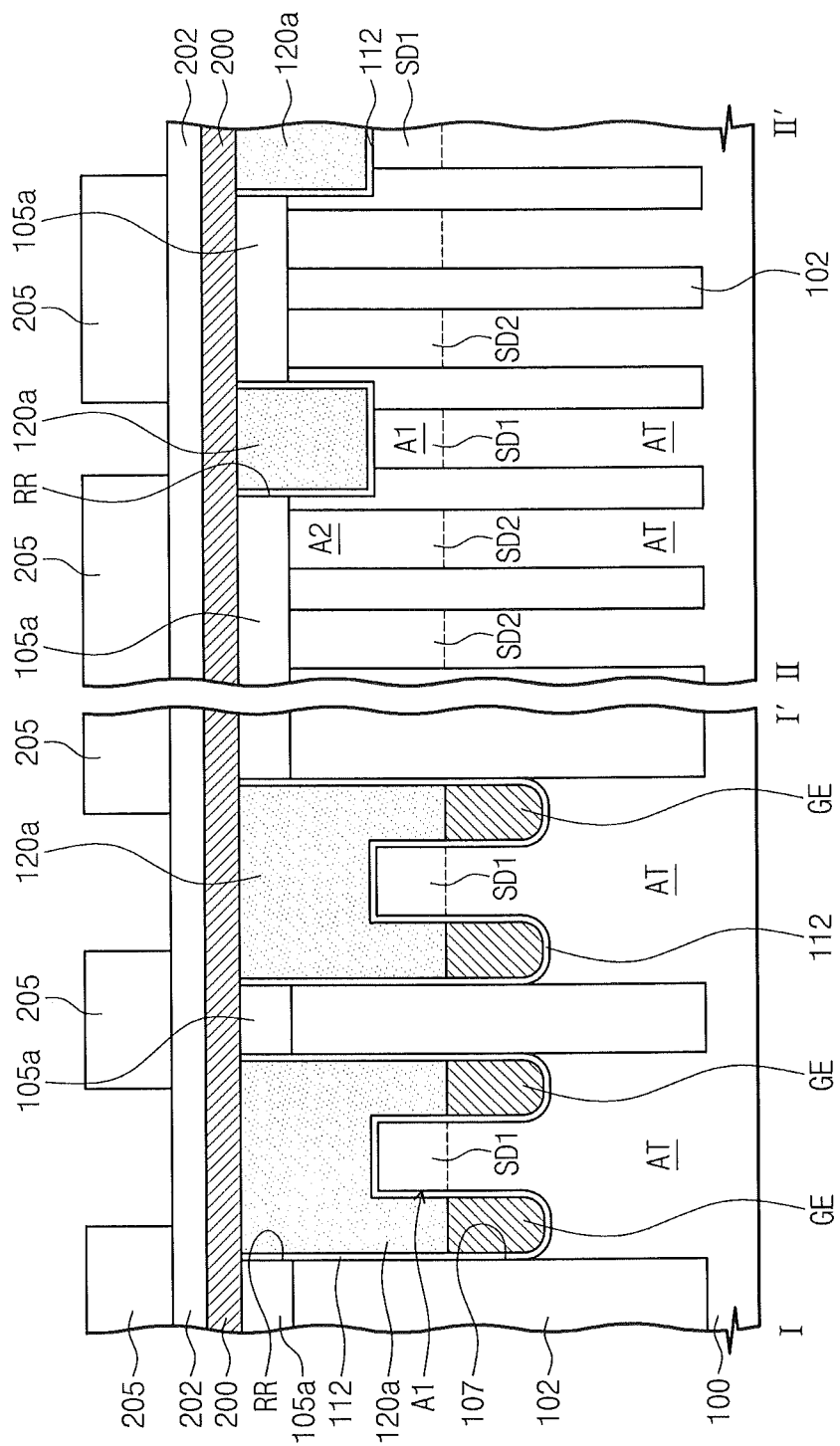
Figure 15C:
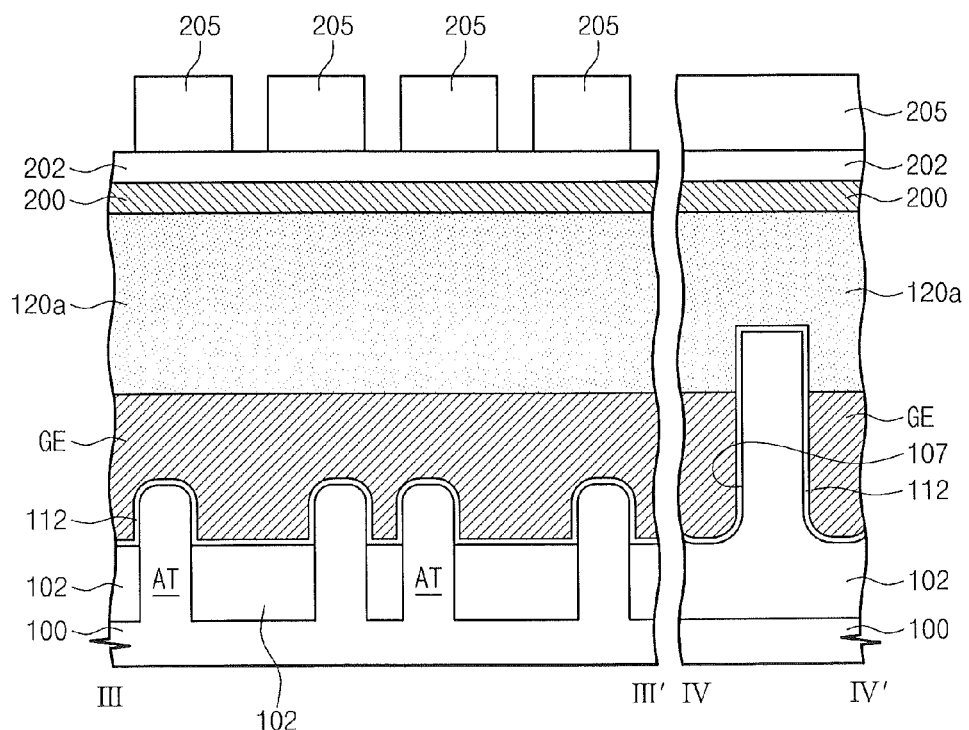

Referring to FIGS. 15A, 15B, and 15C, mask patterns 205 may be formed on the buffer hard mask layer 202. The mask patterns 205 cover the hard mask segments 105a, respectively. At this times, the mask patterns 205 do not cover the center portions A1 including the first source/drain regions SD1 of the active portions AT. The mask patterns 205 may have island-shapes spaced apart from each other.

In the first direction D1, a first width of the mask pattern 205 may be greater than a first width of the hard mask segment 105a. Likewise, a second width of the mask pattern 205 may be greater than a second width of the hard mask segment 105a in the second direction D2. Thus, the mask pattern 205 may further cover a portion of the planarized gate capping insulating layer 120a surrounding the hard mask segment 105a.

As illustrated in FIG. 15A, a distance between the mask patterns 205 on the gate electrode GE may be less than a distance between the mask patterns 205 which are disposed directly at both sides of the center portion A1 of the active portion AT, respectively.

The mask patterns 205 may include silicon oxide formed by a spin coating method, a plasma silicon oxide, and/or a photoresist.

Figure 16A:
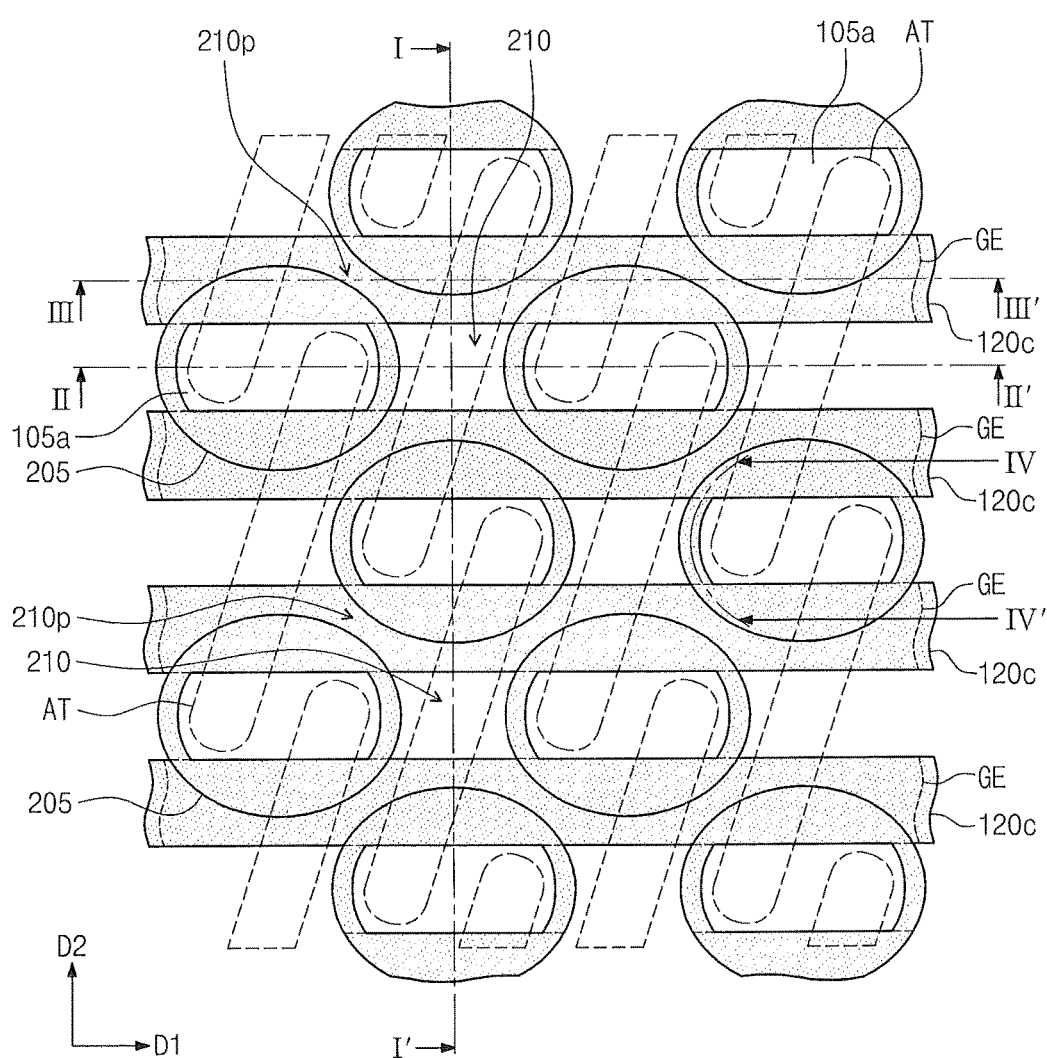
Figure 16B:
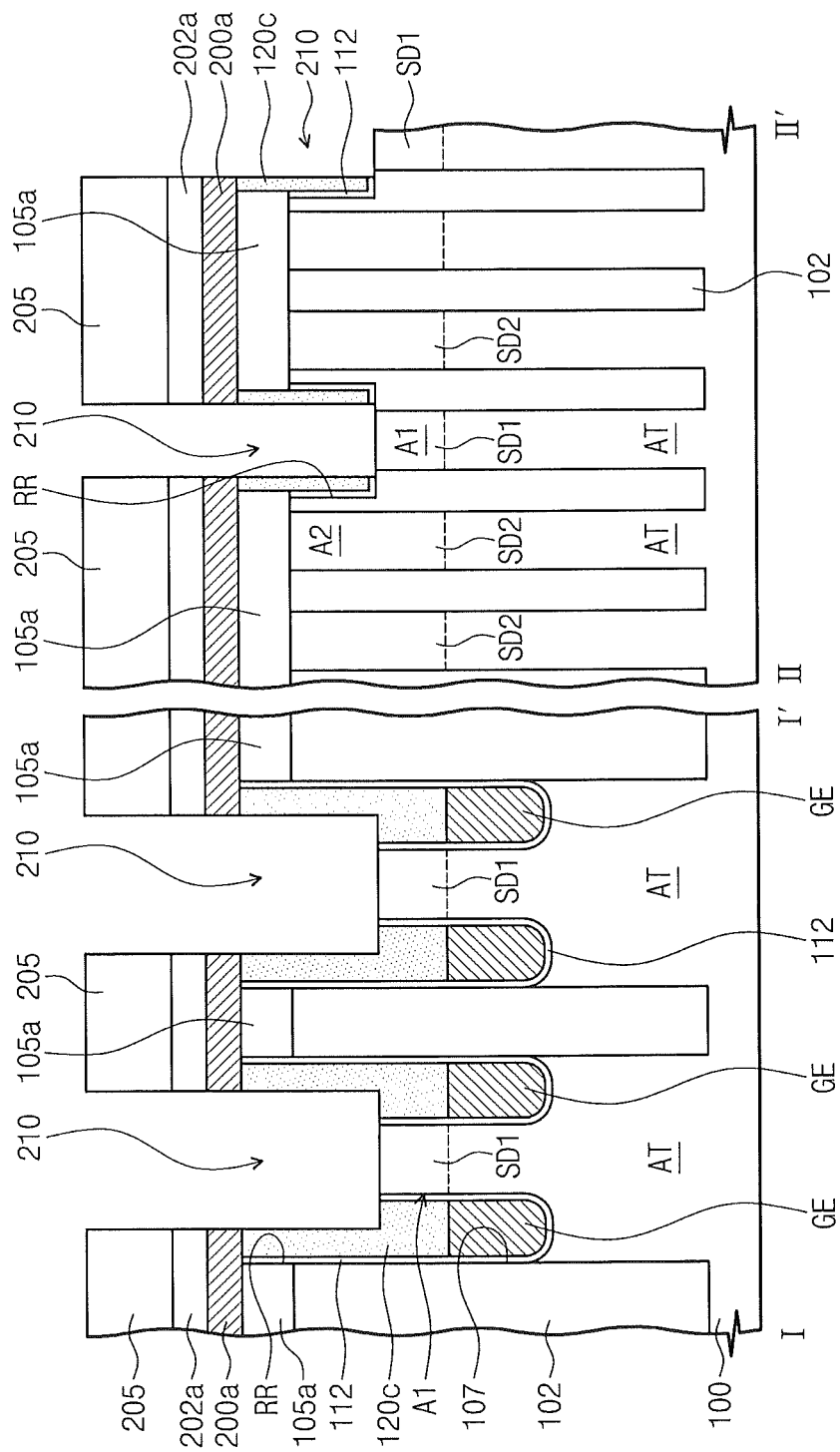
Figure 16C:
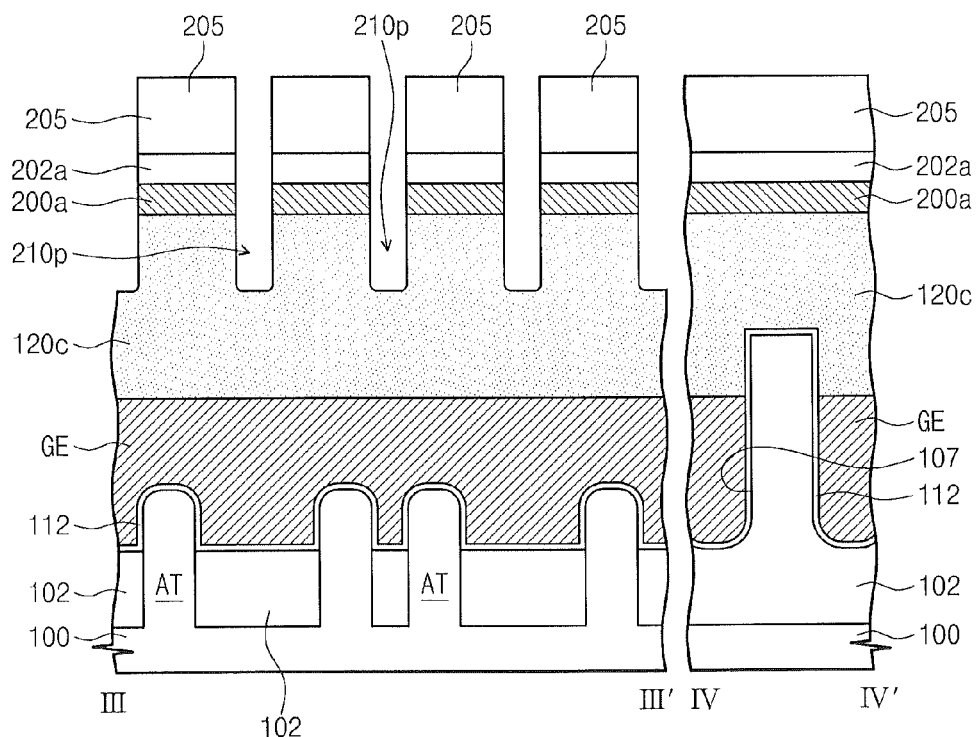

Referring to FIGS. 16A, 16B, and 16C, the buffer hard mask layer 202, the lower conductive layer 200, and the planarized gate capping insulating layer 120a may be successively etched using the mask patterns 205 as etch masks to form openings 210 exposing the recessed center portions A1 (i.e., the first source/drain regions SD1) of the active portions AT, respectively. Additionally, gate capping patterns 120c may be formed on the gate electrodes GE. At this time, concave regions 210p may be formed in the gate capping pattern 120c on each gate electrode GE due to the mask patterns 205 completely spaced apart from each other. The openings 210 may be connected to each other through the concave regions 210p.

A width of the concave region 210p may be less than a minimum width of the opening 210. Thus, a depth of the concave region 210p may be less than a depth of the opening 210 by a loading effect of the etching process using the mask patterns 205. In other words, a bottom end of the concave region 210p may be higher than a bottom end of the opening 210.

The openings 210, the concave regions 210p and the gate capping patterns 120c may be formed at substantially the same time. The gate capping patterns 120c fill the gate grooves 107 on the gate electrodes GE, respectively. Additionally, the gate capping patterns 120c extend outside the gate grooves 107 so as to be connected to each other without an interface therebetween. The connected extending portions of the gate capping patterns 120c constitute one united body extension. The one united body extension of the gate capping patterns 120c defines the openings 210 and the concave regions 210p. In other words, the openings 210 and the concave regions 210p may be formed in the one united body extension of the gate capping patterns 120c. The one united body extension of the gate capping patterns 120c surrounds sidewalls of the hard mask segments 105a under the mask patterns 205. As illustrated in FIGS. 15A to 15C and 16A to 16C, the gate capping patterns 120c correspond to portions of the planarized gate capping insulating layer 120a.

Moreover, a lower conductive pattern 200a and a buffer hard mask pattern 202a may be formed under each of the mask patterns 205 by the etching process using the mask patterns 205. Due to the shape of the mask pattern 205, the lower conductive pattern 200a and the buffer hard mask pattern 202a may have isolated shapes.

Figure 17A:
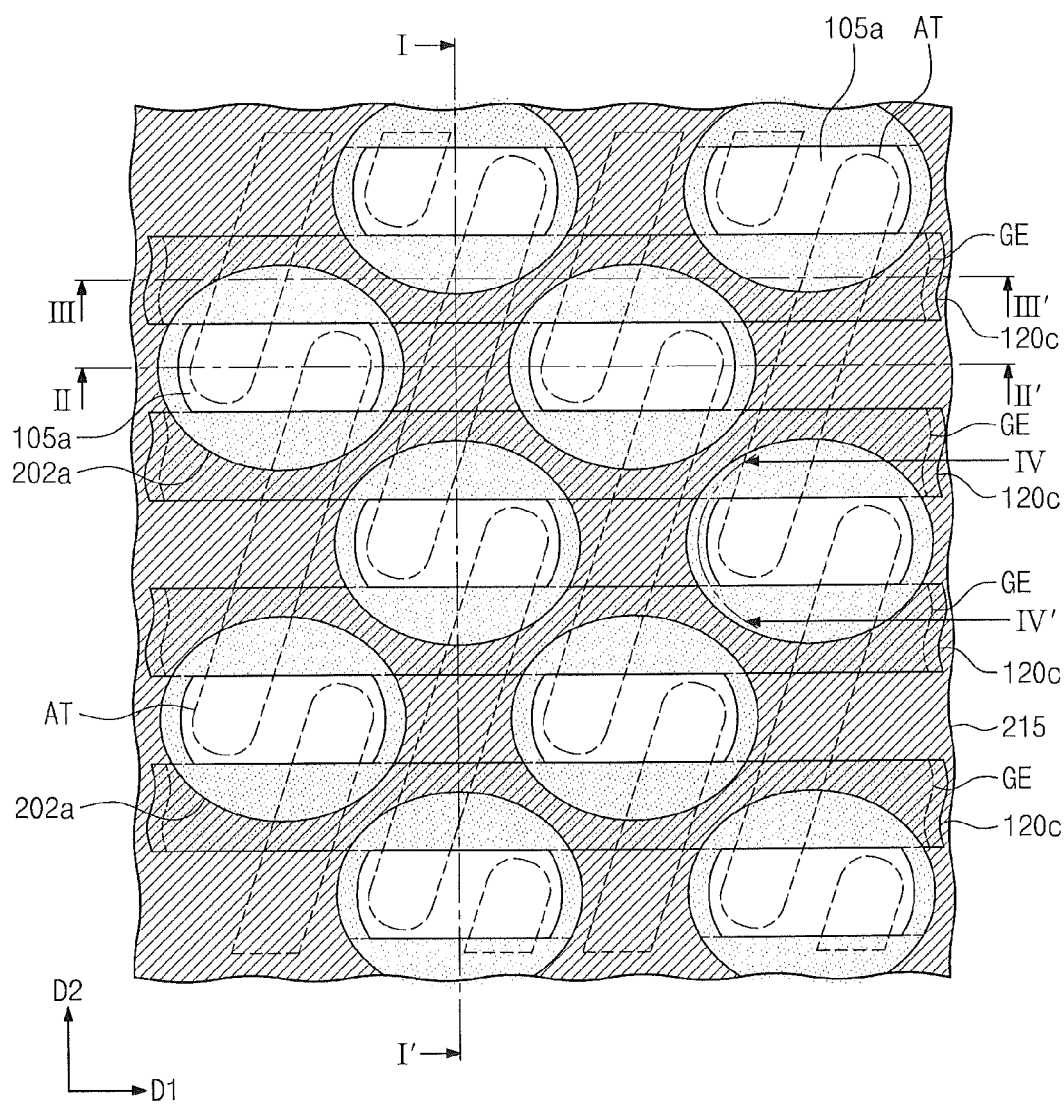
Figure 17B:
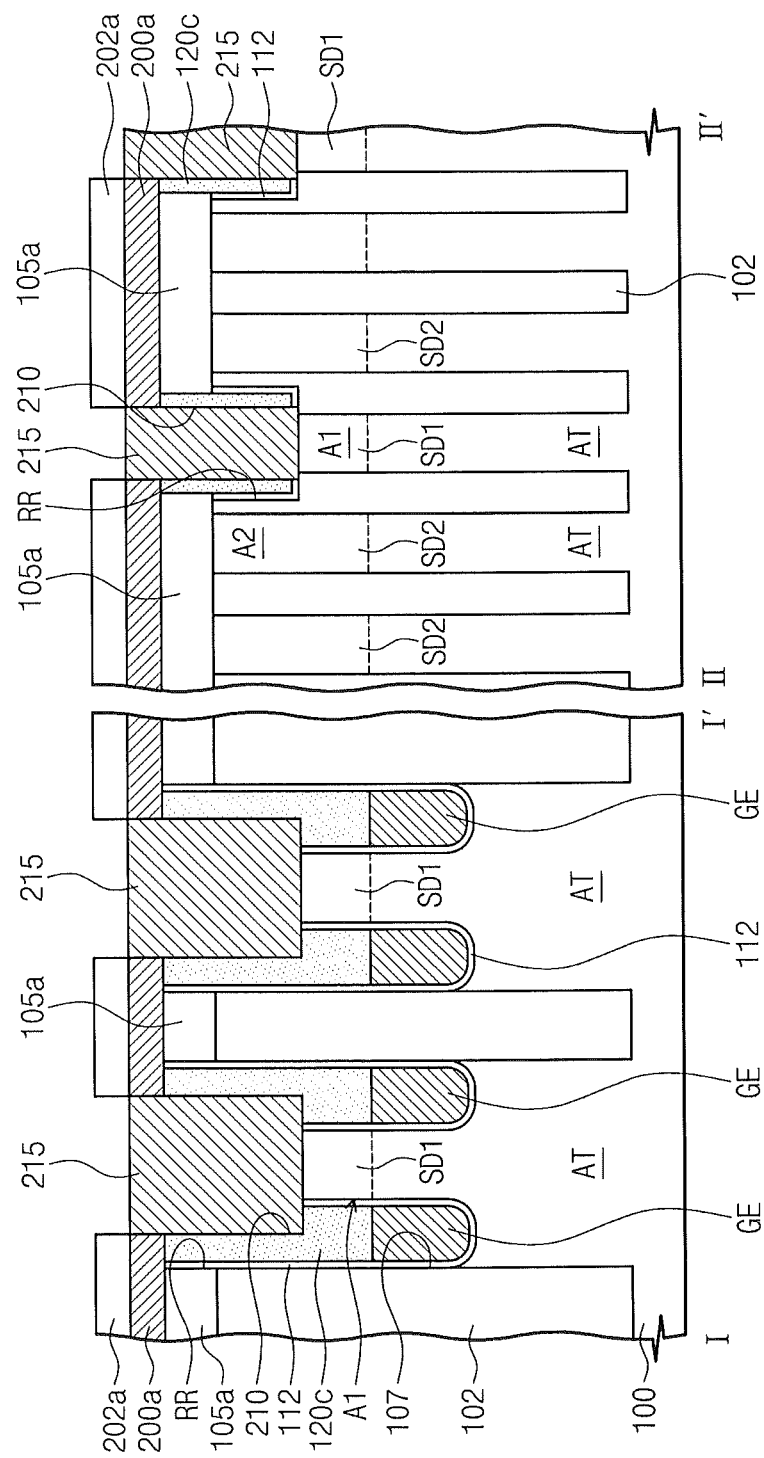
Figure 17C:
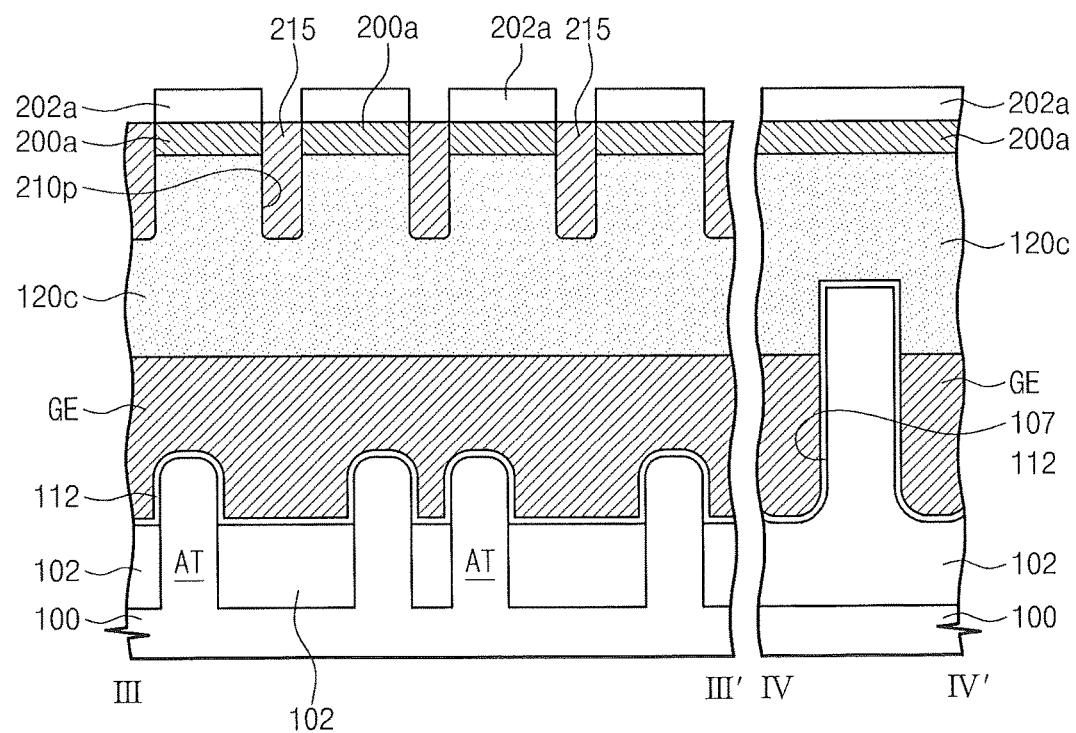

Referring to FIGS. 17A, 17B, and 17C, the mask patterns 205 may be removed to expose the buffer hard mask patterns 202a. Subsequently, a contact conductive layer may be formed on the substrate 100 to fill the openings 210 and the concave regions 210p. The contact conductive layer may be etched until the buffer hard mask patterns 202 are exposed. As illustrated in FIGS. 17B and 17C, a top surface of the planarized contact conductive layer 215 may be lower than top surfaces of the buffer hard mask patterns 202a. The planarized contact conductive layer 215 may be connected to the first source/drain regions SD1. The planarized contact conductive layer 215 may be in contact with sidewalls of the lower conductive patterns 200a. The planarized contact conductive layer 215 may be formed of a doped semiconductor material (e.g., doped silicon). However, the inventive concept is not limited thereto. The planarized contact conductive layer 215 may be formed of another conductive material.

Figure 18A:
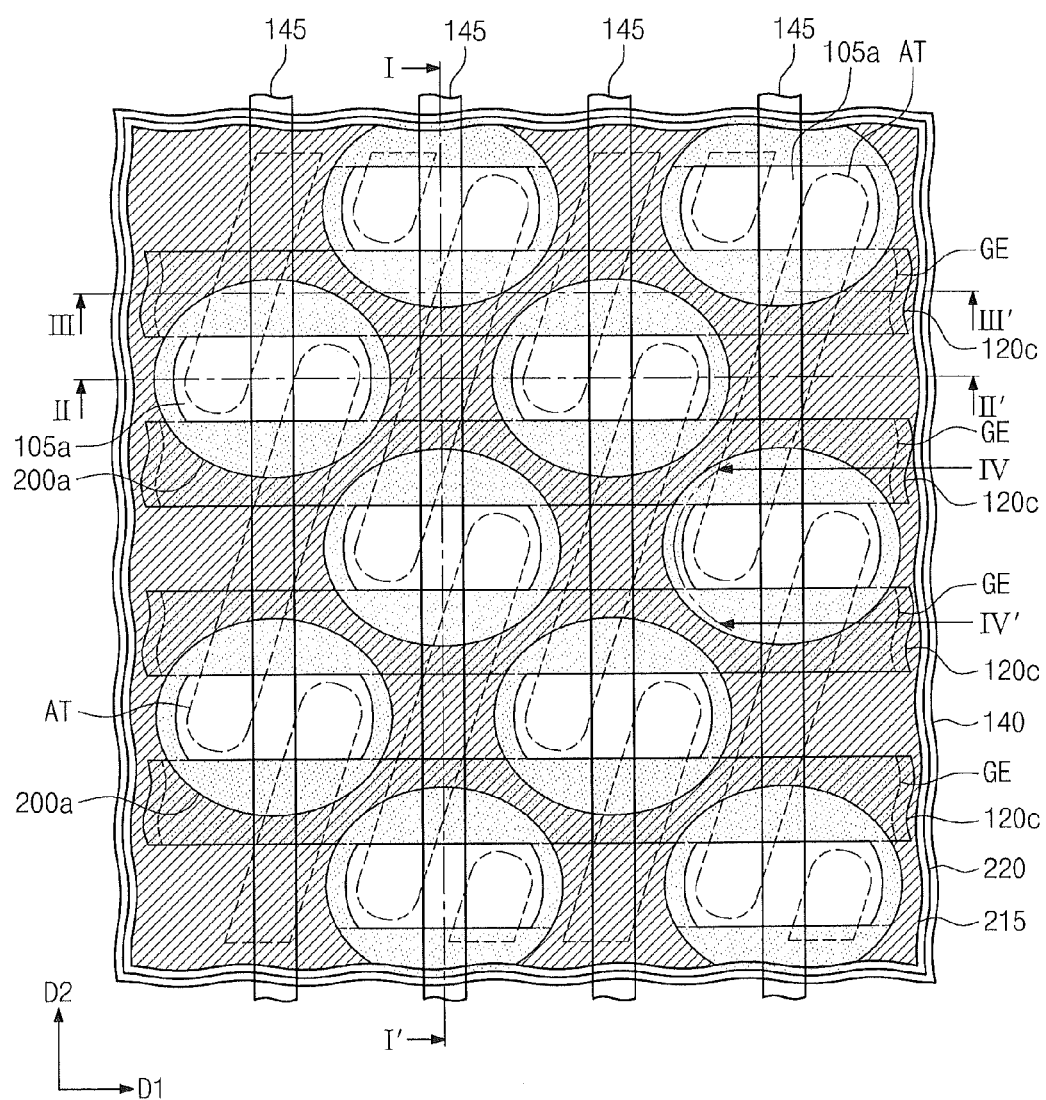
Figure 18B:
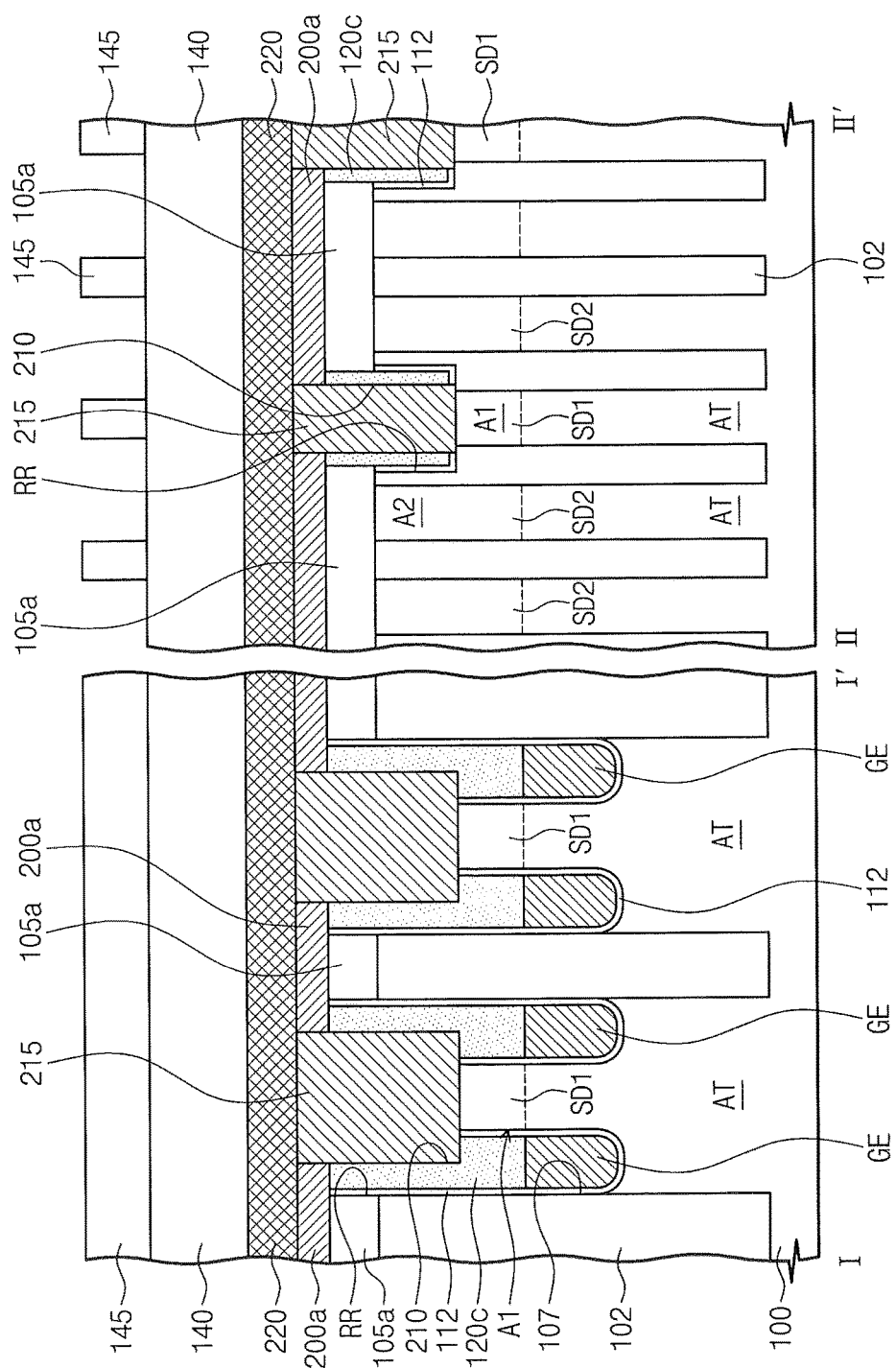
Figure 18C:
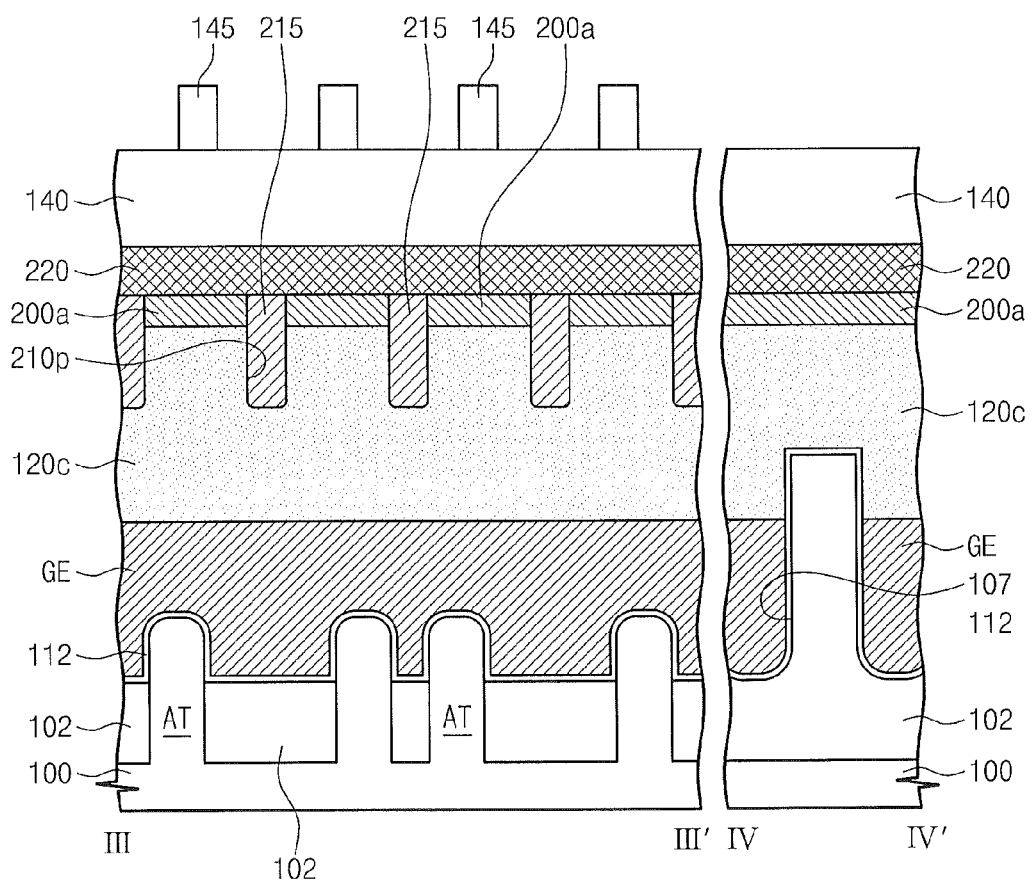

Referring to FIGS. 18A, 18B, and 18C, the buffer hard mask patterns 202a may be removed to expose the lower conductive patterns 200a. The top surface of the planarized contact conductive layer 215 may be substantially coplanar with top surfaces of the lower conductive patterns 200a.

An upper conductive layer 220 may be formed on the lower conductive patterns 220a and the planarized contact conductive layer 215. The upper conductive layer 220 may be in contact with the lower conductive patterns 220a and the planarized contact conductive layer 215. The upper conductive layer 220 may include at least one of a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

A wire capping insulating layer 140 may be formed on the upper conductive layer 220. The wire capping insulating layer 140 may be formed of a nitride (e.g., silicon nitride) and/or an oxynitride (e.g., silicon oxynitride).

Wire mask patterns 145 may be formed on the wire capping insulating layer 140. The wire mask patterns 145 may extend in the second direction D2 to cross over the gate electrodes GE. Each of the wire mask patterns 145 may be disposed over first source/drain regions SD1 arranged in a line along the second direction D2. A width of the wire mask pattern 145 may be less than a width of the opening 210 in the first direction D1.

Figure 19A:
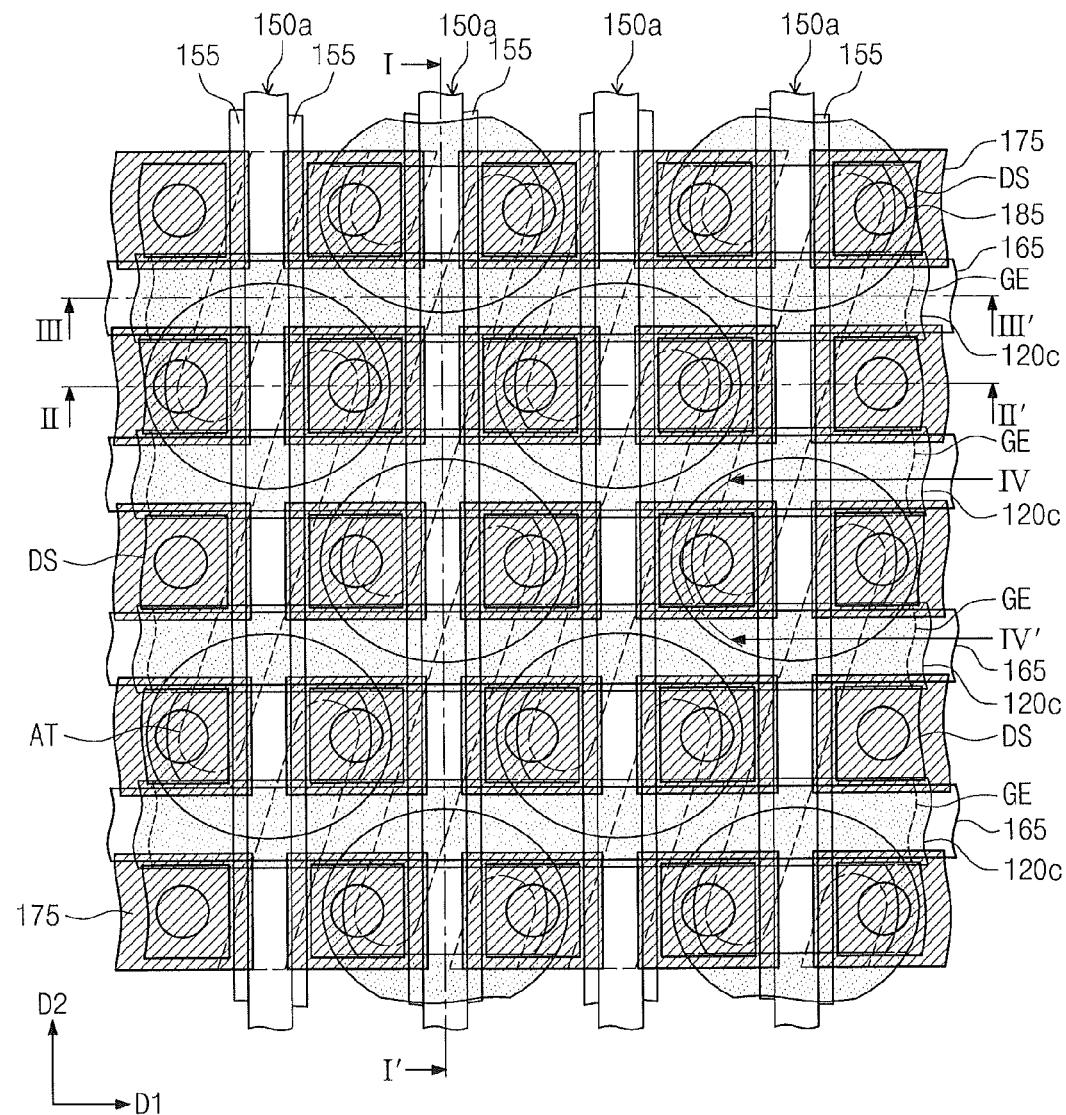
FIG. 19A is a plan view illustrating a semiconductor device according to other embodiments of the inventive concept.
Figure 19B:
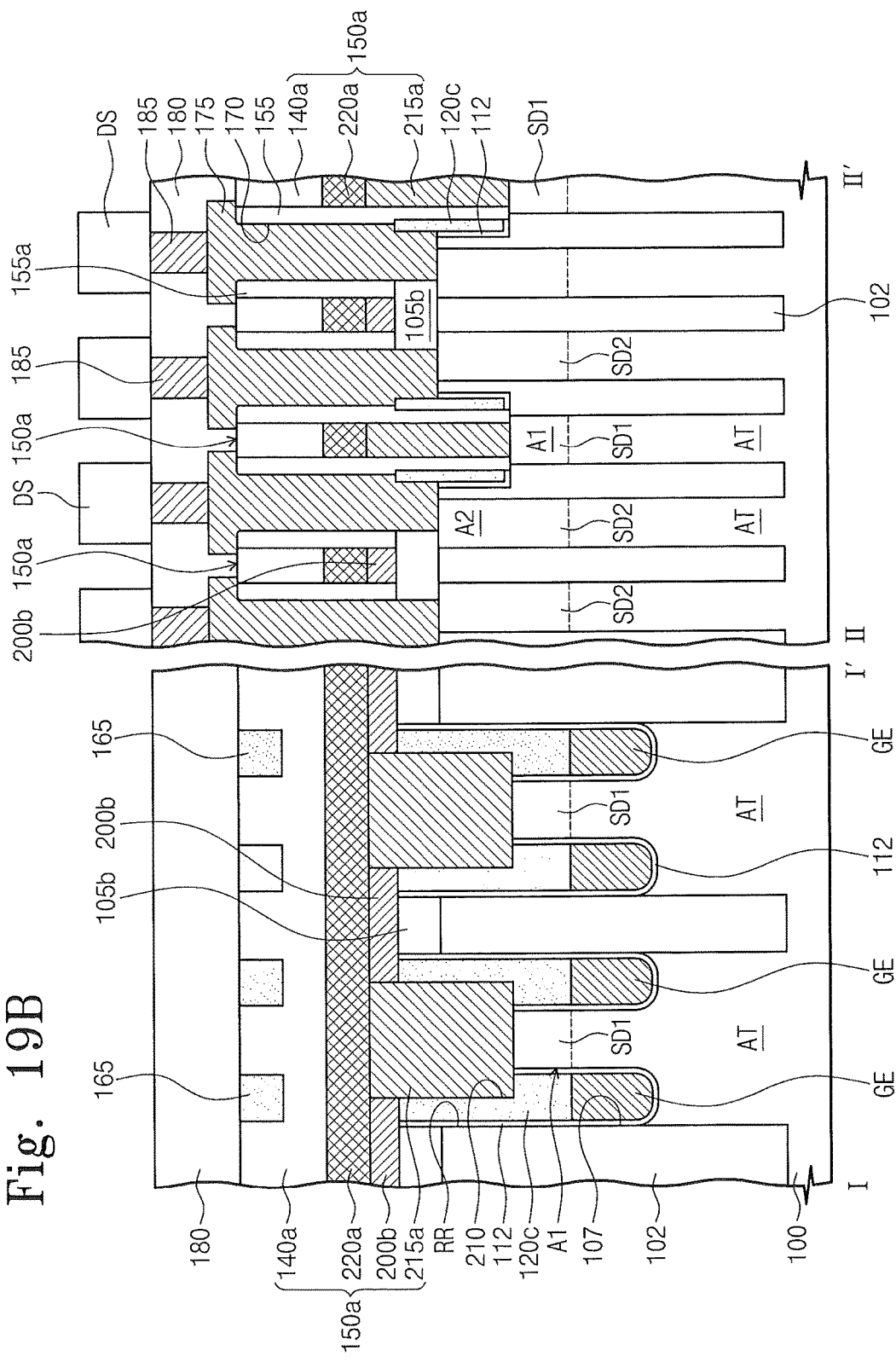
FIG. 19B is a cross-sectional view taken along lines I-I' and II-II' of FIG. 19A.
Figure 19C:
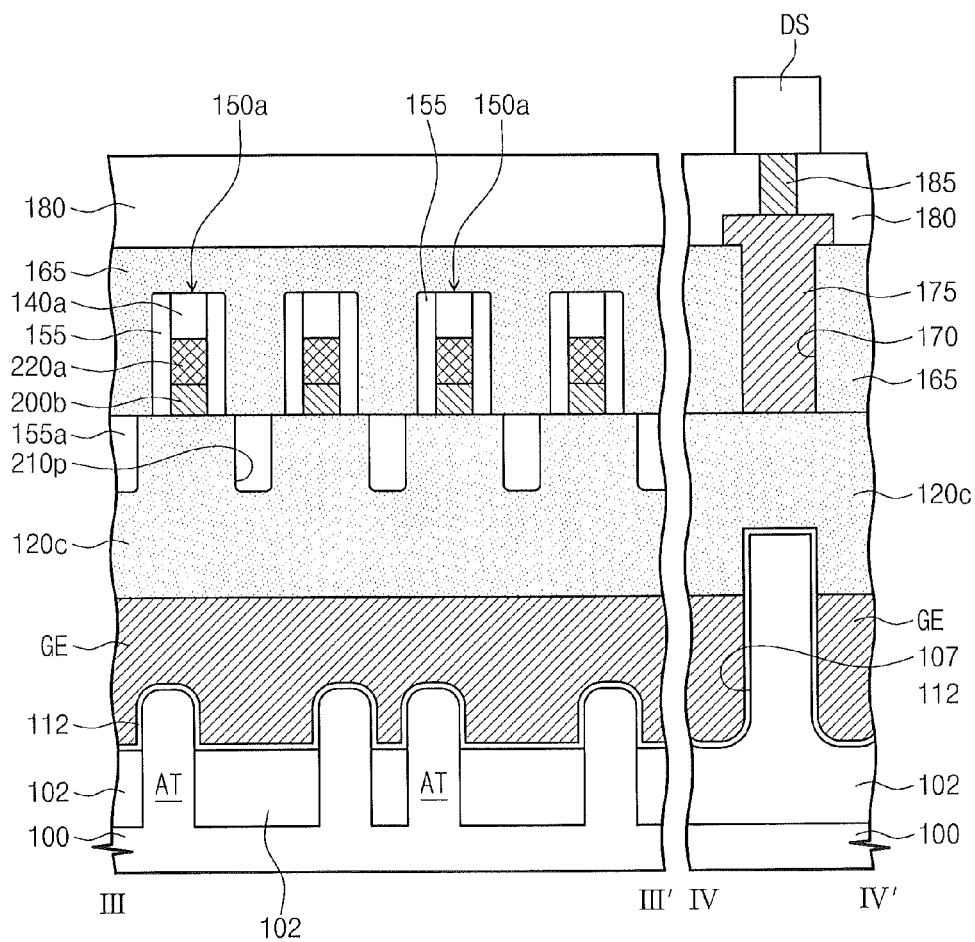
FIG. 19C is a cross-sectional view taken along lines III-III' and IV-IV' of FIG. 19A.
Figure 20A:
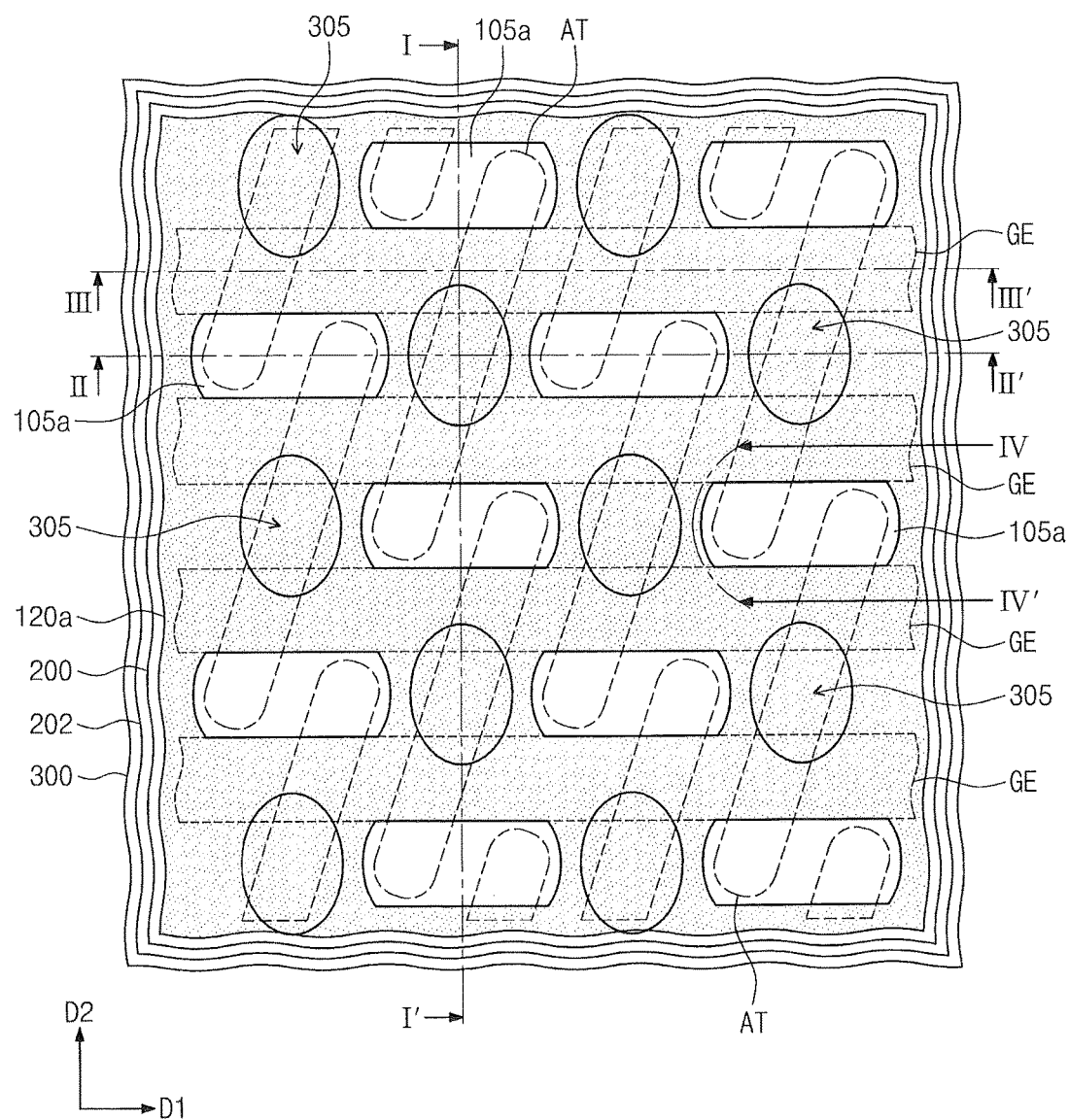
Figure 20B:
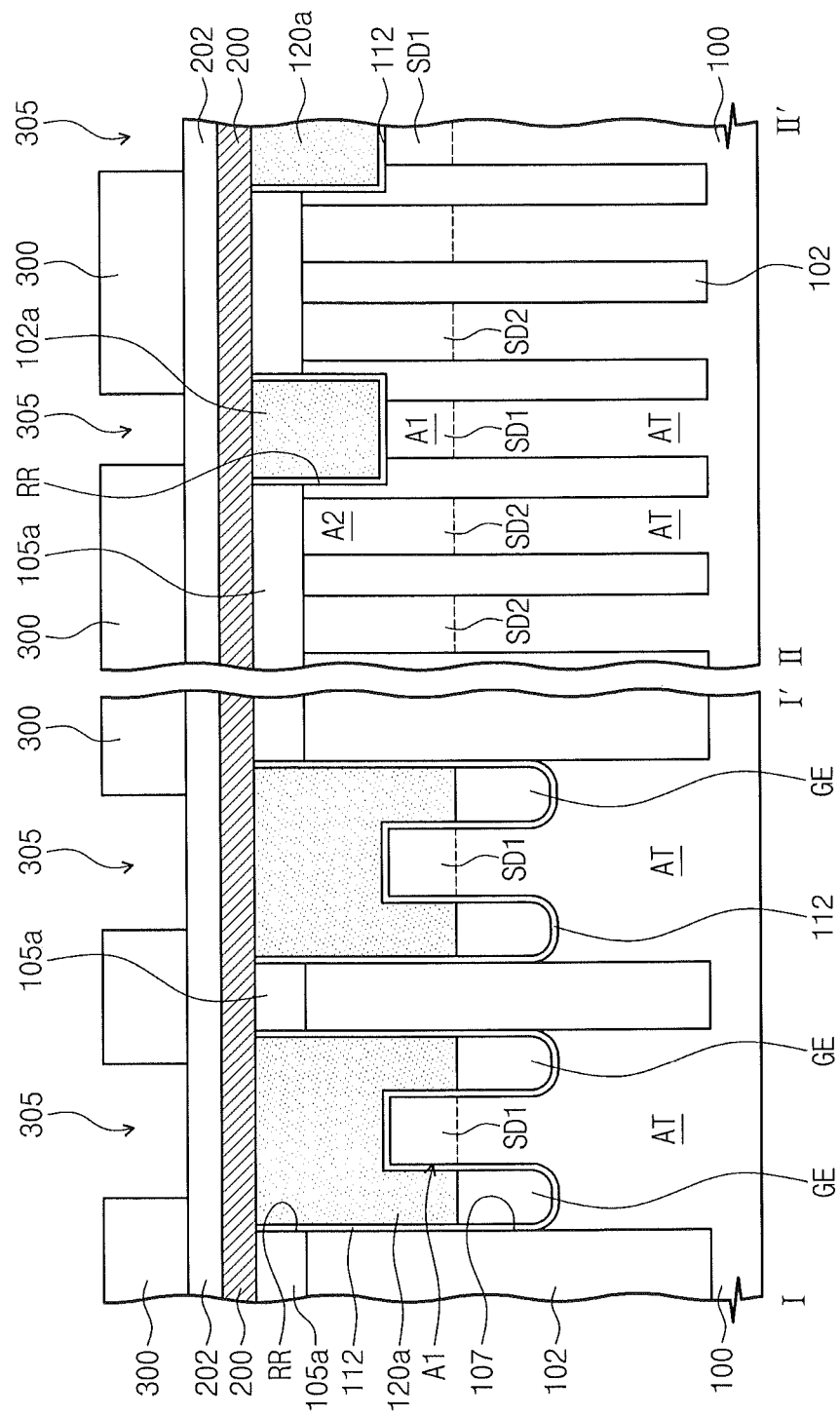
Figure 20C:
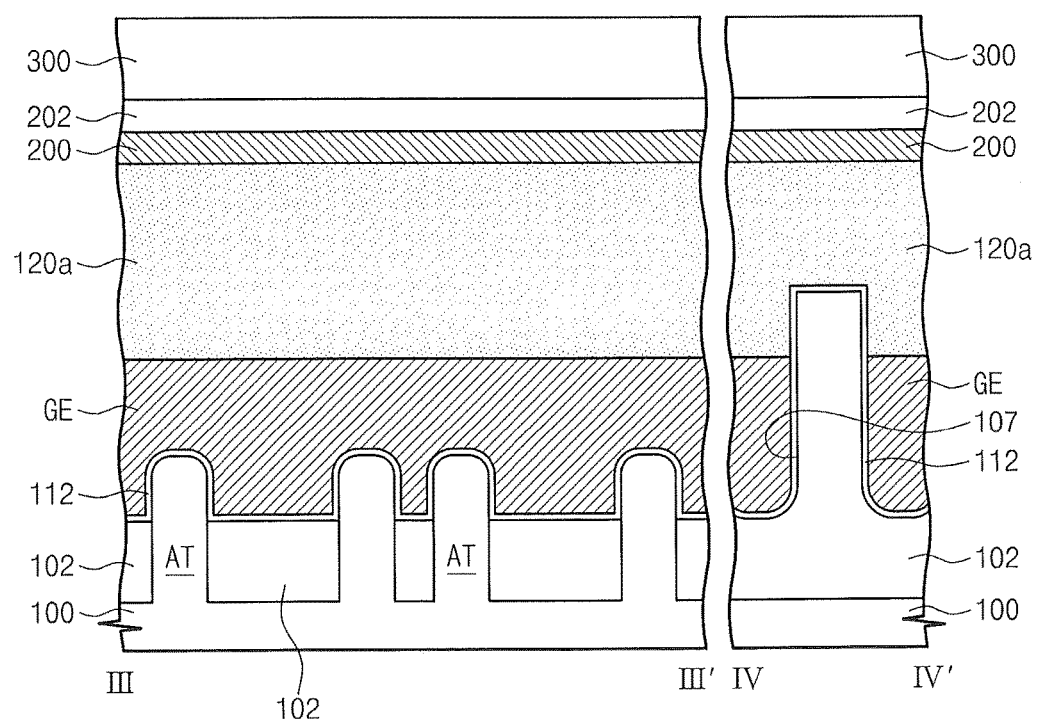

Subsequent processes will be described with reference to FIGS. 19A, 19B, and 19C. Referring to FIGS. 19A, 19B, and 19C, the wire capping insulating layer 140, the upper conductive layer 220, the lower conductive patterns 200a, and the planarized contact conductive layer 215 may be patterned using the wire mask patterns 145 to form wire patterns 150a.

Each of the wire patterns 150a may include contact patterns 215a, lower conductive segments 200b, a conductive wire 220a, and a wire capping pattern 140a. The contact patterns 215a and the lower conductive segments 200b of the wire pattern 150a may be alternately arranged in the second direction D2 and may be in contact with each other. The conductive wire 220a may extend in the second direction D2 and may be disposed on the contact patterns 215a and the lower conductive segments 200b. The wire capping pattern 140a may be disposed on the conductive wire 220a. The lower conductive segment 200b may have both sidewalls respectively aligned with both sidewalls of the conductive wire 220a. Likewise, the contact pattern 215a may have both sidewalls respectively aligned with the both sidewalls of the conductive wire 220a.

The contact patterns 215a may be disposed in the openings 210, respectively. The contact patterns 215a may be connected to the first source/drain regions SD1, respectively. The planarized contact conductive layer 215 filling the concave regions 210p is removed by the etching process using the wire mask patterns 145. Thus, the contact patterns 215a are completely separated from each other. A width of the contact pattern 215a in the first direction D1 may be less than the width of the opening 210 in the first direction D1.

An example of the patterning process using the wire mask patterns 145 will be described hereinafter. The wire capping insulating layer 140 may be etched using the wire mask patterns 145 as etch masks, thereby forming the wire capping patterns 140a. The upper conductive layer 220, the lower conductive patterns 200a, and the planarized contact conductive layer 215 may be etched using the wire capping patterns 140a as etch masks, thereby forming the wire patterns 150a. The wire mask patterns 145 may be removed after the formation of the wire capping patterns 140a or after the formation of the wire patterns 150a.

Subsequently, an insulating spacer layer may be conformally formed on the substrate 100. At this time, the insulating spacer layer may fill the concave regions 210p. The insulating spacer layer may be anisotropically etched to form insulating spacers 155 on both sidewalls of each of the wire patterns 150a, respectively. At this time, a residue 155a of the insulating spacer layer may remain in the concave region 210p. The insulating spacer layer may be formed of a nitride (e.g., silicon nitride) and/or an oxynitride (e.g., silicon oxynitride). Even though both the insulating spacer layer and the gate capping pattern 120c are formed of silicon nitride, an interface may exist and be clearly shown between the residue 155a of the insulating spacer layer and the gate capping pattern 120c. The inner surface of the concave region 210p contacting the residue 155a may correspond to the interface the residue 155a and the gate capping pattern 120c. That is, the interface may exist between the inner surface of the concave region 210p and the residue 155a. The insulating spacer 155 may fill a space between the sidewall of the contact pattern 215a and the sidewall of the opening 210.

Next, the processes described with reference to FIGS. 11A to 11C and 12A to 12C may be performed. Thus, the buried contact holes 170 may be formed using the insulating fences 165 and the filling pillars 160. When the buried contact holes 170 are formed, the hard mask segments 105 may be etched to form insulating patterns 105b under the lower conductive segments 200b. The buried contact plugs 175 may be formed to fill the buried contact holes 170, respectively. The interlayer insulating layer 180, the conductive plugs 185, and the data storage parts DS may be formed. The data storage parts DS may be electrically connected to the second source/drain regions SD2 formed in the edge portions A2 of the active portions AT through the conductive plugs 185 and the buried contact plugs 175, respectively. Thus, the semiconductor device illustrated in FIGS. 19A to 19C may be realized.

Next, the semiconductor device according to the present embodiment will be described with reference to FIGS. 19A to 19C. For the purpose of ease and convenience in explanation, the aforementioned descriptions will be omitted or mentioned briefly. That is, features of the semiconductor device will be mainly described.

FIG. 19A is a plan view illustrating a semiconductor device according to other embodiments of the inventive concept. FIG. 19B is a cross-sectional view taken along lines I-I' and II-II' of FIG. 19A. FIG. 19C is a cross-sectional view taken along lines III-III' and IV-IV' of FIG. 19A.

Referring again to FIGS. 19A, 19B, and 19C, the gate grooves 107 cross the active portions AT and the device isolation pattern 102 of the substrate 100, as mentioned in the aforementioned embodiment (e.g., the first embodiment). The gate electrodes GE are disposed in the gate grooves 107, respectively. The top surfaces of the gate electrodes GE are lower than the top surfaces of the recessed center portions A1 of the active portions AT. The recessed center portions A1 of the active portions AT are lower than the top surfaces of the edge portions A2 of the active portions AT.

The gate capping patterns 120c may fill the gate grooves 107 on the gate electrodes GE, respectively. The gate capping patterns 120c may extend outside the gate grooves 107 so as to be connected to each other without an interface therebetween. Thus, the connected extending portions of the gate capping patterns 120c may constitute one united body extension. As illustrated in FIG. 19C, the connected portion of the extending portions of the gate capping patterns 120c may be disposed on the device isolation pattern 102 between the gate grooves 107. The top surface of the device isolation pattern 102 under the connected portion of the gate capping patterns 120c is lower than the top surface of the edge portion A2 of the active portion AT.

The one united body extension of the gate capping patterns 120c may define the openings 210 exposing the first source/drain regions formed in the recessed center portions A1 of the active portions AT, respectively. A top end of the one united body extension of the gate capping patterns 120c is higher than the top surfaces of the edge portions A2 of the active portions AT. The gate capping patterns 120 and the one united body extension thereof are illustrated in more detail in FIGS. 16A, 16B, and 16C.

The concave regions 210p may be formed in the gate capping patterns 120c on the gate electrodes GE. The concave regions 210p may be laterally connected to the openings 210. The openings 210 may be connected to each other through the concave regions 210p. In some embodiments, the bottom surface of the concave region 210p may be higher than the bottom surface of the opening 210.

The wire patterns 150a may be disposed on the substrate 100. The wire patterns 150a may extend in the second direction D2. Each of the wire patterns 150a may be electrically connected to the first source/drain regions SD1 arranged in a line in the second direction D2. The insulating spacers 155 may be disposed on both sidewalls of each of the wire patterns 150a, respectively.

The contact patterns 215a of each wire pattern 150a may be disposed in the openings 210 arranged in a line in the second direction D2, respectively. A width of the contact pattern 215a in the first direction D1 may be less than a width of the opening 210 in the first direction D1. Insulators 155a may fill the concave regions 210p, respectively. The insulators 155a may electrically separate the contact patterns 215a from each other. The insulators 155a are formed of the same material as the insulating spacers 155.

The insulating pattern 105b may be disposed between each of the lower conductive segments 200b of the wire pattern 150a and the device isolation pattern 102. The top end of the one united body extension of the gate capping patterns 120c may be disposed at substantially the same level as the top surface of the insulating pattern 105b. The top surface of the contact pattern 215a is higher than the top surface of the insulating pattern 105b.

Other elements of the semiconductor device according to the present embodiment may be the same as or similar to corresponding elements of the aforementioned embodiment (i.e., the first embodiment). The data storage part DS of FIGS. 19A to 19C may be realized as the data storage part DSa of FIG. 13A or the data storage part DSb of FIG. 13B.

Third Embodiment

In the present embodiment, the same elements as described in the aforementioned embodiments (e.g., the second embodiment) will be indicated by the same reference numerals or the same reference designators. For the purpose of ease and convenience in explanation, the descriptions to the same elements as in the aforementioned embodiments (e.g., the second embodiment) will be omitted or mentioned briefly. That is, differences between the present embodiment and the aforementioned embodiments (e.g., the second embodiment) will be mainly described hereinafter.

FIGS. 20A to 23A are plan views illustrating a method of manufacturing a semiconductor device according to still other embodiments of the inventive concept. FIGS. 20B to 23B are cross-sectional views taken along lines I-I' and II-II' of FIGS. 20A to 23A, respectively. FIGS. 20C to 23C are cross-sectional views taken along lines III-III' and IV-IV' of FIGS. 20A to 23A, respectively. A method of manufacturing a semiconductor device according to the present embodiment may include the processes described with reference to FIGS. 14A, 14B, and 14C in the second embodiment.

Referring to FIGS. 14A, 14B, 14C, 20A, 20B, and 20C, a mask layer 300 may be formed on the buffer hard mask layer 202. The mask layer 300 may be patterned to form mask-holes 305 exposing portions of the buffer hard mask layer 202, respectively. The mask-holes 305 may overlap with the first source/drain regions SD1, respectively. The mask-holes 305 are completely spaced apart from each other. In other words, each of the mask-holes 305 may have a closed loop-shape in a plan view. The mask layer 300 may be formed of the same material as the mask patterns 205 of FIGS. 15A to 15C.

Figure 21A:
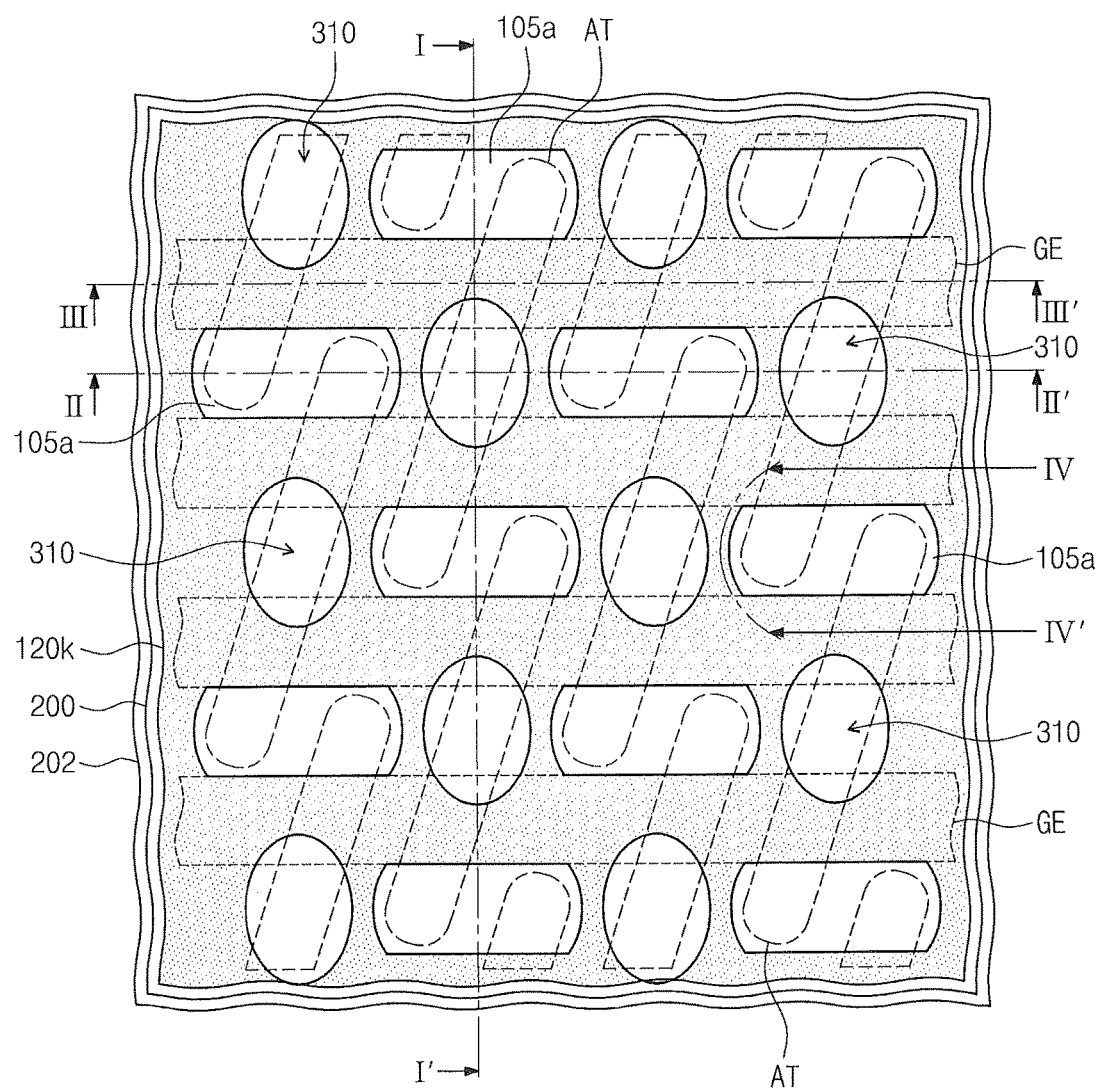
Figure 21B:
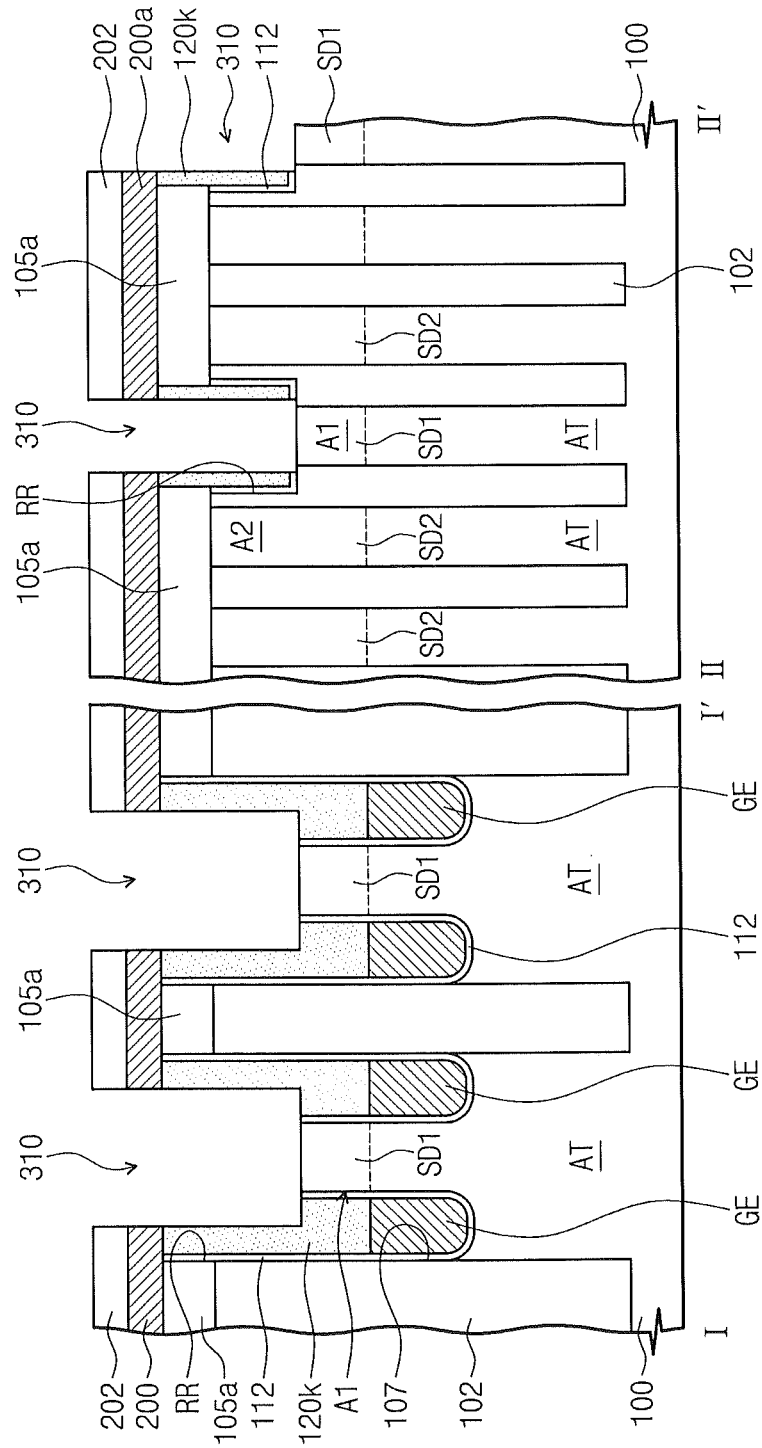
Figure 21C:
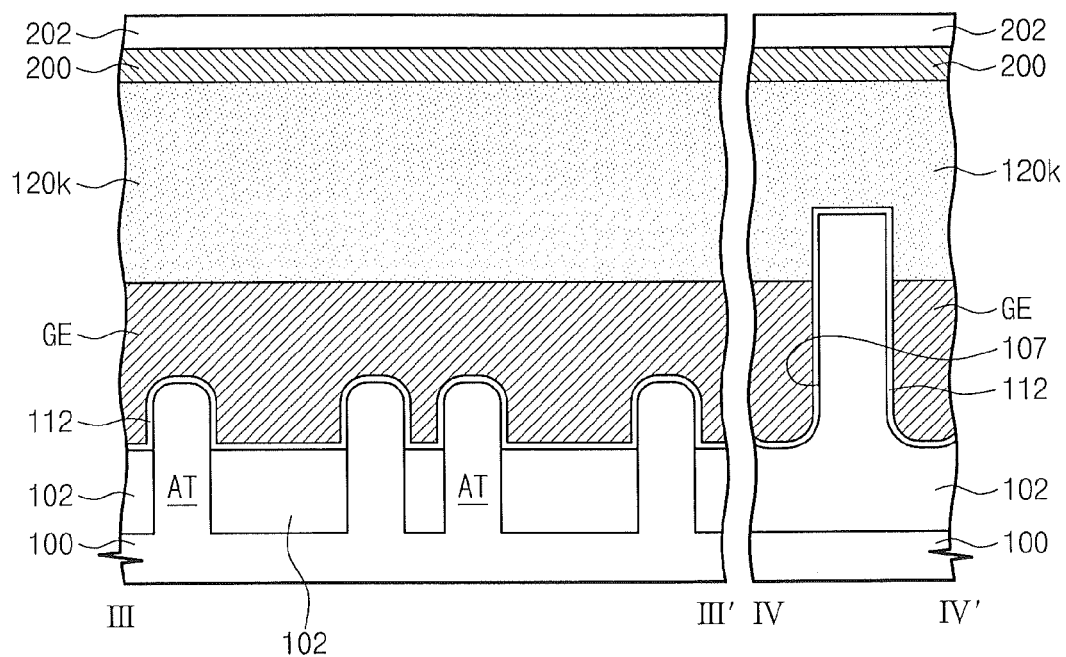

Referring to FIGS. 21A, 21B, and 21C, the buffer hard mask layer 202, the lower conductive layer 200, and the planarized gate capping insulating layer 120a may be successively etched using the mask layer 300 having the mask-holes 305 as an etch mask, thereby forming openings 310 exposing the first source/drain regions SD1 (i.e., the recessed center portions A1 of the active portions AT), respectively. At this time, gate capping patterns 120k may be formed. The gate capping patterns 120k may fill the gate grooves 107 on the gate electrodes GE, respectively. Additionally, the gate capping patterns 120k may extend outside the gate grooves 107 to be connected to each other without interface therebetween. The extending portions of the gate capping patterns 120k may constitute one united body extension. The one united body extension of the gate capping patterns 120k may define the openings 310.

In the present embodiment, the concave region 210p of the second embodiment is not formed due to the shape of the mask layer 300 having the mask-holes 305. In other words, the openings 310 may be completely separated from each other. The mask layer 300 may be removed after the formation of the openings 310.

Figure 22A:
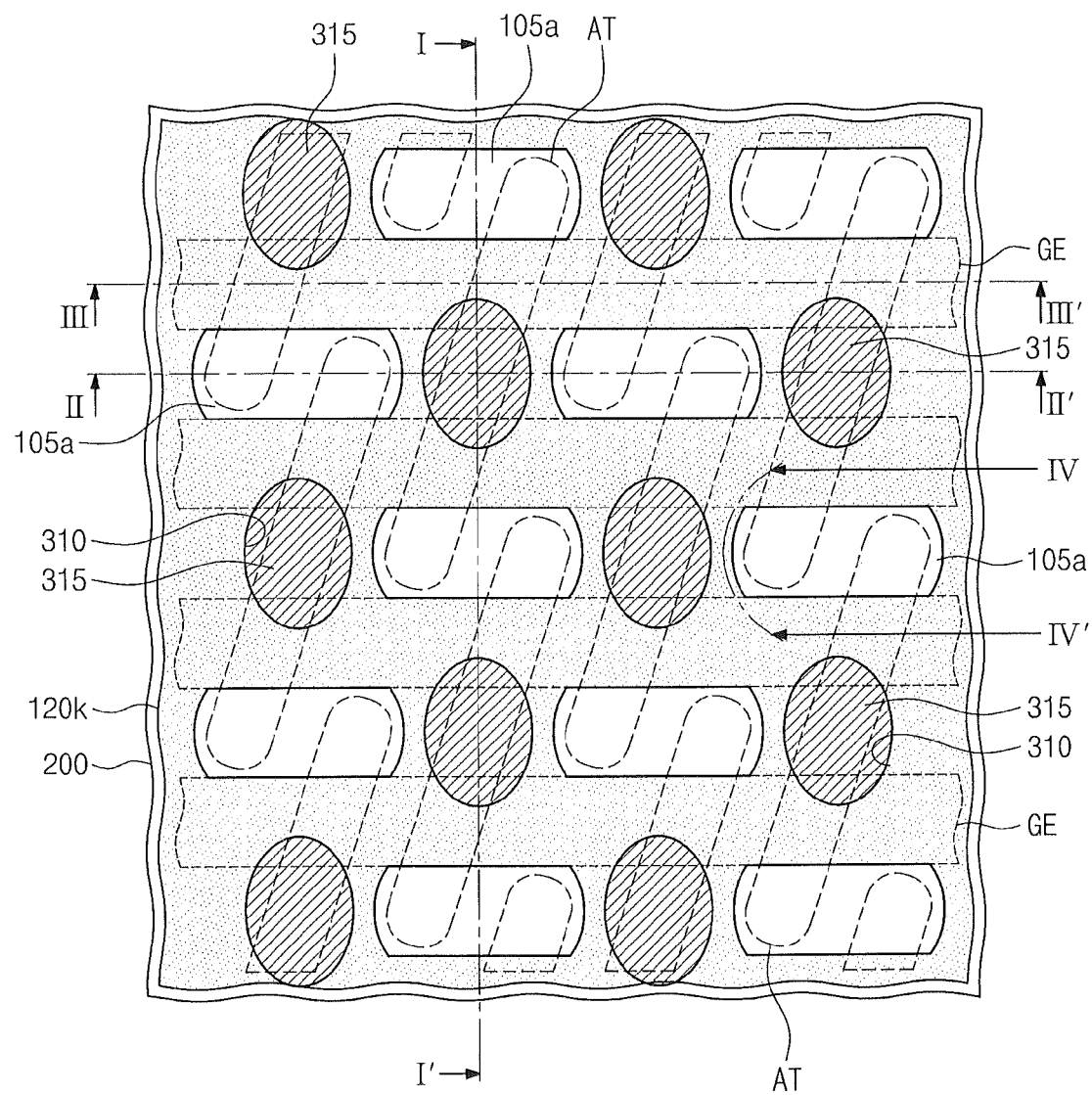
Figure 22B:
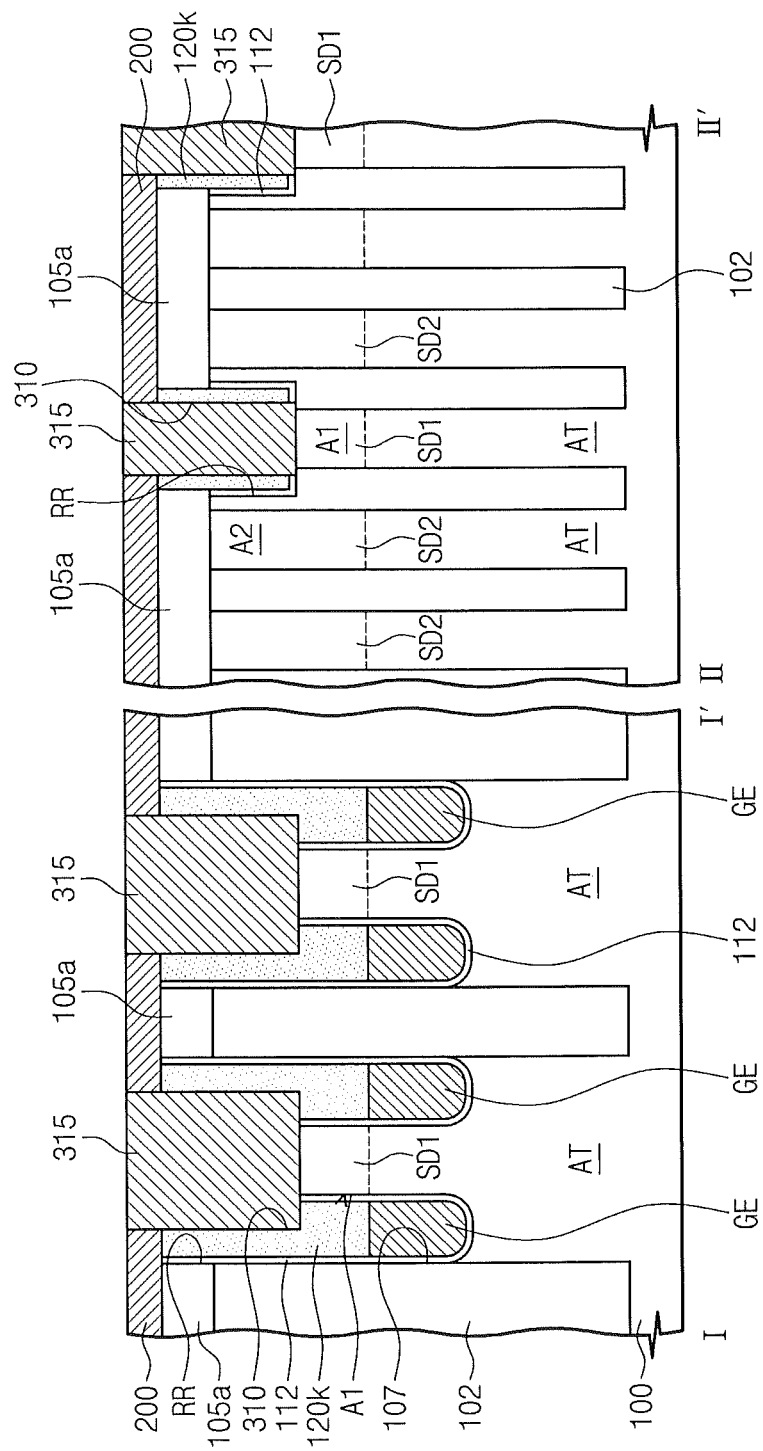
Figure 22C:
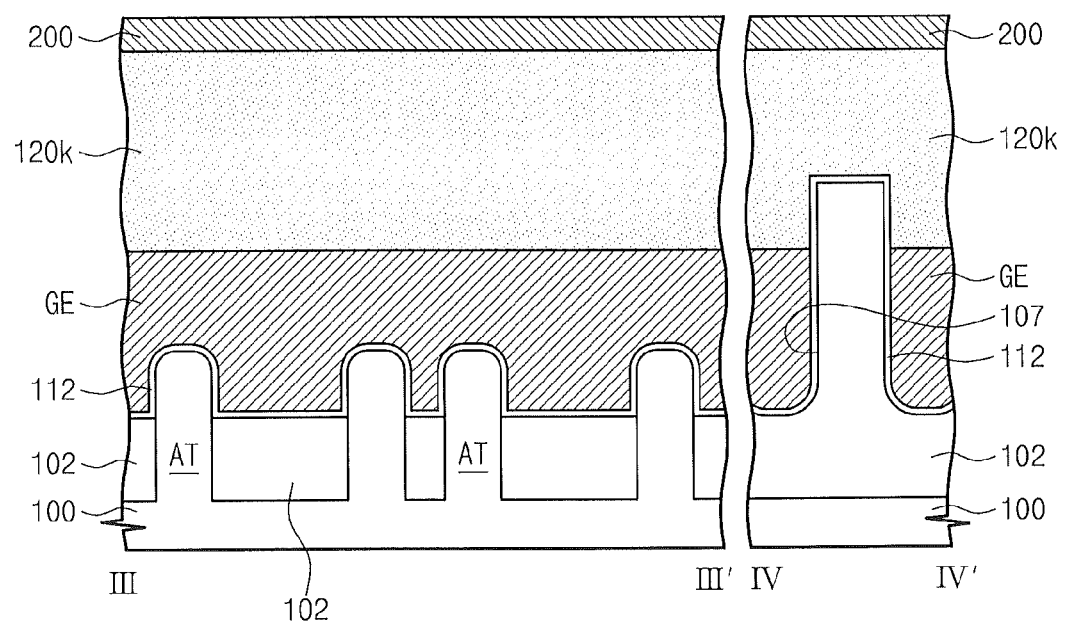

Referring to FIGS. 22A, 22B, and 22C, a contact conductive layer may be formed to fill the openings 310 and then the contact conductive layer may be etched to form contact plugs 315 filling the openings 310, respectively. The contact plugs 315 may be connected to the first source/drain regions SD1, respectively. Upper portions of sidewalls of the contact plugs 315 may be in contact with the lower conductive layer 200. The contact plugs 315 may be formed of the same material as the planarized contact conductive layer 215 of the second embodiment. Next, the buffer hard mask layer 202 may be removed. Top surfaces of the contact plugs 315 may be substantially coplanar with the top surface of the lower conductive layer 200 before or after the removal of the buffer hard mask layer 202.

Figure 23A:
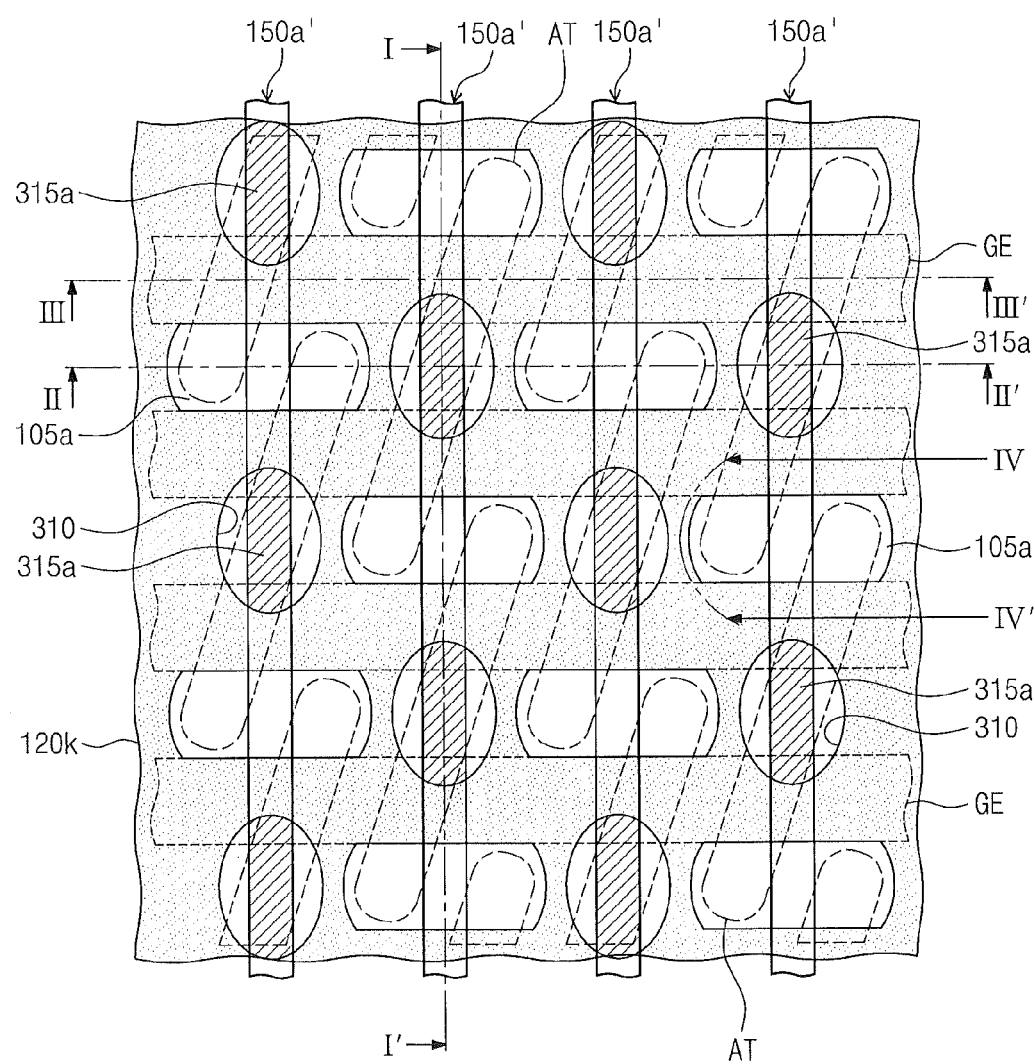
Figure 23B:
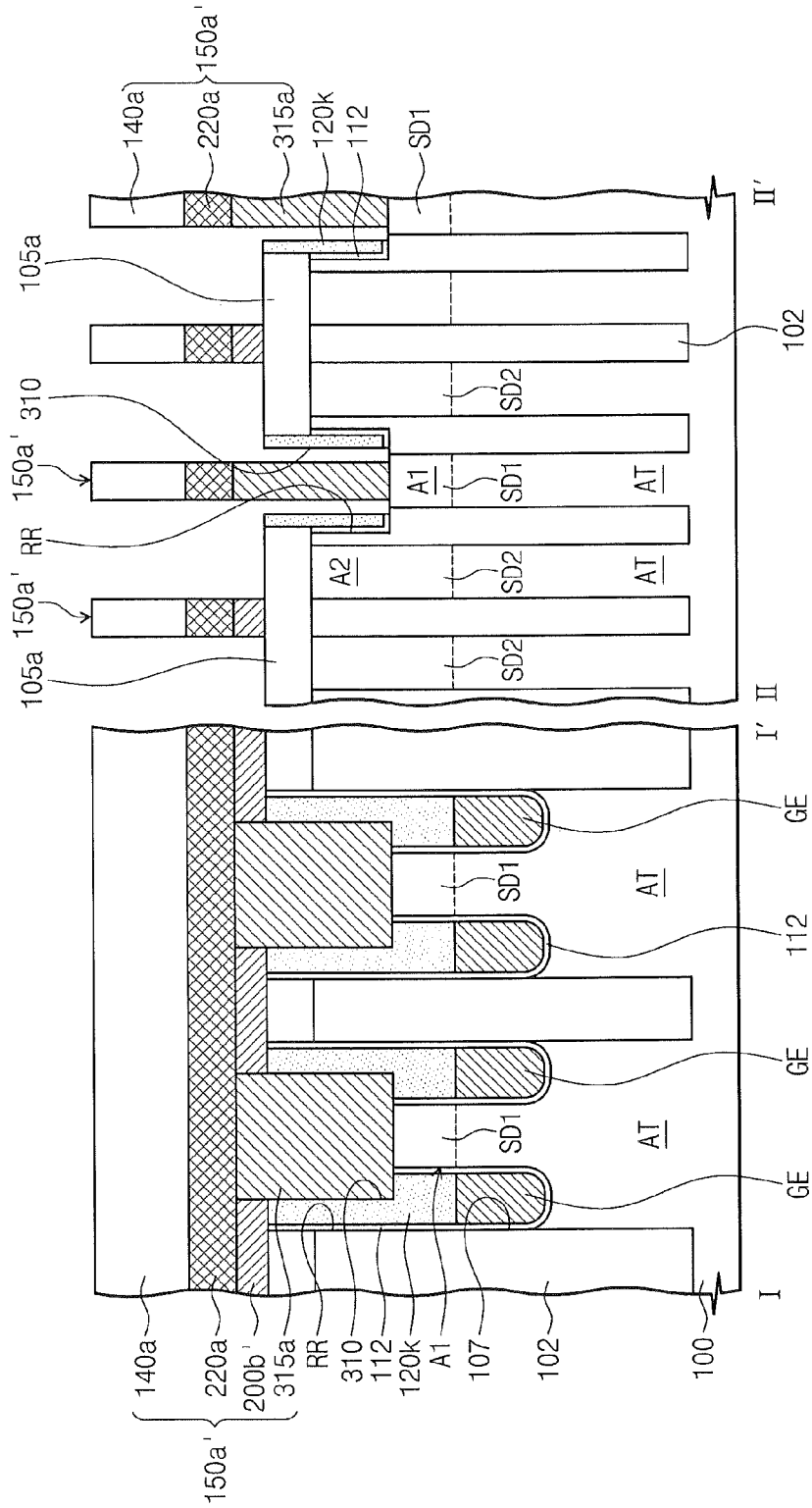
Figure 23C:
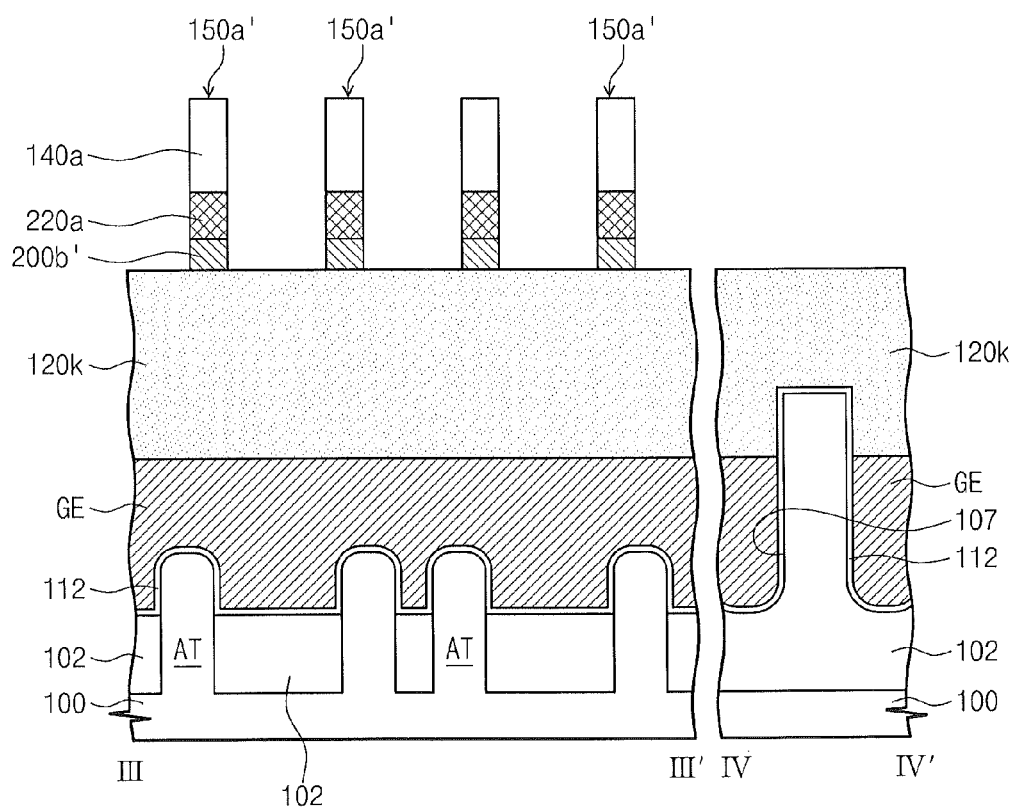

Referring to FIGS. 23A, 23B, and 23C, subsequently, the upper conductive layer 220, the wire capping insulating layer 140 and the wire mask patterns 145 of FIGS. 18A to 18C may be formed. The wire capping insulating layer 140, the upper conductive layer 220, the lower conductive layer 200 and the contact plugs 315 may be patterned using the wire mask patterns 145 to form wire patterns 150a'.

Each of the wire patterns 150a' may include lower conductive segments 200b', contact patterns 315a, a conductive wire 220a, and a wire capping pattern 140a. The lower conductive segments 200b' and the contact patterns 315a of each wire pattern 150a' may be alternately arranged in the second direction D2. The lower conductive segments 200b' may be in contact with the contact patterns 315a. The conductive wire 220a may be disposed on the lower conductive segments 200b' and the contact patterns 315a and may extend in the second direction D2. The wire capping pattern 140a may be disposed on the conductive wire 220a and may extend in the second direction D2.

The contact pattern 315a may have both sidewalls respectively aligned with both sidewalls of the conductive wire 220a. Additionally, the lower conductive segment 200b' may also have both sidewalls respectively aligned with the both sidewalls of the conductive wire 220a. A width of the contact pattern 315a in the first direction D1 may be less than a width of the opening 310 in the first direction D1. A sidewall of the contact pattern 315a, which is in contact with the lower conductive segment 200b', may be convex toward the lower conductive segment 200b' due to the shape of the mask-hole 305 in a plan view.

Figure 24A:
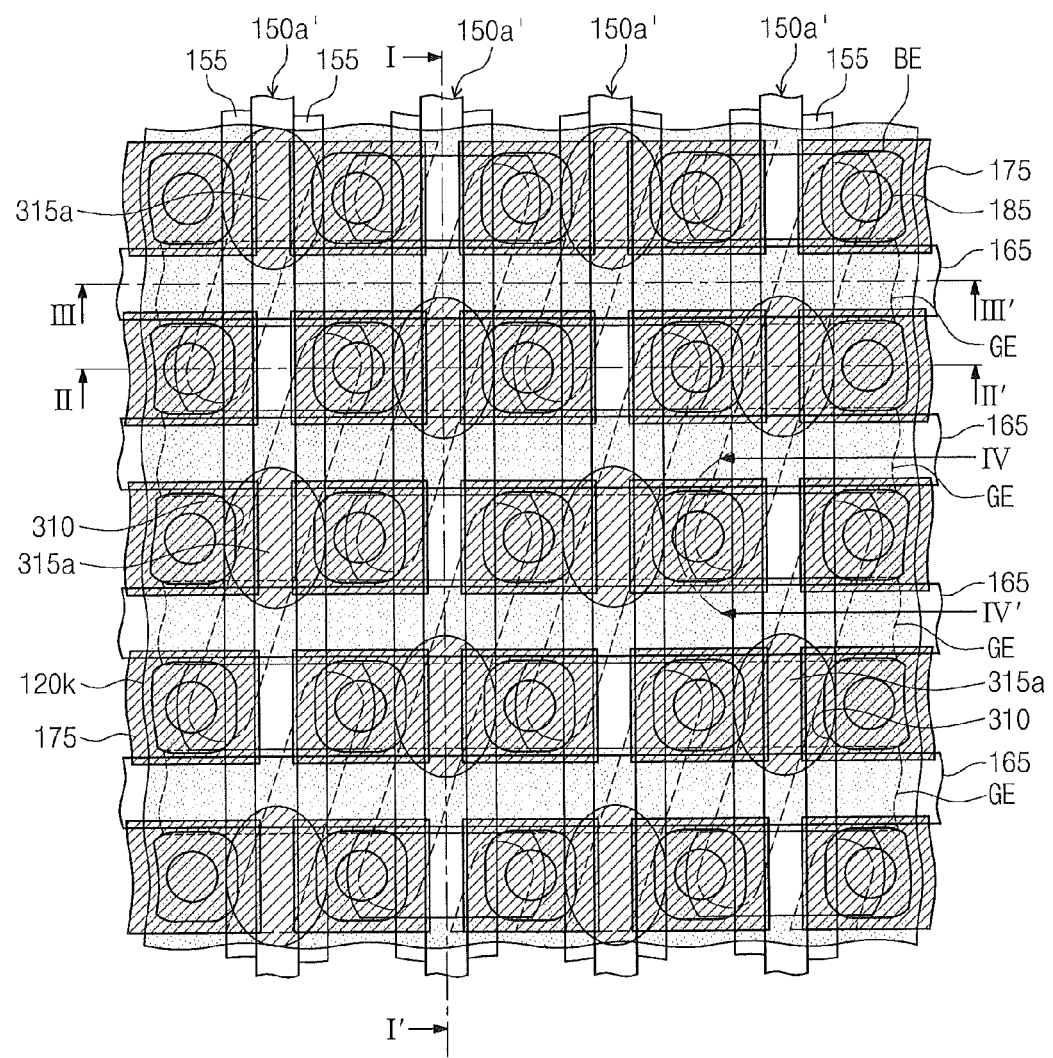
FIG. 24A is a plan view illustrating a semiconductor device according to still other embodiments of the inventive concept.
Figure 24B:
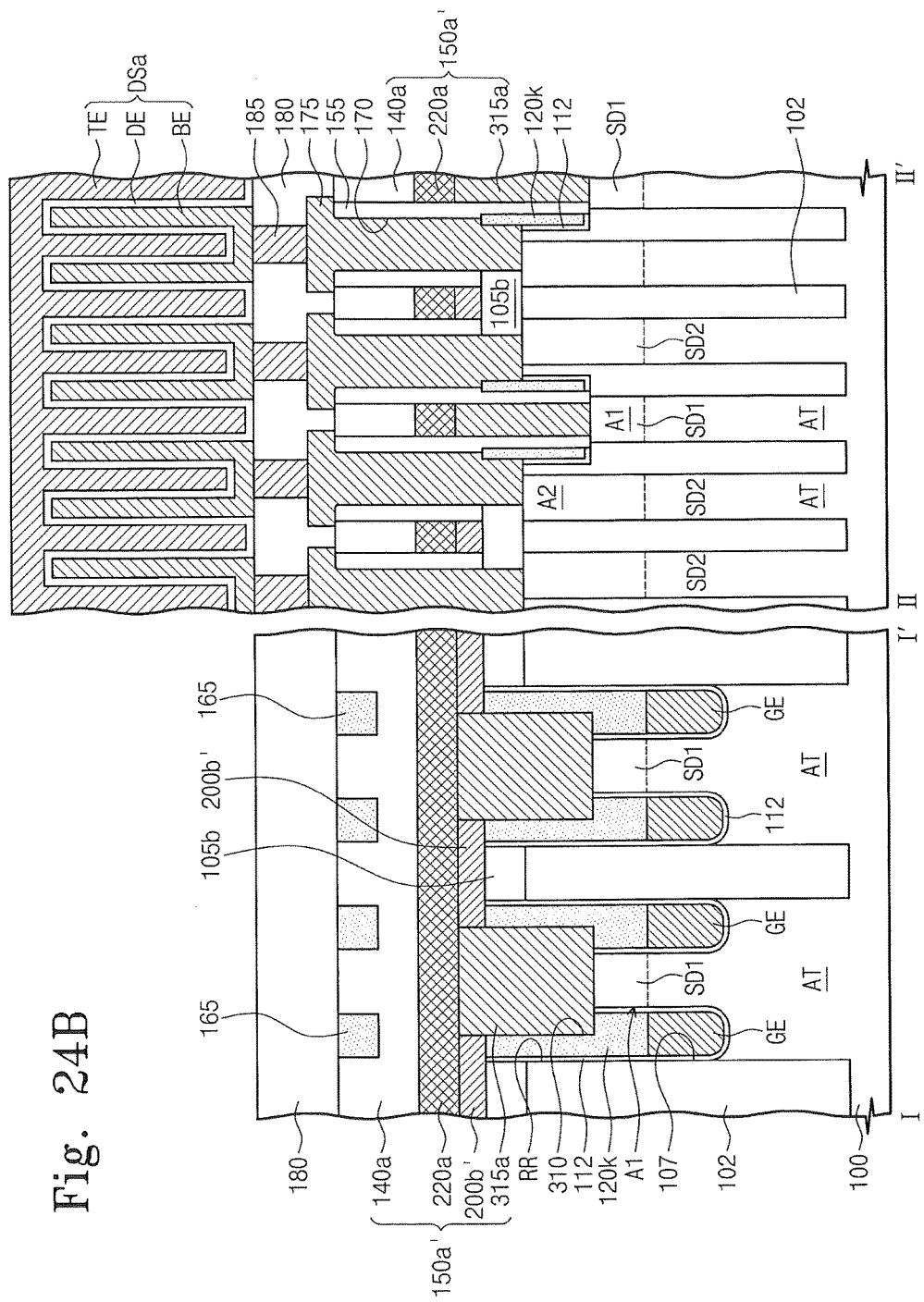
FIG. 24B is a cross-sectional view taken along lines I-I' and II-II' of FIG. 24A.
Figure 24C:
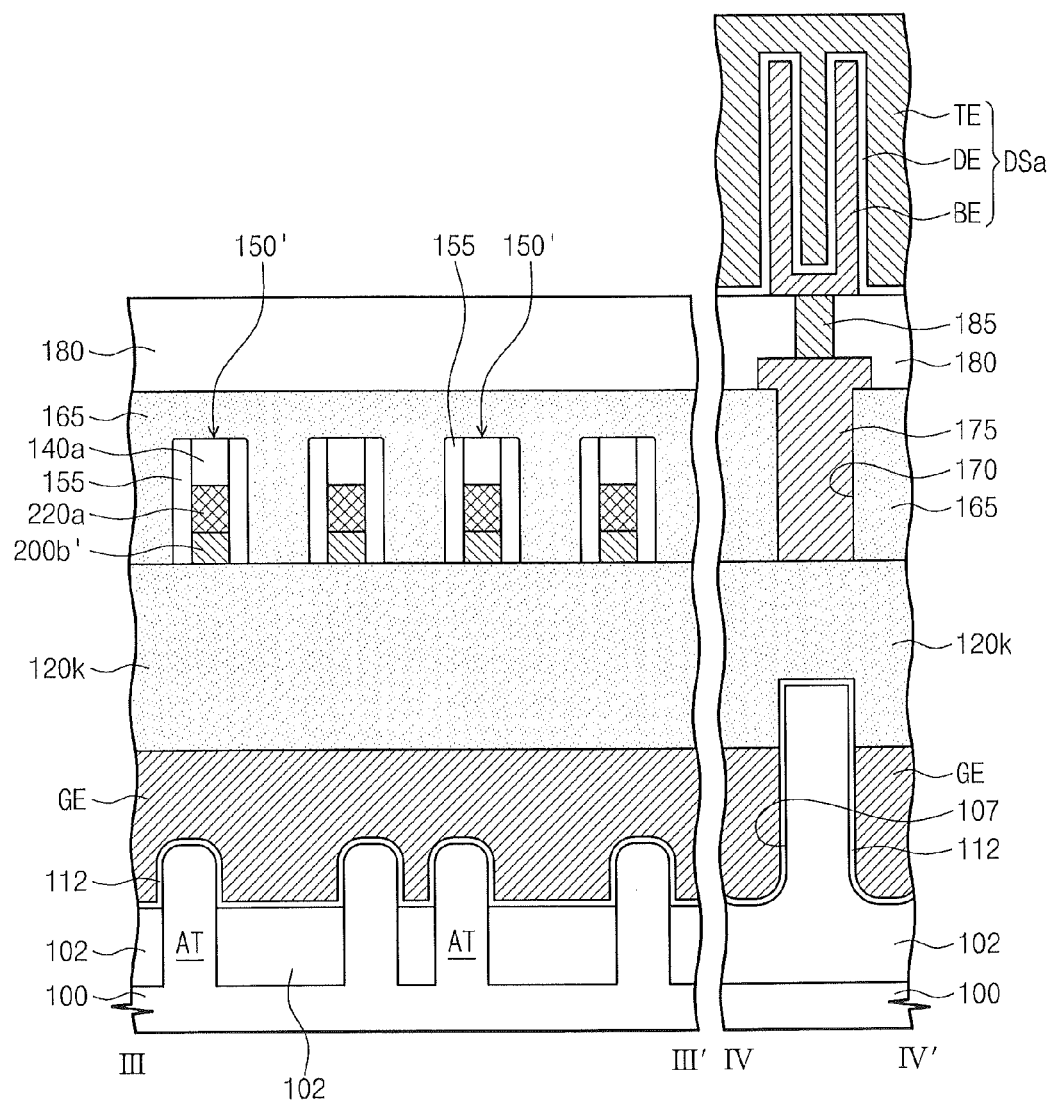
FIG. 24C is a cross-sectional view taken along lines III-III' and IV-IV' of FIG. 24A.

Subsequent processes will be described with reference to FIGS. 24A, 24B, and 24C. Referring to FIGS. 24A to 24C, insulating spacers 155 may be formed on both sidewalls of each wire pattern 150a', respectively. The insulating spacer 155 may fill a space between the opening 310 and the contact pattern 315a.

Next, the processes described with reference to FIGS. 11A to 11C and 12A to 12C may be performed to form the insulating fences 165, the buried contact holes 170, the buried contact plugs 175 respectively connected to the second source/drain regions SD2, the interlayer insulating layer 180, and the conductive plugs 185. Subsequently, the data storage parts DSa of FIG. 13A may be formed on the interlayer insulating layer 180. Thus, the semiconductor device of FIGS. 24A to 24C may be realized. In other embodiments, the data storage parts DSb of FIG. 13B may be substituted for the data storage parts DSa of FIGS. 24A to 24C.

Next, the semiconductor device according to the present embodiment will be described reference to FIGS. 24A to 24C. For the purpose of ease and convenience in explanation, the aforementioned descriptions will be omitted or mentioned briefly.

FIG. 24A is a plan view illustrating a semiconductor device according to still other embodiments of the inventive concept. FIG. 24B is a cross-sectional view taken along lines I-I' and II-II' of FIG. 24A. FIG. 24C is a cross-sectional view taken along lines III-III' and IV-IV' of FIG. 24A.

Referring to FIGS. 24A, 24B, and 24C, the gate capping patterns 120k fill the gate grooves 107 on the gate electrodes GE, respectively. The gate capping patterns 120k may extend outside the gate grooves 107 to be connected to each other without an interface therebetween. The connected extending portions of the gate capping patterns 120k may constitute one united body extension. The one united body extension of the gate capping patterns 120k may define the openings 310 respectively exposing the first source/drain regions SD 1. The concave region 210p of the second embodiment is not formed in the gate capping patterns 120k. The openings 310 are completely separated from each other. A top end of the extending portion of the gate capping pattern 120k is higher than the top surface of the edge portion A2 of the active portion AT.

The wire patterns 150a' may be disposed on the substrate 100. Each of the wire patterns 150a' may include the contact patterns 315a which are disposed in the openings 310 arranged in the second direction D2, respectively. The conductive wire 220a of each of the wire patterns 150a' may be electrically connected to the first source/drain regions SD1 through the first contact patterns 315a.

The top end of the extending portion of the gate capping pattern 120k may be disposed at substantially the same level as the top surface of the insulating pattern 105b disposed between the lower conductive segment 200b' of the wire pattern 150a' and the device isolation pattern 102.

Other elements of the semiconductor device according to the present embodiment may be the same as or similar to corresponding elements of the first and second embodiments described above.

The semiconductor devices in aforementioned embodiments may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above embodiments is mounted may further include at least one device (e.g., a controller and/or a logic device) that controls the semiconductor device according to embodiments of the inventive concept.

Figure 25:
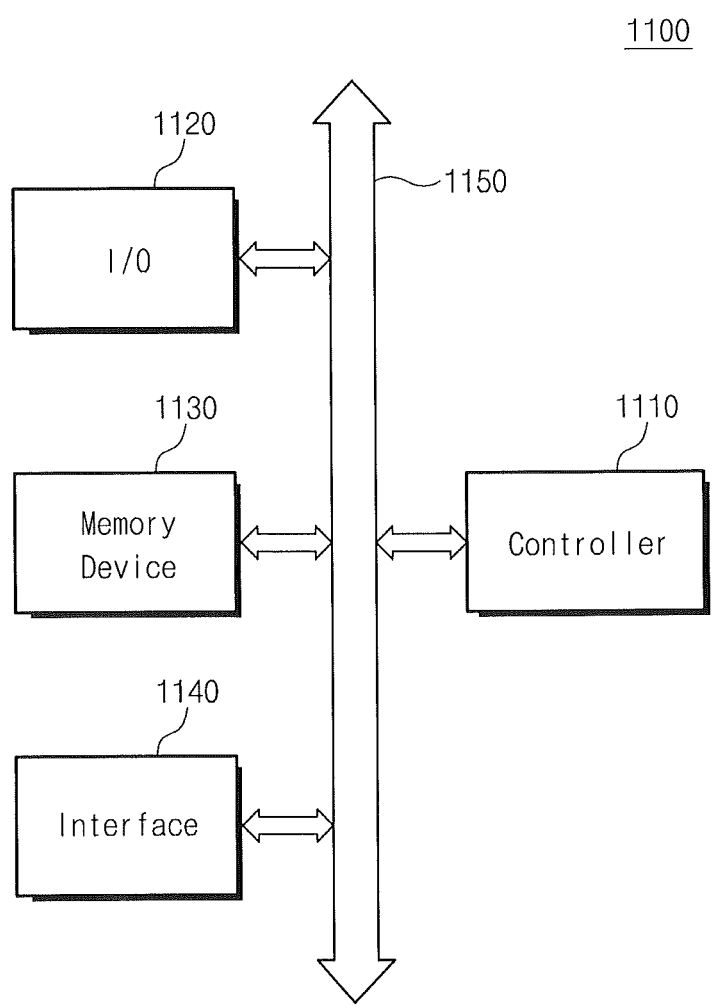
FIG. 25 is a schematic block diagram illustrating an example of electronic systems including semiconductor devices according to embodiments of the inventive concept.

FIG. 25 is a schematic block diagram illustrating an example of electronic systems including semiconductor devices according to embodiments of the inventive concept.

Referring to FIG. 25, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices having a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 26:
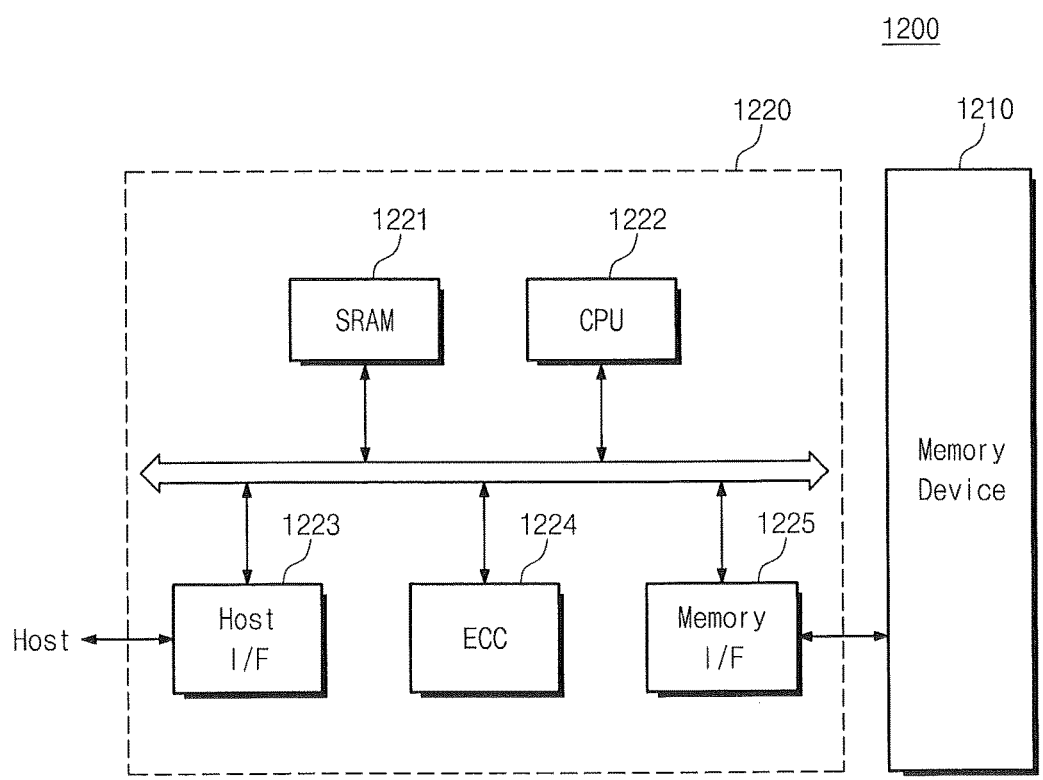
FIG. 26 is a schematic block diagram illustrating an example of memory cards including semiconductor devices according to embodiments of the inventive concept.

FIG. 26 is a schematic block diagram illustrating an example of memory cards including semiconductor devices according to embodiments of the inventive concept.

Referring to FIG. 26, a memory card 1200 according to an embodiment of the inventive concept may include a memory device 1210. The memory device 1210 may include at least one of the semiconductor devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

As described above, after the grooves are formed, the portion of the hard mask line and the portion of the substrate between the grooves are successively etched. Thus, aspect ratios of the grooves may be reduced to improve the process margin of the process of etching the conductive layer filling the grooves. As a result, highly integrated semiconductor devices having excellent reliability may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a device isolation pattern disposed in a substrate to define an active portion;
   a pair of gate electrodes disposed in a pair of gate grooves crossing the active portion, respectively, wherein a top surface of a center portion of the active portion between the pair of gate grooves is lower than top surfaces of opposing edge portions of the active portion and wherein top surfaces of the gate electrodes are lower than the top surface of the center portion of the active portion;
   a gate insulating layer disposed between each of the gate electrodes and an inner surface of each of the gate grooves;
   gate capping patterns filling the gate grooves on the gate electrodes, respectively;
   a contact pattern connected to the center portion of the active portion;
   a wire pattern including a conductive wire extending in a first direction on the contact pattern; and
   an insulating pattern disposed between the conductive wire and the device isolation pattern,
   wherein a top surface of the insulating pattern directly contacts the conductive wire,
   wherein the gate capping patterns comprise portions that extend outside the gate grooves to be connected to each other without an interface therebetween, and the portions of the gate capping patterns comprises a connected extending portion, and
   wherein a sidewall of the contact pattern is in contact with the gate capping patterns.

2. The semiconductor device of claim 1, wherein the connected extending portion of the gate capping patterns comprises one united body extension, and
   wherein the one united body extension defines an opening exposing the center portion of the active portion, and the contact pattern is in the opening.

3. The semiconductor device of claim 2, wherein the opening has a closed loop-shape in a plan view.

4. The semiconductor device of claim 2, wherein concave regions are formed in the connected extending portion of the gate capping patterns on each of the gate electrodes, and wherein the concave regions are laterally connected to the opening.

5. The semiconductor device of claim 4, wherein a bottom surface of each of the concave regions is higher than a bottom surface of the opening.

6. The semiconductor device of claim 4, further comprising:
   insulating spacers disposed on both sidewalls of the wire pattern, respectively; and
   an insulator disposed in each of the concave regions,
   wherein the insulator is formed of the same material as the insulating spacers, and
   wherein an interface exists between the insulator and an inner surface of the concave region.

7. The semiconductor device of claim 2, wherein a width of the contact pattern is less than a width of the opening in a second direction perpendicular to the first direction.

8. The semiconductor device of claim 1, wherein the contact pattern has both sidewalls aligned with both sidewalls of the conductive wire, respectively.

9. The semiconductor device of claim 1, wherein a top surface of the device isolation pattern under the connected extending portion of the gate capping patterns is lower than the top surfaces of the edge portions of the active portion.

10. The semiconductor device of claim 1, wherein a width of the connected extending portion of the gate capping patterns is less than a width of the gate capping pattern in the gate groove.

11. The semiconductor device of claim 1, further comprising:
    a first source/drain region in the center portion of the active portion;
    a second source/drain region in one of the edge portions of the active portion; and
    a data storage part electrically connected the second source/drain region.

12. The semiconductor device of claim 1, wherein the gate capping patterns connect to each other to overlap a protruding portion of the device isolation pattern.

13. A semiconductor device comprising:
    first and second gate electrodes in respective recessed portions of a substrate, the first and second gate electrodes extending in a first direction;
    an isolation pattern disposed in the substrate to define an active portion, wherein a portion of the isolation pattern is between the first and second gate electrodes;
    first and second gate capping patterns on the first and second gate electrodes, respectively, the first and second gate capping patterns extending continuously from a first sidewall of the isolation pattern to a second sidewall of the isolation pattern to connect to each other to overlap the portion of the isolation pattern that is between the first and second gate electrodes;
    a contact pattern connected to a center portion of the active portion between the first and second gate electrodes; and
    a conductive wire extending in a second direction that is perpendicular to the first direction on the contact pattern,
    wherein both sidewalls of the contact pattern are aligned with both sidewalls of the conductive wire.

14. The semiconductor device of claim 13, further comprising:
    a third gate electrode in another recessed portion of the substrate; and
    a third gate capping pattern on the third gate electrode, wherein the substrate comprises a first protruding active portion that protrudes between the second and third gate electrodes such that a third sidewall of the first protruding active portion is adjacent the second gate electrode and the second gate capping pattern and a fourth sidewall of the first protruding active portion is adjacent the third gate electrode and the third gate capping pattern, and wherein the substrate comprises a second protruding active portion that is spaced apart from the first protruding active portion and protrudes beyond the first protruding active portion.

15. The semiconductor device of claim 13, further comprising a mask pattern on the isolation pattern,
wherein a sidewall of the mask pattern is aligned with a sidewall of the isolation pattern, and
wherein a top surface of the mask pattern is coplanar with top surfaces of the first and second gate capping patterns.

16. The semiconductor device of claim 13, wherein a width of the conductive wire in the first direction is substantially the same as a width of the contact pattern in the first direction.

17. The semiconductor device of claim 1, wherein the insulating pattern contacts a top surface of the device isolation pattern.

18. The semiconductor device of claim 1, wherein the connected extending portion of the gate capping patterns comprises a first portion, which is between the contact pattern and one of the edge portions of the active portion and is disposed below the top surface of the insulating pattern, and a second portion, which is on a portion of the device isolation pattern disposed between the pair of gate electrodes and is disposed below the top surface of the insulating pattern, and
wherein the first portion of the connected extending portion has a first width in the first direction, the second portion of the connected extending portion has a second width in a second direction that is perpendicular to the first direction, and the first width and the second width are equal.

19. The semiconductor device of claim 1, wherein the active portion comprises a first active portion, the pair of gate electrodes comprises a first pair of gate electrodes, the pair of gate grooves comprise a first pair of gate grooves, and the gate capping patterns comprise a first gate capping pattern that fills one of the first pair of gate grooves on one of the first pair of gate electrodes,
wherein the first gate capping pattern comprises a first portion that extends outside the one of the first pair of gate grooves and is disposed below the top surface of the insulating pattern,
wherein the semiconductor device further comprises:
a second active portion on the substrate, wherein the second active portion is spaced apart from the first active portion;
a second pair of gate electrodes, wherein the second pair of gate electrodes are in a second pair of gate grooves crossing the second active portion, a top surface of a center portion of the second active portion between the second pair of gate grooves is lower than top surfaces of opposing edge portions of the second active portion, and top surfaces of the second pair of gate electrodes are lower than the top surface of the center portion of the second active portion; and
a second gate capping pattern filling one of the second pair of gate grooves on one of the second pair of gate electrodes, wherein the second gate capping pattern comprises a second portion that extends outside the one of the second pair of gate grooves and is disposed below the top surface of the insulating pattern, and
wherein the first portion of the first gate capping pattern and the second portion of the second gate capping pattern are connected to each other.

20. A semiconductor device comprising:
a device isolation pattern disposed in a substrate to define an active portion;
a pair of gate electrodes disposed in a pair of gate grooves crossing the active portion, respectively, wherein a top surface of a center portion of the active portion between the pair of gate grooves is lower than top surfaces of opposing edge portions of the active portion and wherein top surfaces of the gate electrodes are lower than the top surface of the center portion of the active portion;
a gate insulating layer disposed between each of the gate electrodes and an inner surface of each of the gate grooves;
gate capping patterns filling the gate grooves on the gate electrodes, respectively;
a contact pattern connected to the center portion of the active portion;
a wire pattern including a conductive wire extending in a first direction on the contact pattern; and
an insulating pattern disposed between the conductive wire and the device isolation pattern,
wherein the gate capping patterns comprise portions that extend outside the gate grooves to be connected to each other without an interface therebetween, and the portions of the gate capping patterns comprises a connected extending portion,
wherein a sidewall of the contact pattern is in contact with the gate capping patterns, and
wherein a top end of the connected extending portion of the gate capping patterns is disposed at substantially the same level as a top surface of the insulating pattern.

* * * * *